US006615147B1

(12) United States Patent
Jonker et al.

(10) Patent No.: US 6,615,147 B1
(45) Date of Patent: Sep. 2, 2003

(54) REVENUE METER WITH POWER QUALITY FEATURES

(75) Inventors: Rene T. Jonker, British Columbia (CA); Piotr B. Przydatek, British Columbia (CA); Colin N. Gunn, British Columbia (CA); Michael E. Teachman, British Columbia (CA); Constantine A. Antoniou, British Columbia (CA)

(73) Assignee: Power Measurement Ltd. (CA)

( * ) Notice: Subject to any disclaimer, the term of this patent is extended or adjusted under 35 U.S.C. 154(b) by 0 days.

(21) Appl. No.: 09/370,317

(22) Filed: Aug. 9, 1999

(51) Int. Cl.$^7$ ................................................ G01R 21/06
(52) U.S. Cl. ........................................ 702/61; 702/182
(58) Field of Search .......................... 702/61, 33, 38, 702/57, 60, 63, 64, 65, 69, 73, 81, 84, 182, 187, 188, 189, 198

(56) References Cited

U.S. PATENT DOCUMENTS

| | | | |
|---|---|---|---|
| 4,077,061 A | | 2/1978 | Johnston et al. |
| 4,156,280 A | | 5/1979 | Griess |
| 4,240,149 A | | 12/1980 | Fletcher et al. |
| 4,345,311 A | | 8/1982 | Fielden |
| 4,365,302 A | | 12/1982 | Elms |
| 4,369,484 A | * | 1/1983 | Fugate .................. 361/624 |
| 4,388,611 A | * | 6/1983 | Haferd .................. 327/78 |
| 4,455,612 A | | 6/1984 | Girgis et al. |
| 4,459,546 A | | 7/1984 | Arrington et al. |
| 4,463,311 A | | 7/1984 | Kobayashi |
| RE31,774 E | | 12/1984 | Fletcher et al. |
| 4,568,934 A | | 2/1986 | Allgood |
| 4,612,617 A | | 9/1986 | Laplace, Jr. et al. |
| 4,642,564 A | | 2/1987 | Hurley |
| 4,663,587 A | | 5/1987 | Mackenzie |
| 4,672,555 A | | 6/1987 | Hart et al. |
| 4,715,000 A | | 12/1987 | Premerlani |
| 4,783,748 A | | 11/1988 | Swarztrauber et al. |
| 4,794,369 A | | 12/1988 | Haferd |
| 4,837,504 A | | 6/1989 | Baer et al. |

(List continued on next page.)

OTHER PUBLICATIONS

"QUAD4® Plus and MAXsys™ Multifunction Electronic Meters and IEDS," On–Line User Guide, *QUAD4 Plus/MAXsys Products User's Guide*, Rev 1.01, pp. 1–1–1–4; 1–13–1–15; 4–100, 4–107–4–108.

"QUAD4® Plus and MAXsys™ Multifunction Electronic Meters and IEDS", On–Line User Guide Product Definitions, *QUAD4 Plus/MAXsys Products User's Guide*, Rev 1.01, pp. DEF–1—DEF–13.

(List continued on next page.)

*Primary Examiner*—Marc S. Hoff
*Assistant Examiner*—Edward Raymond
(74) *Attorney, Agent, or Firm*—Brinks Hofer Gilson & Lione

(57) ABSTRACT

Power quality detection, monitoring, reporting, recording and communication in a revenue accuracy electrical power meter is disclosed. Transient events are detected by monitoring the wave shape of the electrical power and comparing deviations to a known threshold. Sags and Swells are detected by computing root mean square value over a rolling window and comparing the computed value with a known threshold. Harmonic frequencies and symmetrical components are quantified by a known algorithm and compared with a known threshold. Incoming waveforms are stored to memory. All recorded and computed data is moved to non-volatile storage via direct memory access transfer in the event that a power quality event jeopardizes the operating power of the meter. Further, the meter provides a power supply utilizing high and low capacitive storage banks to supply sufficient energy to survive short duration power quality events which jeopardize the meter's operating power.

62 Claims, 52 Drawing Sheets

Microfiche Appendix Included
(7 Microfiche, 209 Pages)

U.S. PATENT DOCUMENTS

| | | | |
|---|---|---|---|
| 4,839,819 A | 6/1989 | Begin et al. | |
| 4,843,311 A | 6/1989 | Rozman et al. | 242/142 |
| 4,878,142 A | 10/1989 | Bergman et al. | |
| 4,878,185 A | 10/1989 | Brand et al. | |
| 4,884,021 A | 11/1989 | Hammond et al. | |
| 4,901,221 A | 2/1990 | Kodosky et al. | |
| 4,914,568 A | 4/1990 | Kodosky et al. | |
| 4,979,122 A | 12/1990 | Davis et al. | |
| 5,017,860 A | 5/1991 | Germer et al. | |
| 5,059,896 A | 10/1991 | Germer et al. | |
| 5,061,890 A | 10/1991 | Langini | |
| 5,081,413 A | 1/1992 | Yamada et al. | |
| 5,095,403 A * | 3/1992 | Pin et al. | 361/641 |
| 5,122,735 A | 6/1992 | Porter et al. | |
| 5,132,610 A | 7/1992 | Ying-chang | |
| 5,151,866 A | 9/1992 | Glasser et al. | |
| 5,155,836 A | 10/1992 | Jordan et al. | |
| 5,207,595 A | 5/1993 | Learmont et al. | 439/517 |
| 5,212,441 A | 5/1993 | McEachern et al. | |
| 5,224,011 A | 6/1993 | Yalla et al. | |
| 5,224,054 A | 6/1993 | Wallis | |
| 5,233,538 A | 8/1993 | Wallis | |
| 5,243,536 A | 9/1993 | Bradford | |
| 5,243,537 A | 9/1993 | Neumann | |
| 5,245,275 A | 9/1993 | Germer et al. | |
| 5,247,454 A | 9/1993 | Farrington et al. | |
| 5,258,704 A | 11/1993 | Germer et al. | |
| 5,262,715 A | 11/1993 | King et al. | |
| 5,270,640 A | 12/1993 | Kohler et al. | |
| 5,295,041 A * | 3/1994 | Metivier et al. | 312/257.1 |
| 5,301,121 A | 4/1994 | Garverich et al. | |
| 5,364,290 A * | 11/1994 | Hartman | 361/659 |
| 5,391,983 A | 2/1995 | Lusigman et al. | |
| 5,414,812 A | 5/1995 | Filip et al. | |
| 5,426,780 A | 6/1995 | Gerull et al. | |
| 5,481,700 A | 1/1996 | Thuraisingham | |
| 5,498,956 A | 3/1996 | Kinney et al. | |
| 5,530,738 A * | 6/1996 | McEachern | 379/88.16 |
| 5,537,029 A | 7/1996 | Hemminger et al. | |
| 5,548,527 A | 8/1996 | Hemminger et al. | |
| 5,549,089 A | 8/1996 | Snell et al. | |
| 5,555,508 A | 9/1996 | Munday et al. | |
| 5,574,653 A * | 11/1996 | Coomer et al. | 361/115 |
| 5,627,759 A | 5/1997 | Bearden et al. | |
| 5,631,843 A | 5/1997 | Munday et al. | |
| 5,650,936 A | 7/1997 | Loucks et al. | |
| 5,736,847 A | 4/1998 | Van Doorn et al. | |
| 5,828,576 A | 10/1998 | Loucks et al. | |
| 5,933,004 A * | 8/1999 | Jackson et al. | 324/110 |
| 6,064,192 A * | 5/2000 | Redmyer et al. | 324/117 H |
| 6,075,357 A * | 6/2000 | Bolam | 324/110 |

OTHER PUBLICATIONS

"Protective Relaying Theory and Applications," edited by Walter A. Elmore, pp. 17–37 (1994).
"The world is changing. The old answers no longer apply," *Schlumberger*, Bulletin.
"Series PM170 Powermeters," *SATEC*, Bulletin.
"System 270 Powermeter," *SATEC*, Bulletin.
"RPM090 Digital Transducer," *SATEC*, Bulletin.
"Series 290 Power Monitoring System," *SATEC*, Bulletin.
"PM290HD Powermeter With Harmonic Analysis," *SATEC*, Bulletin.
"AX–7 Analog Expander," *SATEC*, Bulletin.
"Application Software, Professional Systems For Energy Control And Management," *SATEC*, Bulletin.
"Power Monitoring And Analysis Systems," *SATEC*, Bulletin.
"PM—295 Powermeter / Harmonic Analyzer," *SATEC*, Bulletin.
"PM 295 Power Monitoring System with Harmonic Analysis," *SATEC*, Bulletin.
"PM 170M Powermeter—with KVA Measurements," *SATEC*, Bulletin.
"Vector Electricity Meter with the Site Genie™ Monitor," *General Electric*.
"VECTRON® SVX Solid–State Polyphase Meters," *Schlumberger*, Bulletin 11314 (Mar. 1996).
"MAXsys® 2510 Substation/High–End Direct Access Meter," *Siemens*, Bulletin.
"MAXsys® 2410 Direct Access Meter," *Siemens*, Bulletin.
"AIN ALPHA® Meter For IEC Standards," *ABB Information Systems*, Bulletin.
"ALPHA Stars™, National Wireless Communications for Remote Metering," *ABB Information Systems*, Bulletin.
"AIN Alpha, High Function Multi–Tariff Solid State Electricity Meter," *ABB Network Partner*, PB 42–280–lb, pp. 1–20.
"MARK–V Digital True RMS Energy Meter," *TransData, Inc.*, Bulletin.
"MAXsys®—PSI," *Siemens*, Bulletin.
"MeterView™ Software Environment . . . , . . . Instant Access to Maxsys™ Meter Information," *Siemens*, D00024D (1997).
"MAXsys®—Multi–Access Metering And Control," *Siemens*, Bulletin.
"MAXsys® For Energy Providers," *Siemens*, Bulletin.
QUAD4® Plus and MAXsys® Meters and IEDs, *Siemens, QUAD2DSQ* (1998).
The QUAD4® *Plus* Solid–State Meter, *PSI*, Bulletin.
"kV Telephone Modem," *General Electric*, Bulletin.
"kV A–Base Meters," *General Electric*, Bulletin.
"kV Class 320 Meters," *General Electric*, Bulletin.
"EnergyAxis™ Customer Site Metering System For On–Site Metering and Power Analysis", *ABB Information Systems*, Bulletin (1998).
"8500 ION® Direct Access Billing Meter," *8500 ION™*, Power Measurement, Bulletin (Aug. 11, 1998).
"7700 ION® 3–Phase Power Meter, Analyzer and Controller," *7700 ION™*, Power Measurement, Bulletin (Apr. 22, 1998).
"American National Standard for Electric Meters—Code for Electricity Metering," *American National Standard*, Document ANSI C12.1 (1995).
"American National Standard for Electromechanical Watthour Meters," *The Institute of Electrical and Electronics Engineers, Inc.*, ANSI C12 (1987) (Revision of ANSI C12–10–1987).
"American National Standard for Electronic Time–of–Use Registers for Electricity Meters," *The Institute of Electrical and Electronics Engineers, Inc.*, ANSI C12 (Revision of ANSI C12 13–1985) (1991).
"American National Standard for Solid–State Electricity Meters," *The Institute of Electrical and Electronics Engineers, Inc.*, ANSI C12.16 (1991).
"American National Standard for Electricity Meters 0.2 and 0.5 Accuracy Classes," *American National Standards*, ANSI C12.20 (1998).

"ISO—Specification MTR1–96, Engineering Specification For Polyphase Solid–State Electricity Meters For Use On The ISO Grid," Exhibit A, pp. 1–42 (1997).

"Specifications For Approval Of Type of Electricity Meters, Instrument Transformers And Auxiliary Devices," *Consumer and Corporate Affairs Canada*.

International Standard, Alternating current static watt–hour meters for active energy (classes 0,2 S and 0,5 S), *International Electrotechnical Commission*, second edition (1992).

"Meter–Mounting Devices, Industrial Products," *Canadian Standards Association*, C22.2 No. 115–M (1989).

"Alternating–Current Electricity Metering, Electric Power Systems and Equipment," *Canadian Standards Association*, CAN3–C17–M (1984).

International Standard, Amendment 1 to Publication 868 (1986), *International Electrotechnical Commission*, Modification 1 (1986).

"International Standard, Electromagnetic Compatibility (EMC)—Part 4: Testing and measurement techniques—Section 15: Flickemeter—Functional and design specifications," *International Electrotechnical Commission*, 61000 4-15 (1997).

"Measurement Guide for Voltage Characteristics—Electricity Product Characteristics and Electromagnetic Compatibility," 230.02 *Norcomp, Unipede* (1995).

"Voltage characteristics of electricity supplied by public distribution systems," *BSI Standards*, 50160 (1995).

"Minutes of the 7th Meeting, Distribution Committee," *EEI*, 1998.

Quantum® Q1000 "Sandy Creek Plant Lonworks® Communication" brochure, © Copyright 1997 Schlumberger Industries, Inc., MK/1662/9–97, pp. 1–4.

Schlumberger Electricity "One of your largest customers is concerned about power quality . . . " brochure, © Copyright 1996 Schlumberger Industries, Inc., PP1633/6–96m pp. 1–5.

Schlumberger "Quantum® Q100 Multimeasurement Meter Technical Reference Guide," Effective Oct. 1999, ® Copyright 1999, Schlumberger Resource Management Services, Inc.

* cited by examiner

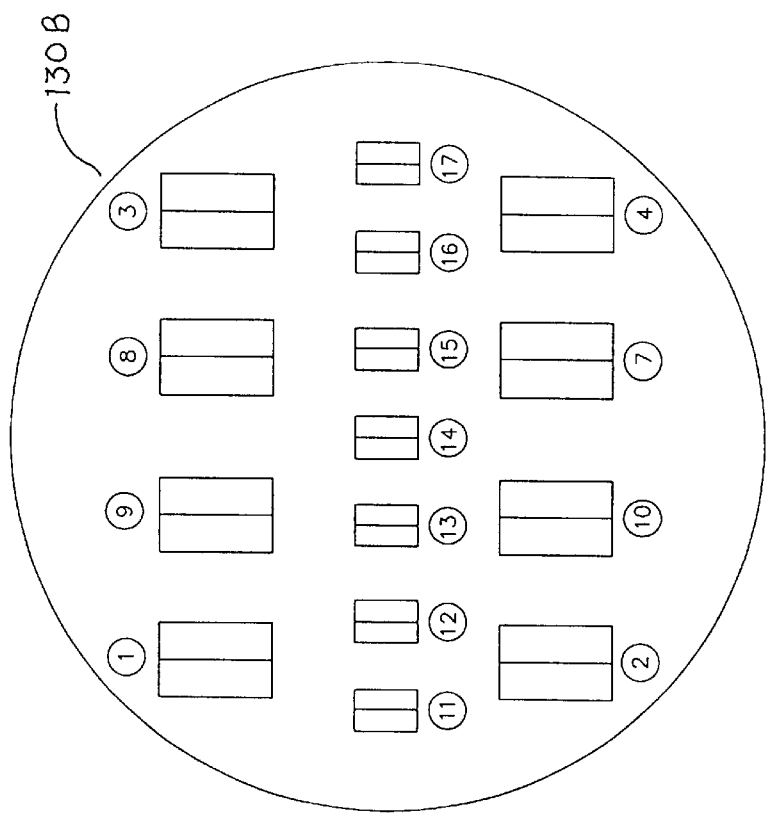
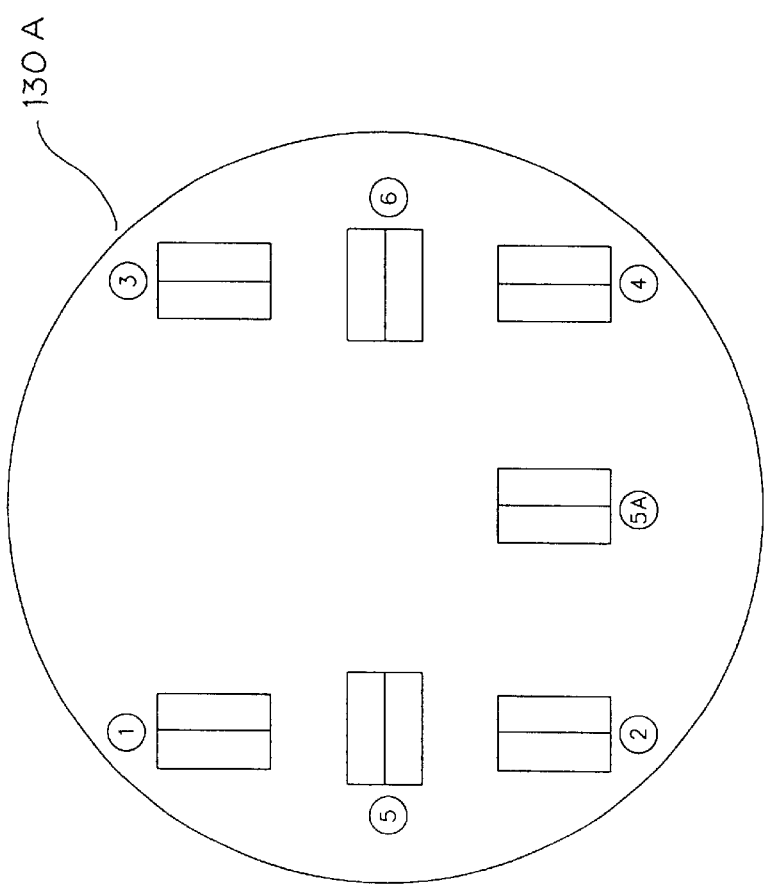
Fig. 3

REVENUE METER POWER SUPPLY BLOCK DIAGRAM

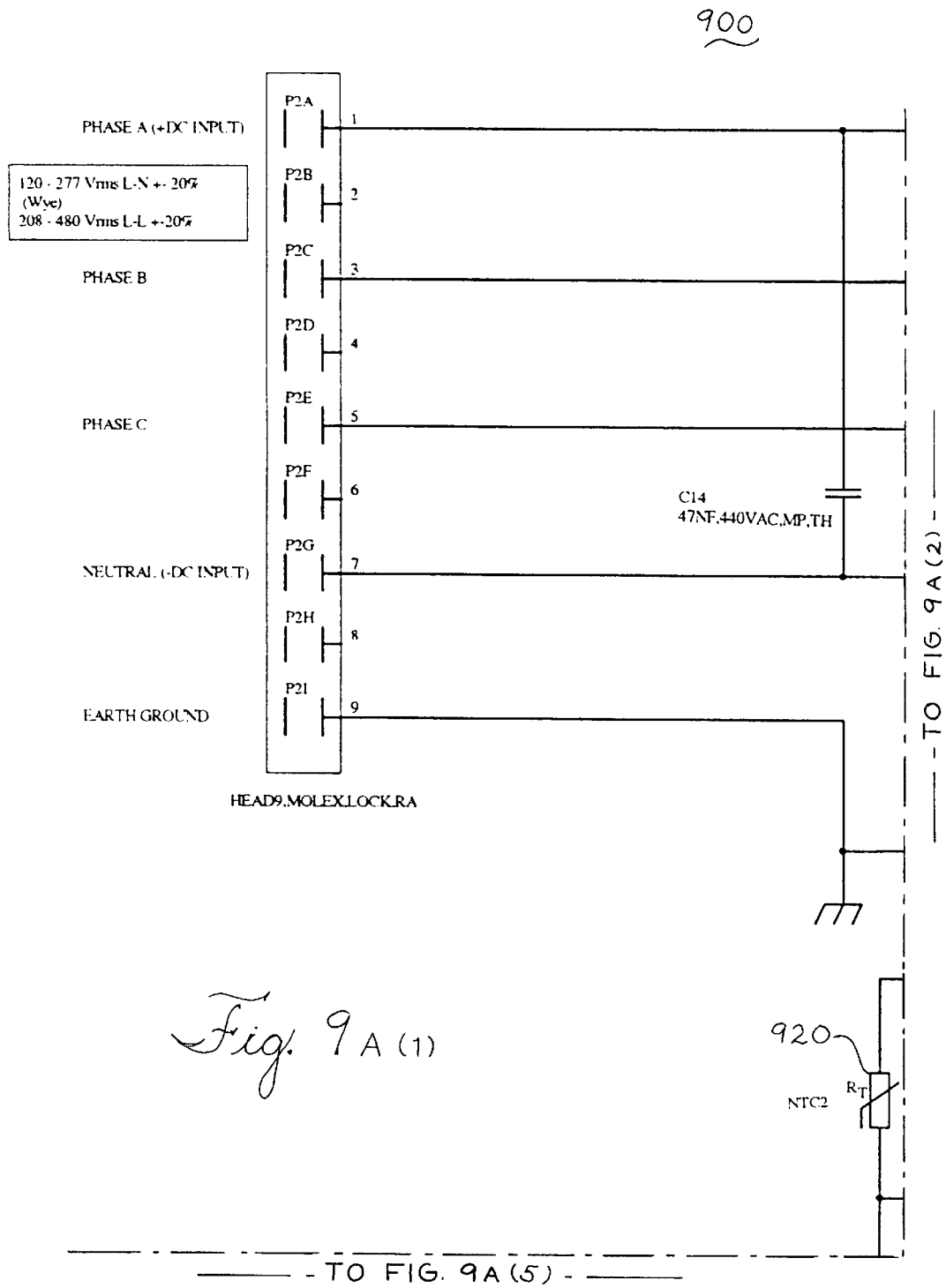
Fig. 9A(1)

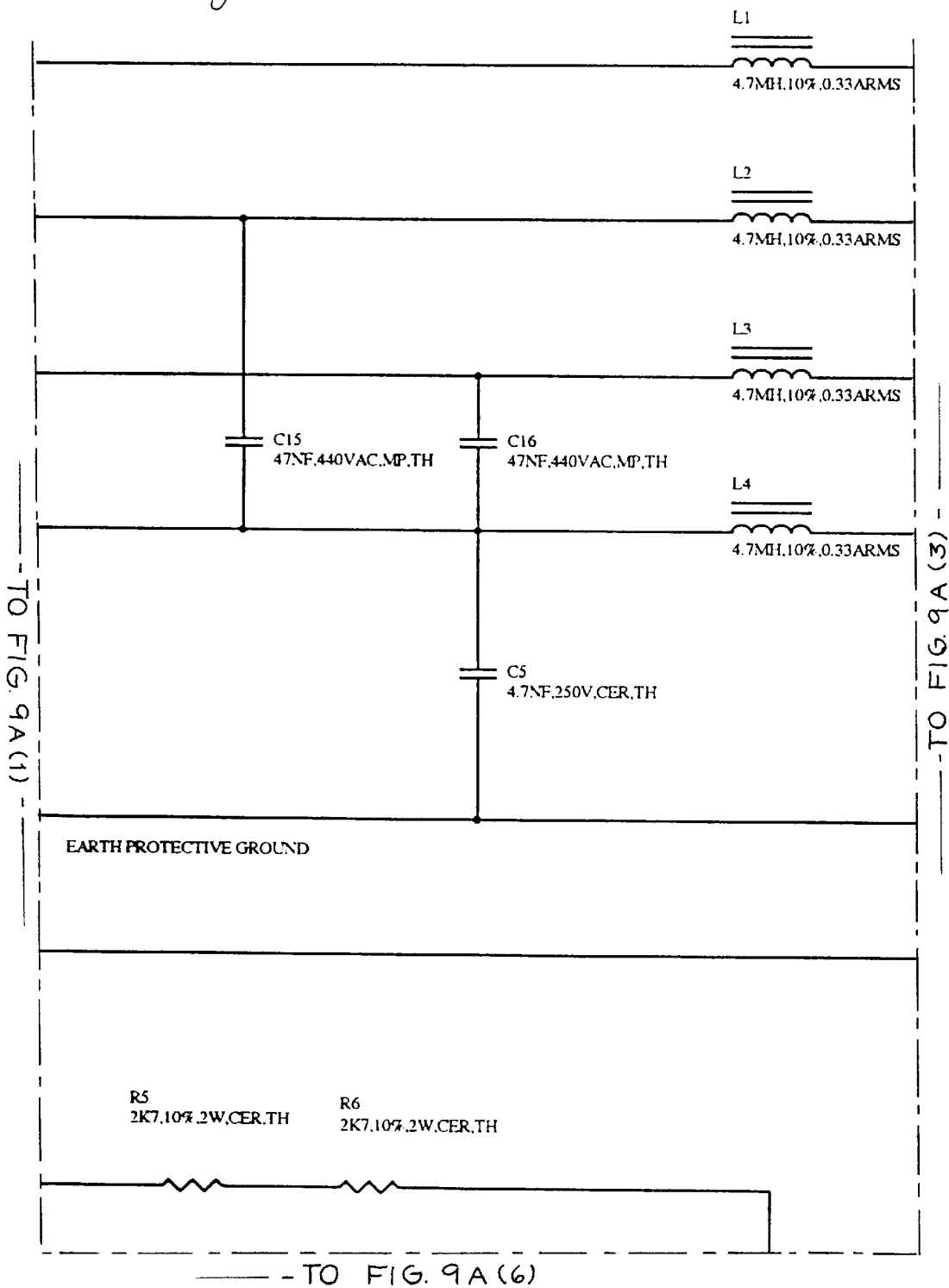
Fig. 9A(2)

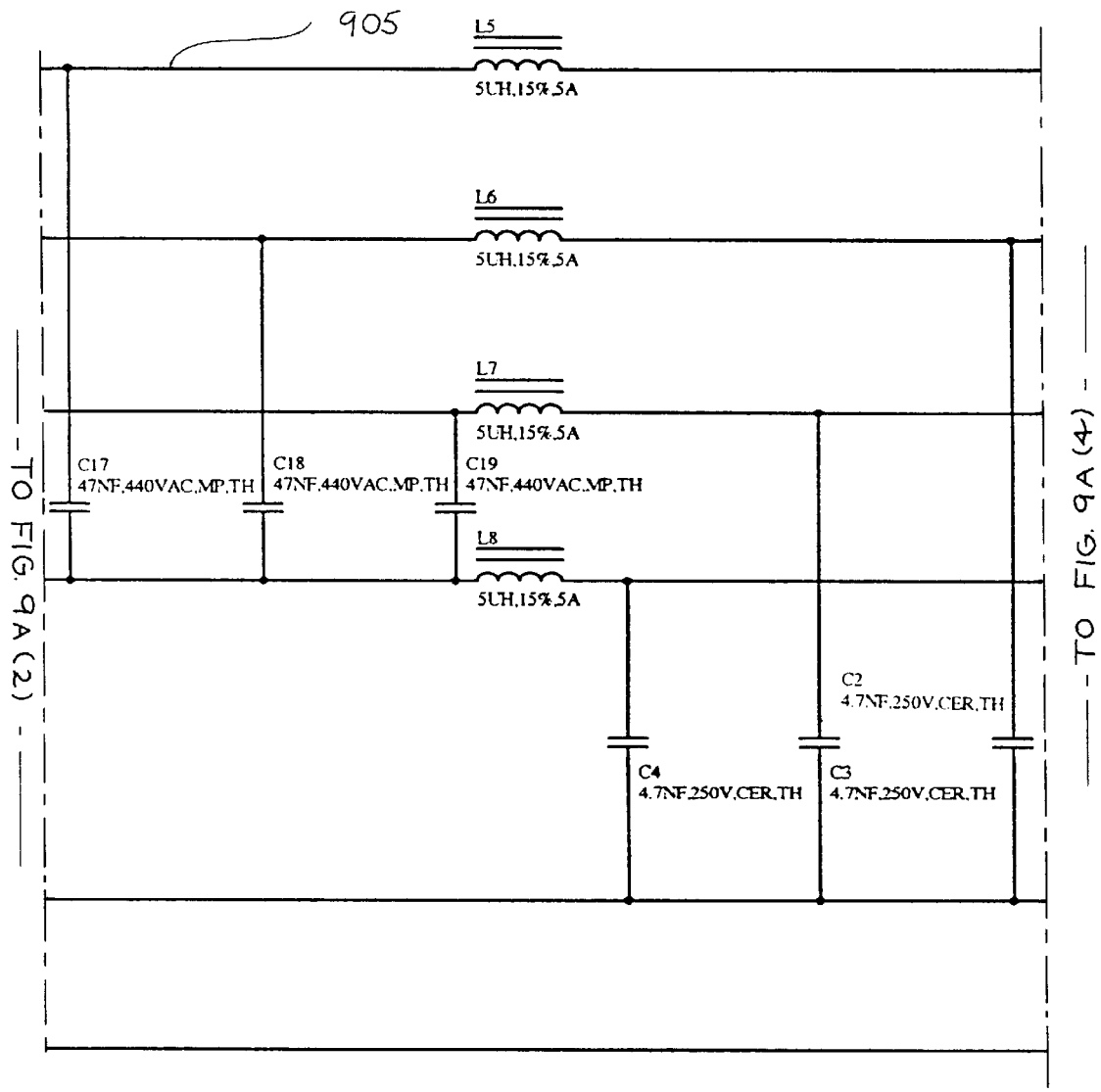
Fig. 9A (3)

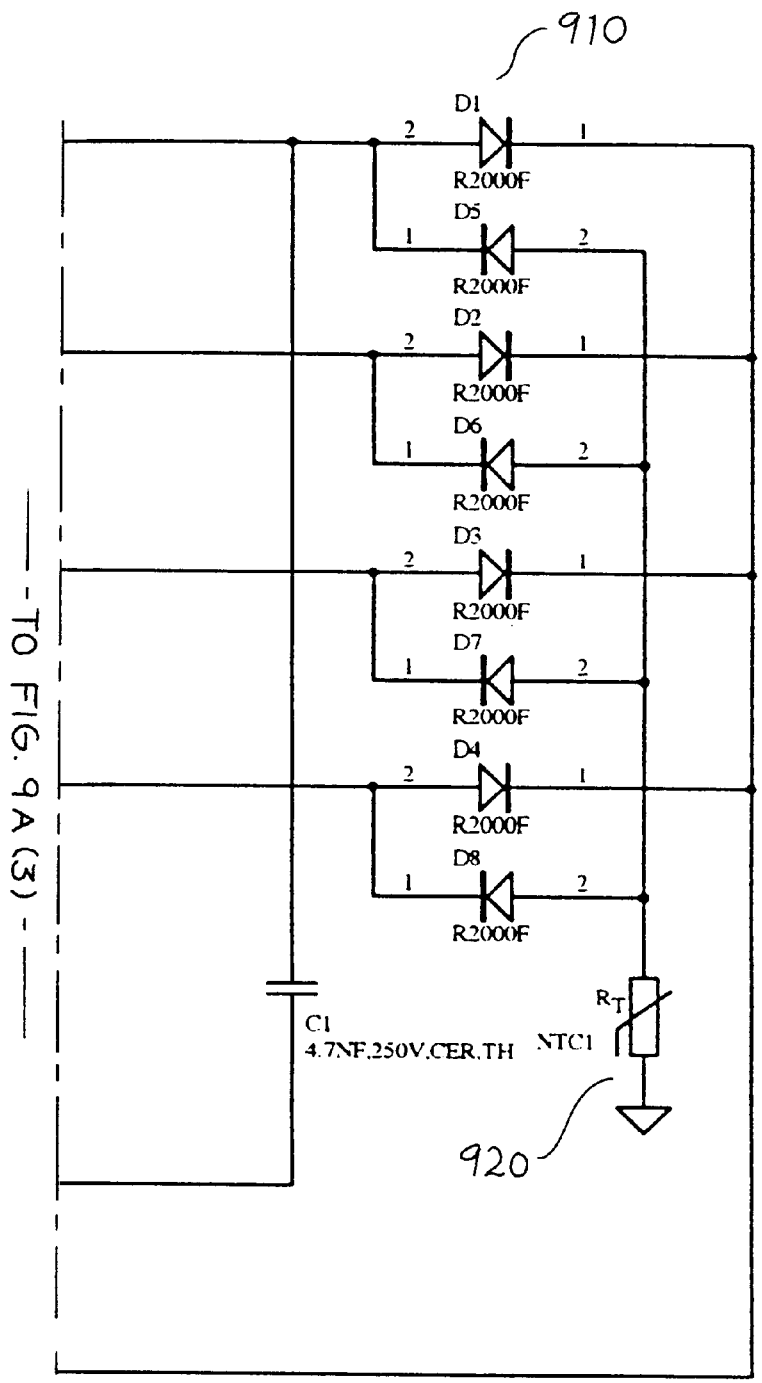
Fig. 9A (4)

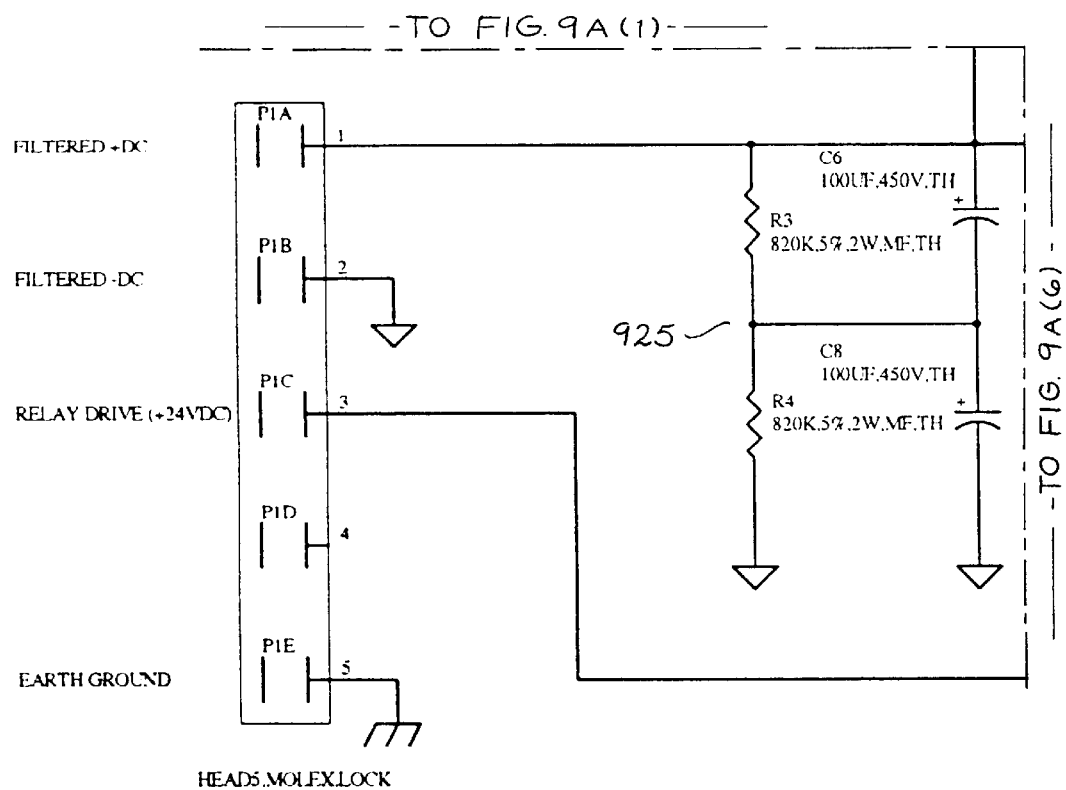
Fig. 9A(5)

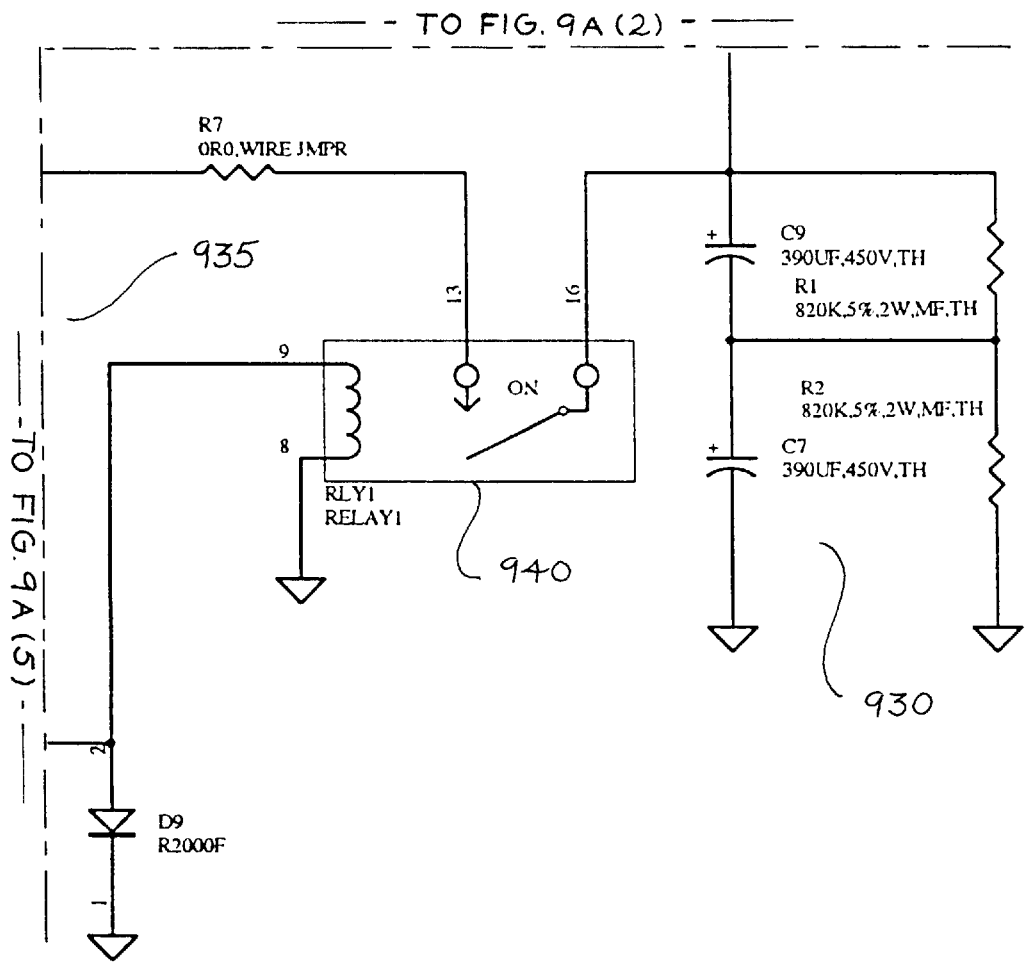
Fig 9A(6)

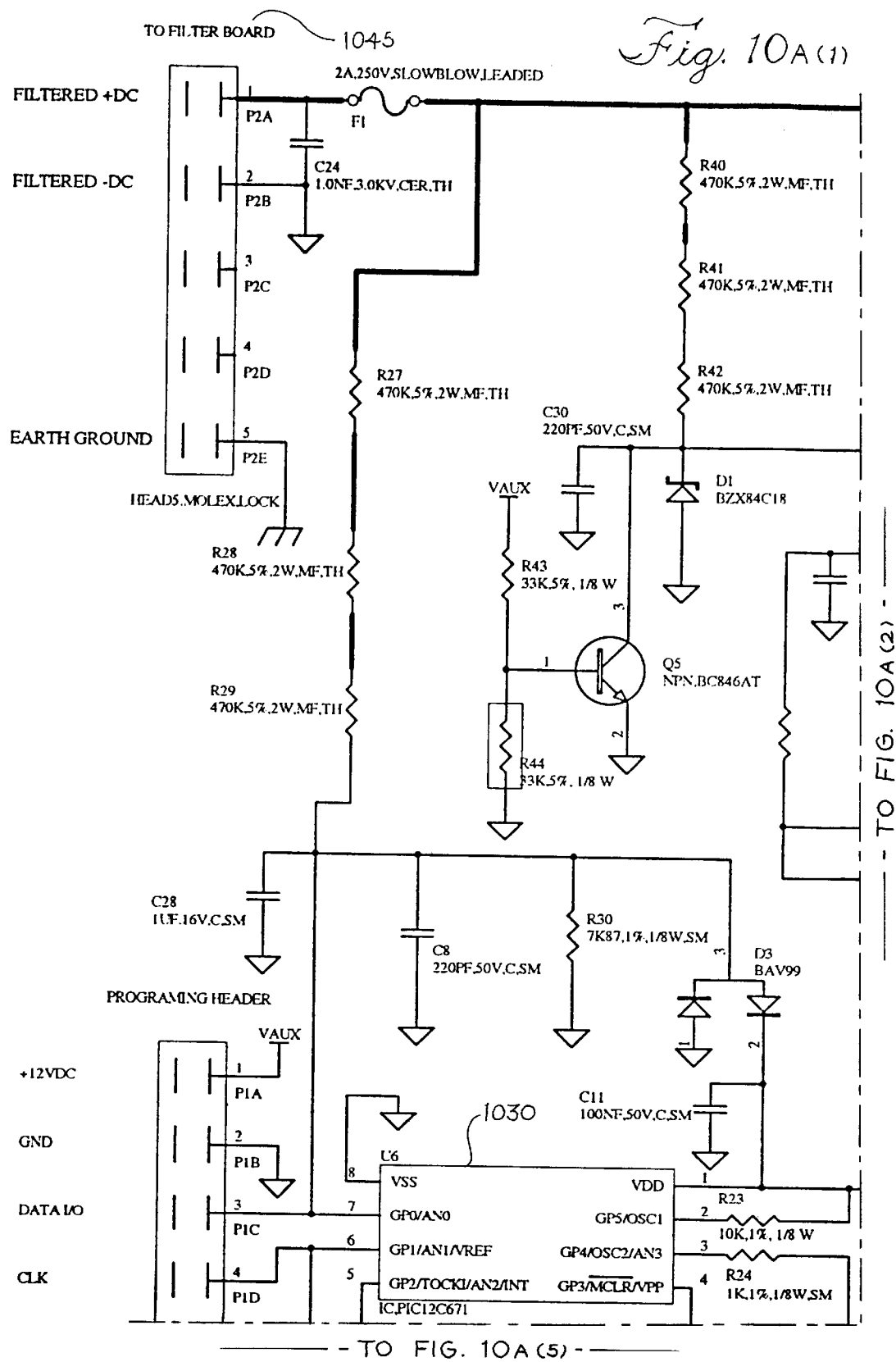
Fig. 10A(1)

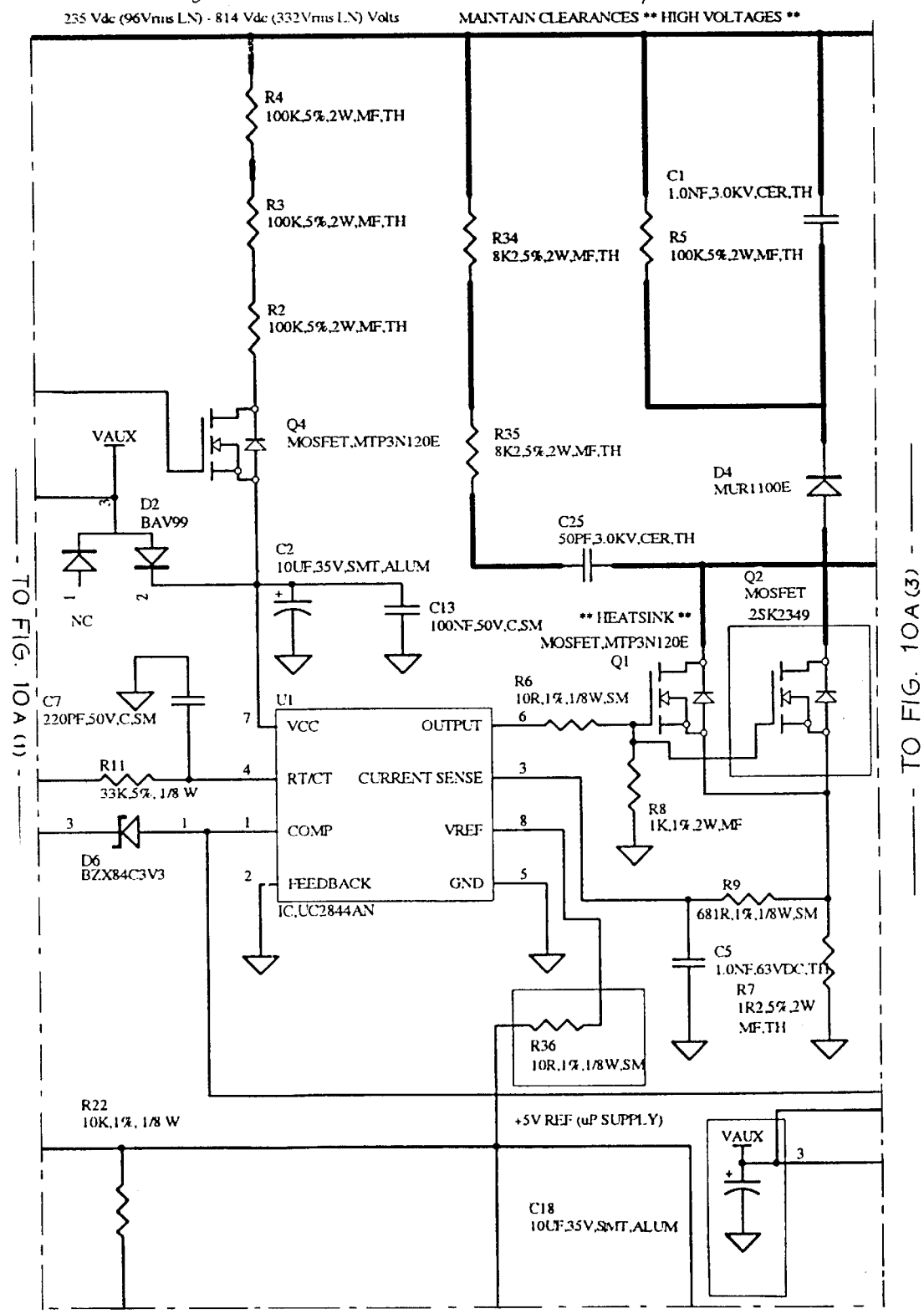
Fig. 10A (2)

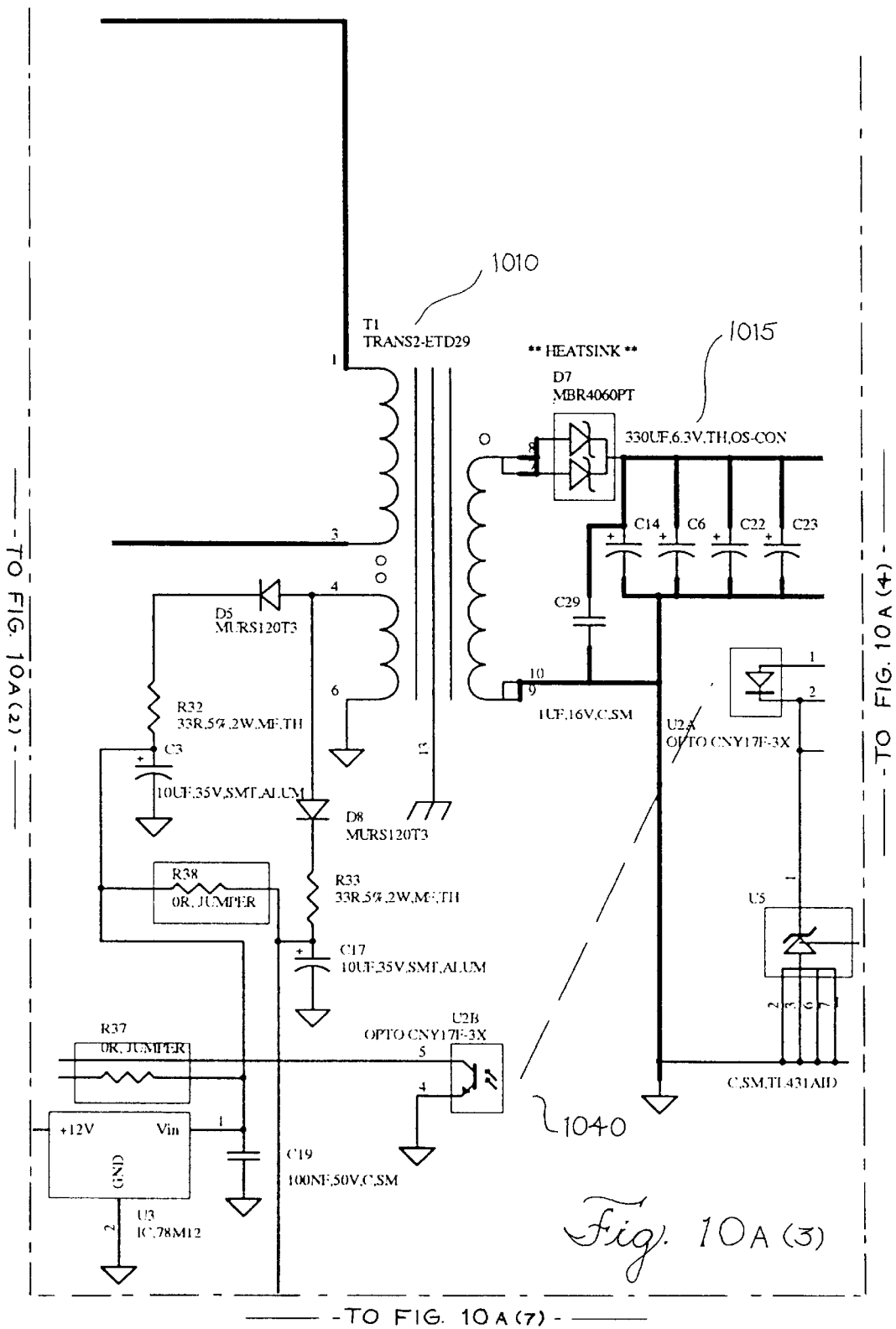
Fig. 10A (3)

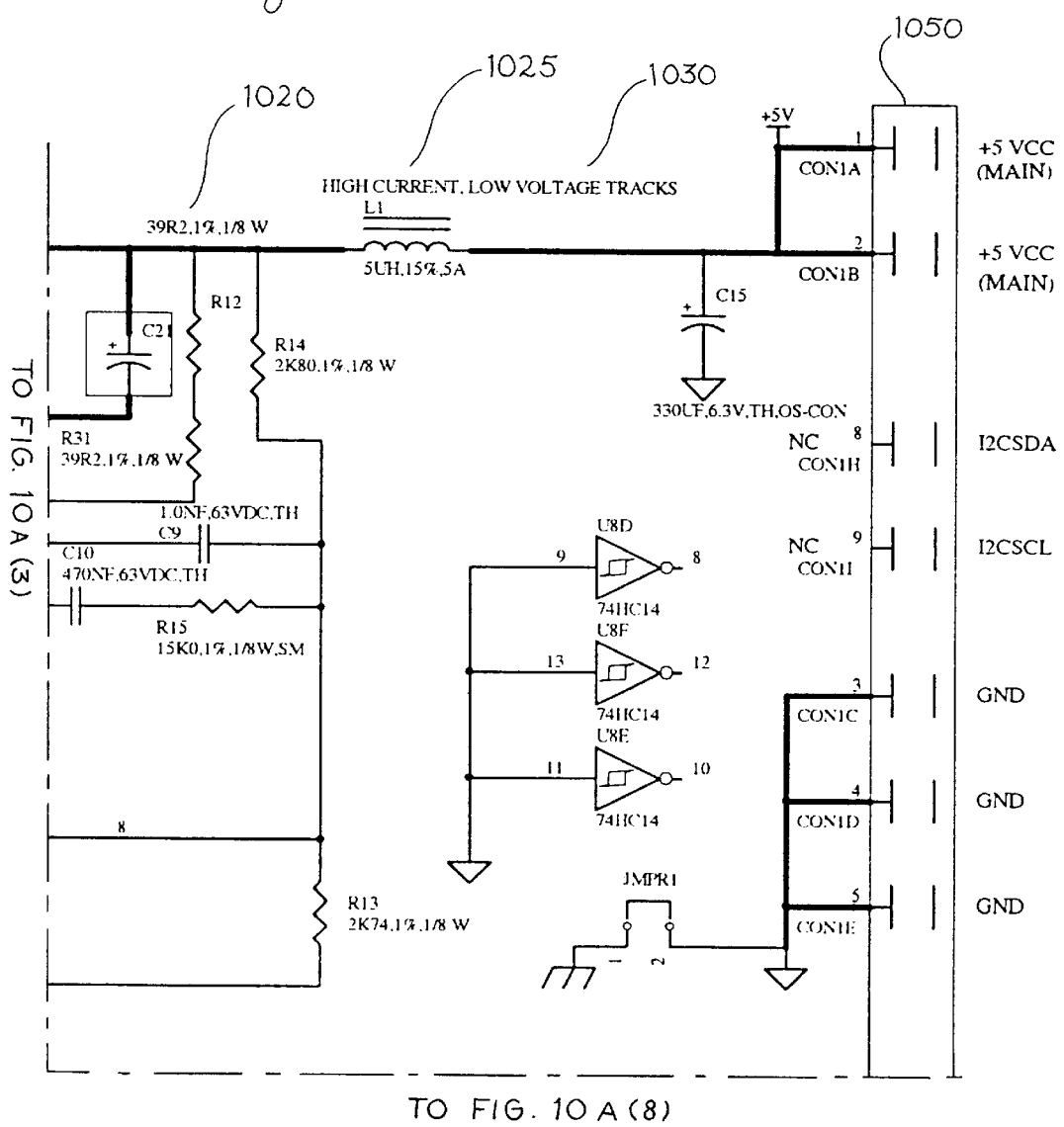
Fig. 10A (4)

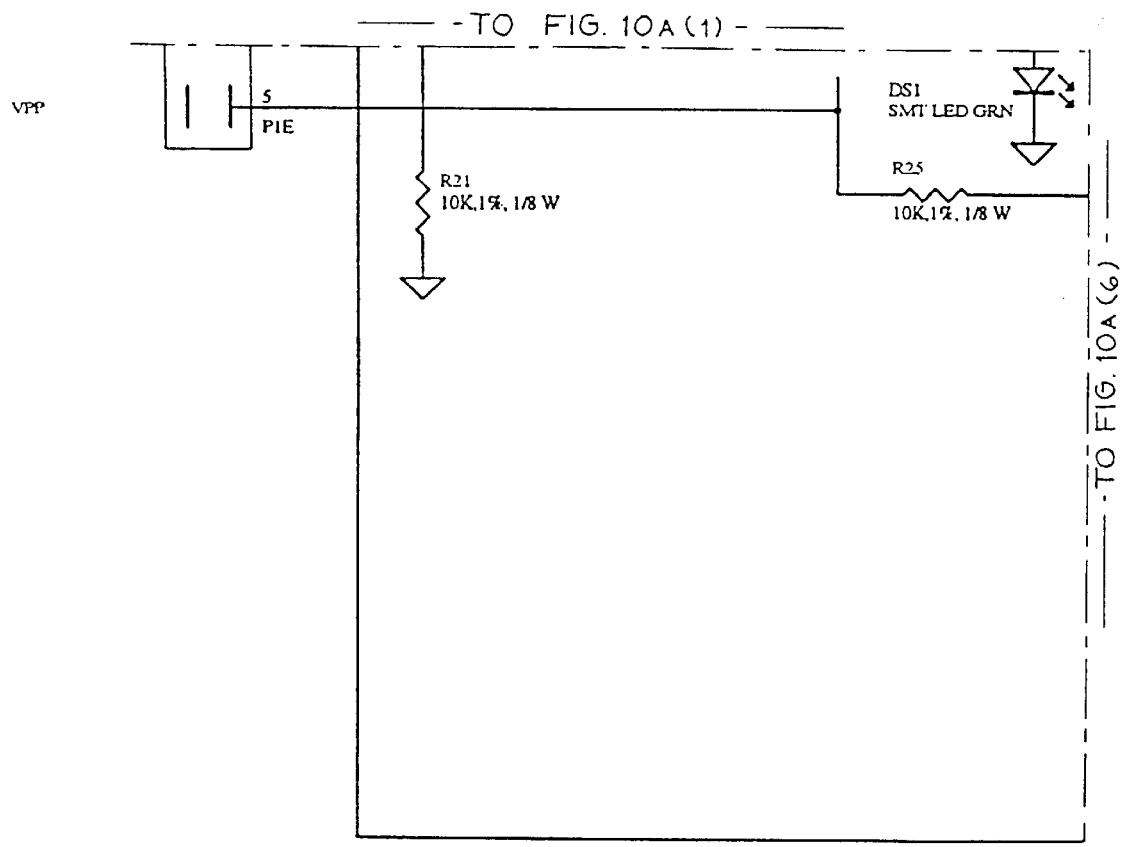
Fig. 10A (5)

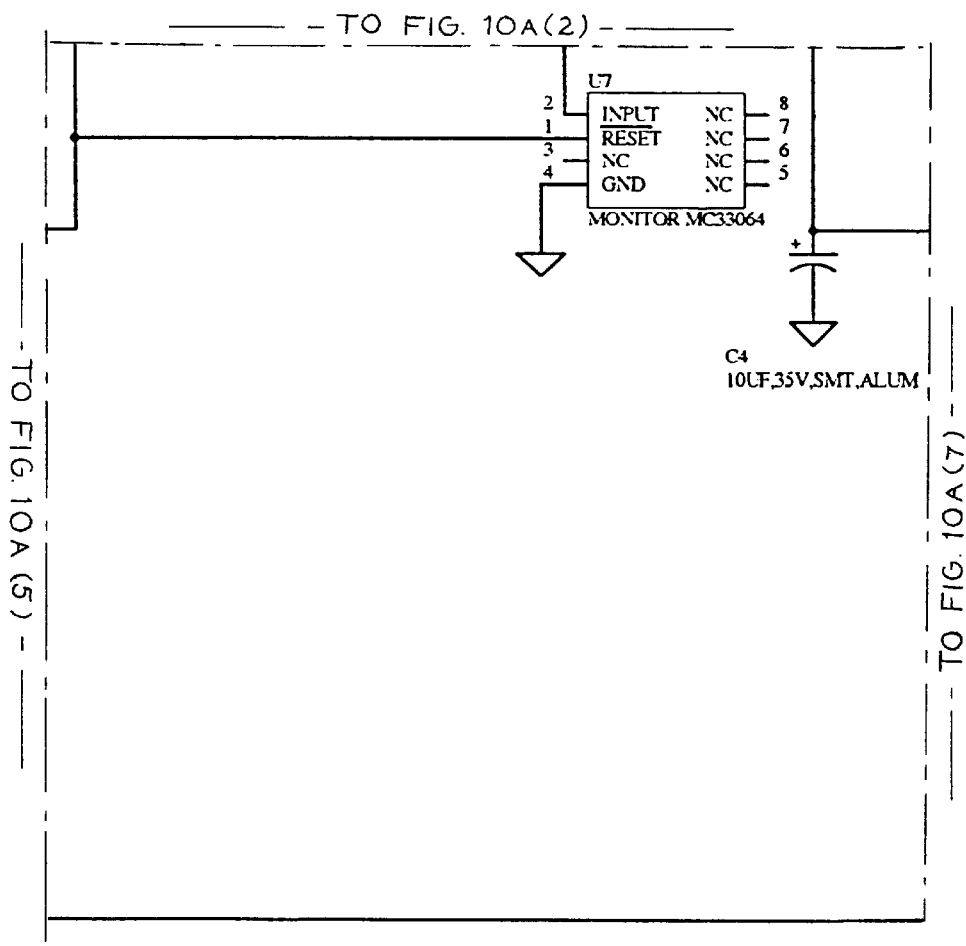
Fig. 10A (6)

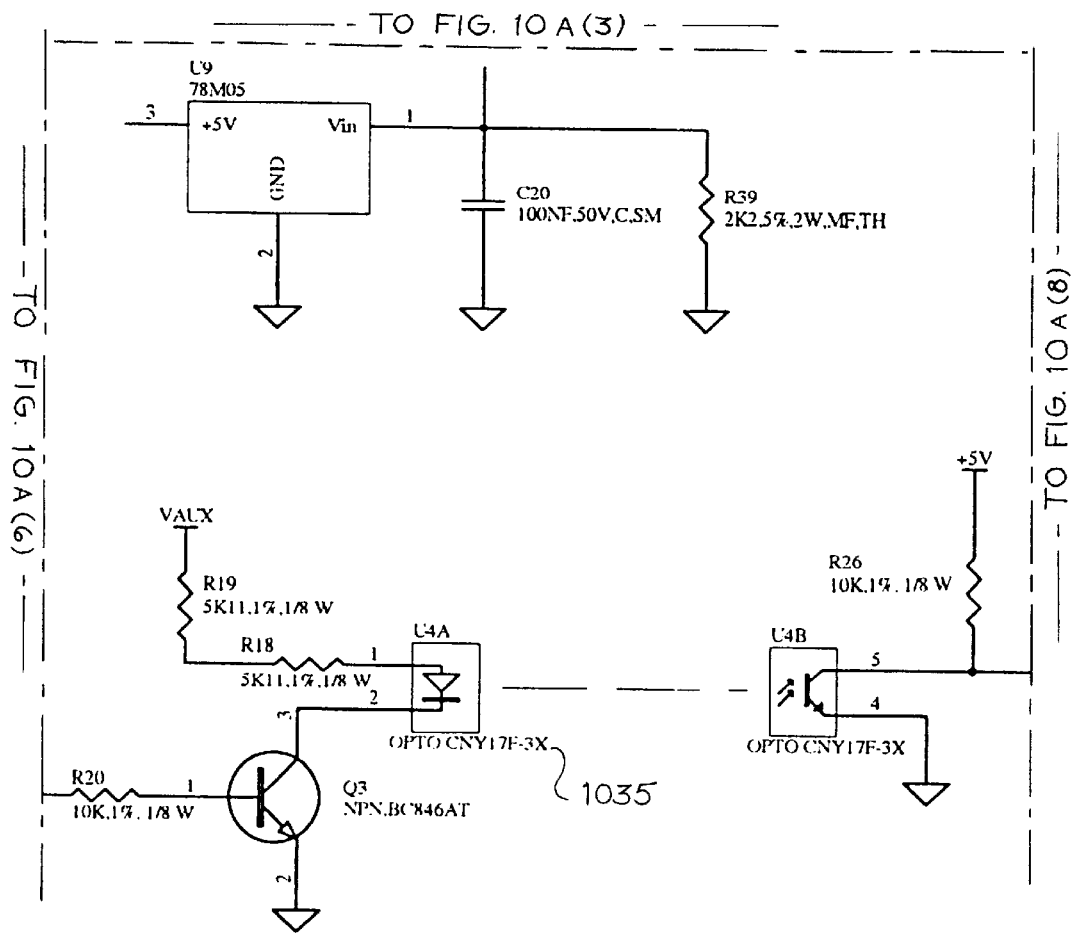
Fig. 10A (7)

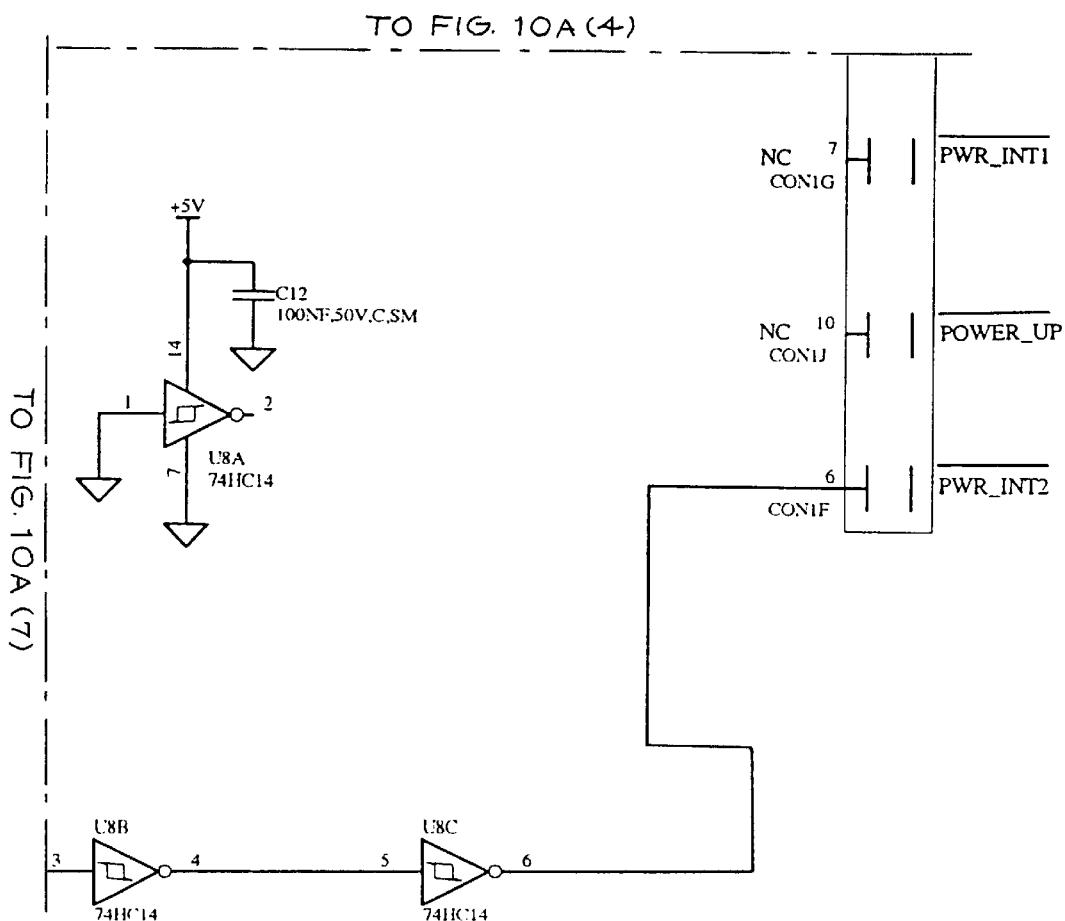
Fig. 10A (8)

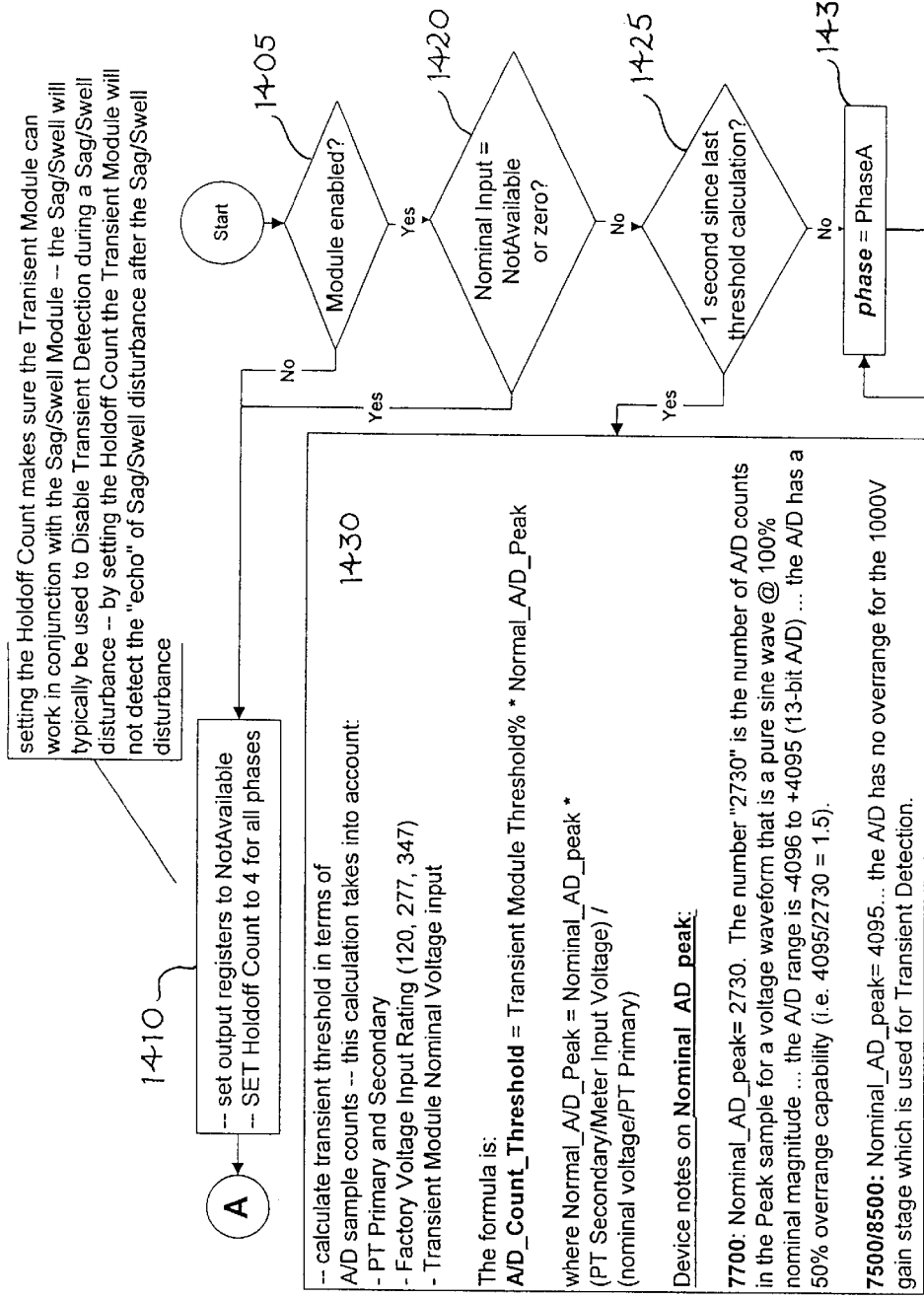

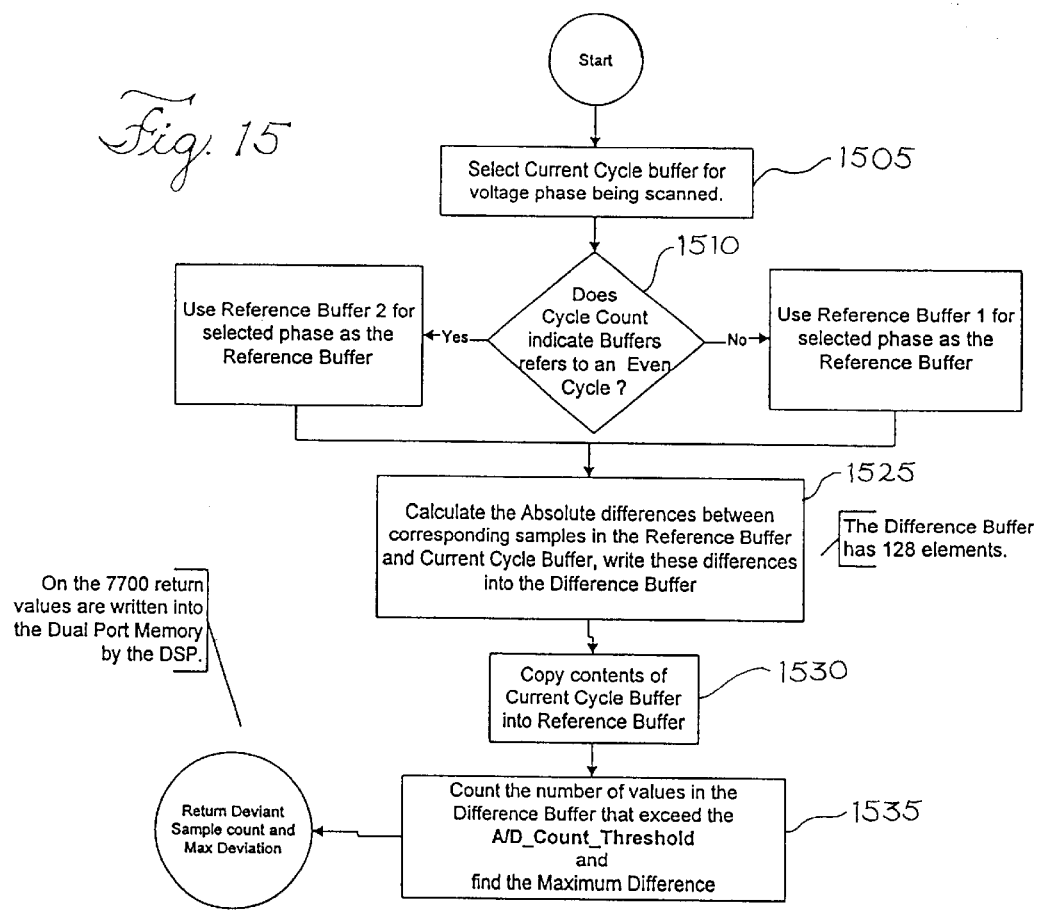
Fig. 15
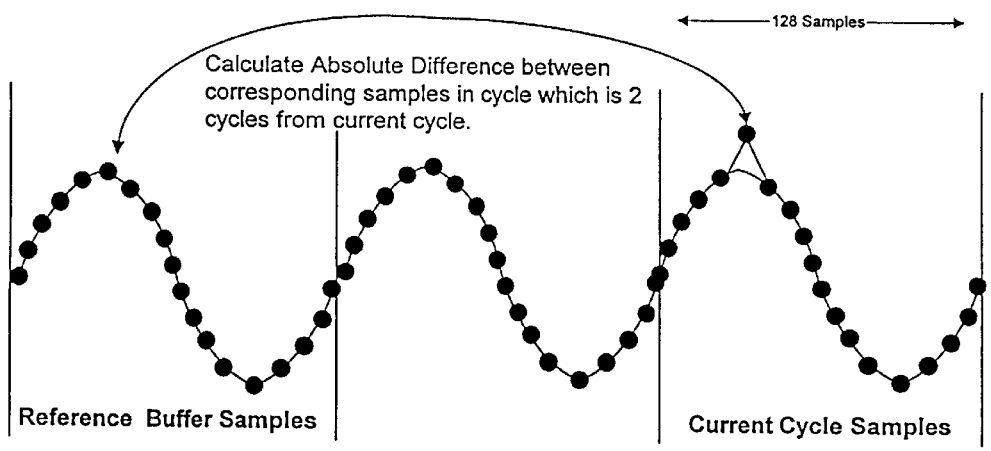

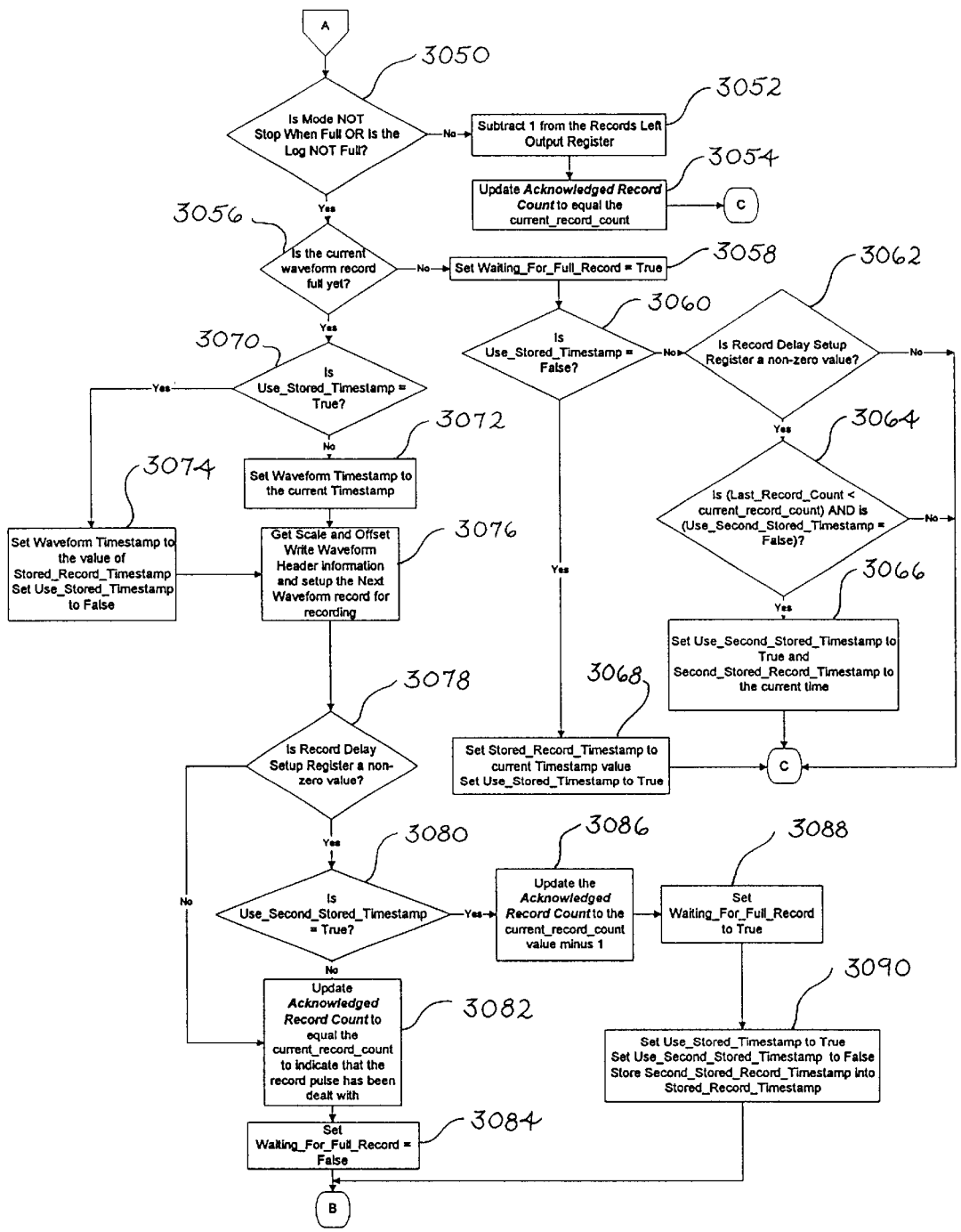
Fig. 30 (2)

Internal Variables
Delay_Pending indicates whether a waveform Record Delay is currently active. Set to False on initialization of internal variables.
Delay_Counter indicates how many cycles the delay has been pending for. Set to 0 on initialization of internal variables.
Waiting_For_Full_Record indicates a record pulse has been detected, but the current waveform record is not full yet. Set to False on initialization of internal variables.
Use_Stored_Timestamp indicates that the next waveform to be stored should use Stored_Record_Timestamp instead of the current cycle timestamp. Set to False on initialization of internal variables.
Stored_Record_Timestamp indicates the timestamp to use for the next waveform, if Used_Stored_Timestamp is True. Never initialized since it will only be used when Use_Stored_Timestamp is True, which indicates that Stored_Record_Timestamp has been set.
Use_Second_Stored_Timestamp indicates that the next waveform to be stored should use Stored_Record_Timestamp and that the waveform following should use Second_Stored_Record_Timestamp instead of the current cycle timestamp. If it is True, then Use_Stored_Timestamp is also True. Set to False on initialization of internal variables.
Second_Stored_Record_Timestamp indicates the timestamp to use for the waveform following the next waveform, if Used_Second_Stored_Timestamp is True. It will only be set if Stored_Record_Timestamp has also been set. Never initialized since it will only be used when Use_Second_Stored_Timestamp is True, which indicates that Second_Stored_Record_Timestamp has been set.
Last_Record_Count indicates the Record count on last module execution. It is set to the current Record input count on initialization of internal variables.
Acknowledged Record Count indicates the Record pulse count that has been acknowledged already. If this value is equal to the number of pulses on the Record input, then the module does not need to store any new waveforms. This value is actually stored in the Input Handle structure for the Record input handle.
Acknowledged Rearm Count indicates the Rearm pulse count that has been acknowledged already. If this value is equal to the number of pulses on the Rearm input, then the Rearm input has not been pulsed. This value is actually stored in the Input Handle structure for the Rearm input handle.
Local Variables
Current Record Count indicates the pulse count in the register connected to the Record input link. If this value is greater than the Acknowledged Record Count then the module must store a new waveform. This value is copied into the current_record_count local variable at the start of the operate function.
Current Rearm Count indicates the pulse count in the register connected to the Rearm input link. If this value is greater than the Acknowledged Rearm Count then the module must rearm itself.

DMA Half-Cycle Activity Timeline

| line half cycles | n-1 | n | n+1 | n+2 | n+3 | n+4 | n+5 |
|---|---|---|---|---|---|---|---|
| DSP ACTIVITY | A/D sample(n-1) & pre-process(n-3)(n-2) | A/D sample(n) & pre-process(n-2)(n-1) | A/D sample(n+1) & pre-process(n-1)(n) | A/D sample(n+2) & pre-process(n)(n+1) | A/D sample(n+3) & pre-process(n+1)(n+2) | A/D sample(n+4) & pre-process(n+2)(n+3) | A/D sample(n+5) & pre-process(n+3)(n+4) |
| DMA ACTIVITY | DMA transfer: samples(n-2) & pre-results(n-4)(n-3) | DMA transfer: samples(n-1) & pre-results(n-3)(n-2) | DMA transfer: samples(n) & pre-results(n-2)(n-1) | DMA transfer: samples(n+1) & pre-results(n-1)(n) | DMA transfer: samples(n+2) & pre-results(n)(n+1) | DMA transfer: samples(n+3) & pre-results(n+1)(n+2) | DMA transfer: samples(n+4) & qc_results(n+2)(n+3) |
| CPU ACTIVITY | process pre-results(n-5)(n-4) record waveform(n-5) | process pre-results(n-4)(n-3) record waveform(n-4) | process pre-results(n-3)(n-2) record waveform(n-3) | process pre-results(n-2)(n-1) record waveform(n-2) | process pre-results(n-1)(n) record waveform(n-1) | process pre-results(n)(n+1) record waveform(n) | process pre-results(n+1)(n+2) record waveform(n+1) |

[- - - -] Waveform Recording is autoranged and delayed by 3 to 4 half cycles with respect to any real-time line event

[......] Half Cycle calculation Results are delayed by 3 half cycles with respect to any real-time line event.

Fig. 34

REVENUE METER WITH POWER QUALITY FEATURES

RELATED APPLICATIONS

The following co-pending and commonly assigned U.S. Patent Applications have been filed on the same date as the present application. All of these applications relate to and further describe other aspects of the embodiments disclosed in the present application and are all herein incorporated by reference.

U.S. patent application Ser. No. 09/371,883, "A-BASE REVENUE METER WITH POWER QUALITY FEATURES", filed Aug. 9, 1999, U.S. patent application Ser. No. 09/370,695, "REVENUE METER WITH GRAPHIC USER INTERFACE", filed Aug. 9, 1999, U.S. patent application Ser. No. 09/370,686, "REVENUE METER BLADE ASSEMBLY AND METHOD OF ATTACHMENT", filed Aug. 9, 1999, now U.S. Pat. No. 6,186,842;

U.S. patent application Ser. No. 09/370,863, "A POWER SYSTEM TIME SYNCHRONIZATION DEVICE AND METHOD FOR SEQUENCE OF EVENT RECORDING", filed Aug. 9, 1999, U.S. patent application Ser. No. 09/369,870, "METHOD AND APPARATUS FOR AUTOMATICALLY CONTROLLED GAIN SWITCHING OF POWER MONITORS", filed Aug. 9, 1999, U.S. patent application Ser. No. 09/370,696, "EXTERNAL COMMUNICATIONS INTERFACE FOR A REVENUE METER", filed Aug. 9, 1999, U.S. patent application Ser. No. 09/370,757, "A KEYPAD FOR A REVENUE METER", filed Aug. 9, 1999.

REFERENCE TO MICROFICHE APPENDIX

A microfiche appendix, Appendix A, is included of a computer program listing. The total number of microfiche is 6. The total number of frames is 186. A second microfiche appendix, Appendix B, is also included of schematic diagrams. The total number of microfiche is 1 and the total number of frames is 23.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates to revenue meters of the type used by energy suppliers to accurately measure electrical energy delivered to consumers for the purposes of billing and/or collecting revenue and more particularly, this invention relates to revenue meters having power quality monitoring, detection, quantification and reporting capabilities.

BACKGROUND

In a typical electrical distribution system, electrical energy is generated by an electrical supplier or utility company and distributed to consumers via a power distribution network. The power distribution network is the network of electrical distribution wires which link the electrical supplier to its consumers. Typically, electricity from a utility is fed from a primary substation over a distribution cable to several local substations. At the substations, the supply is transformed by distribution transformers from a relatively high voltage on the distributor cable to a lower voltage at which it is supplied to the end consumer. From the substations, the power is provided to industrial users over a distributed power network that supplies power to various loads. Such loads may include, for example, various power machines.

At the consumer's facility, there will typically be an electrical energy meter ("revenue meter") connected between the consumer and the power distribution network so as to measure the consumer's electrical demand. The revenue meter is an electrical energy measurement device which accurately measures the amount of electrical energy flowing to the consumer from the supplier. The amount of electrical energy measured by the meter is then used to determine the amount for which the energy supplier should be compensated.

Typically, the electrical energy is delivered to consumers as an alternating current ("AC") voltage that approximates a sine wave over a time period. The term "alternating waveform" generally describes any symmetrical waveform, including square, sawtooth, triangular, and sinusoidal waves, whose polarity varies regularly with time. The term "AC" (i.e., alternating current), however, almost always means that the current is produced from the application of a sinusoidal voltage, i.e., AC voltage. The expected frequency of the AC voltage, e.g., 50 Hertz ("Hz"), 60 Hz, or 400 Hz, is usually referred to as the "fundamental" frequency. Integer multiples of this fundamental frequency are usually referred to as harmonic frequencies.

While the fundamental frequency is the frequency that the electrical energy is expected to arrive with, various distribution system and environmental factors can distort the fundamental frequency, i.e., harmonic distortion, can cause spikes, surges, or sags, and can cause blackouts, brownouts, or other distribution system problems. These problems can greatly affect the quality of power received by the power consumer at its facility or residence as well as make accurate determination of the actual energy delivered to the consumer very difficult.

In order to solve these problems, revenue meters have been developed to provide improved techniques for accurately measuring the amount of power used by the consumer so that the consumer is charged an appropriate amount and so that the utility company receives appropriate compensation for the power delivered and used by the consumer. Examples of such metering systems are well known in the art.

While these conventional revenue accuracy type metering systems provide information about the quality of the power, i.e., frequency and duration of blackouts, brownouts, harmonic distortions, surges, sags, swells, imbalances, huntings, chronic overvoltages, spikes, transients, line noise, or the like, received by a power consumer at a particular consumer site, they fail to monitor and quantify the power quality with a sufficient level of detail. Blackouts, brownouts, harmonic distortions, surges, sags, swells, imbalances, huntings, chronic overvoltages, spikes, transients and line noise are all examples of power quality events. As utility companies become more and more deregulated, these companies will likely be competing more aggressively for various consumers, particularly heavy power users, and the quality of the power received by the power consumer is likely to be important. This, in turn, means that accurate and detailed reporting and quantification of power quality events and overall power quality will become more and more important as well.

For example, one competitive advantage that some utility companies may have over their competitors could be a higher quality of the power supplied to and received by the consumer during certain time periods. One company may promote the fact that it has fewer times during a month that power surges reached the consumer causing potential damage to computer systems or the like at the consumer site. Another company may promote that it has fewer times during a month when the voltage level delivered to the consumer was not within predetermined ranges which may be detrimental to electromagnetic devices such as motors or relays. Previous revenue accuracy meters which provide for measuring quality of power in general lack the necessary accuracy and features to provide the consumer and the power utility with the needed information.

Accordingly, there is a need for a revenue accuracy meter that is capable of monitoring, reporting and quantifying the quality of power with a high level of detail and accuracy. Further there is a need for a revenue accuracy meter that can continue to monitor and quantify data throughout the duration of a power quality event and prevent loss of recorded power quality information in the event of a catastrophic power quality event such as a complete power failure.

SUMMARY

By way of introduction, the preferred embodiments described below relate to revenue accuracy electrical power metering devices with the ability to detect, monitor, report, quantify and communicate power quality information about the power which they are metering. More particularly, the preferred embodiments relate to revenue accuracy electrical metering devices having the capabilities of power quality event "ride thru", transient detection, wave shape quantification, sag/swell detection, harmonic content quantification, symmetrical component quantification, waveform recording and direct memory access data transfer. These capabilities provide a revenue accuracy meter which can continue to monitor and quantify data throughout the duration of a power quality event and prevent loss of recorded power quality information in the event of a catastrophic power quality event such as a complete power failure.

BRIEF DESCRIPTION OF THE DRAWINGS

FIG. 3 shows exemplary layouts of the matching jaws of the detachable meter mounting device of FIG. 1 for receiving the blade type terminals shown in FIG. 2.

FIG. 9A depicts a circuit schematic of the preferred filter module of FIG. 9.

FIG. 10A depicts a circuit schematic of the preferred switcher module of FIG. 10.

FIG. 15 shows a block diagram depicting the Scan_For_Deviant_Samples routine of the transient detection module of FIG. 12.

FIG. 34 shows a half-cycle activity time for DMA accesses for the DMA firmware of FIG. 33.

DETAILED DESCRIPTION OF THE PRESENTLY PREFERRED EMBODIMENTS

I. Overview

Figure 1:
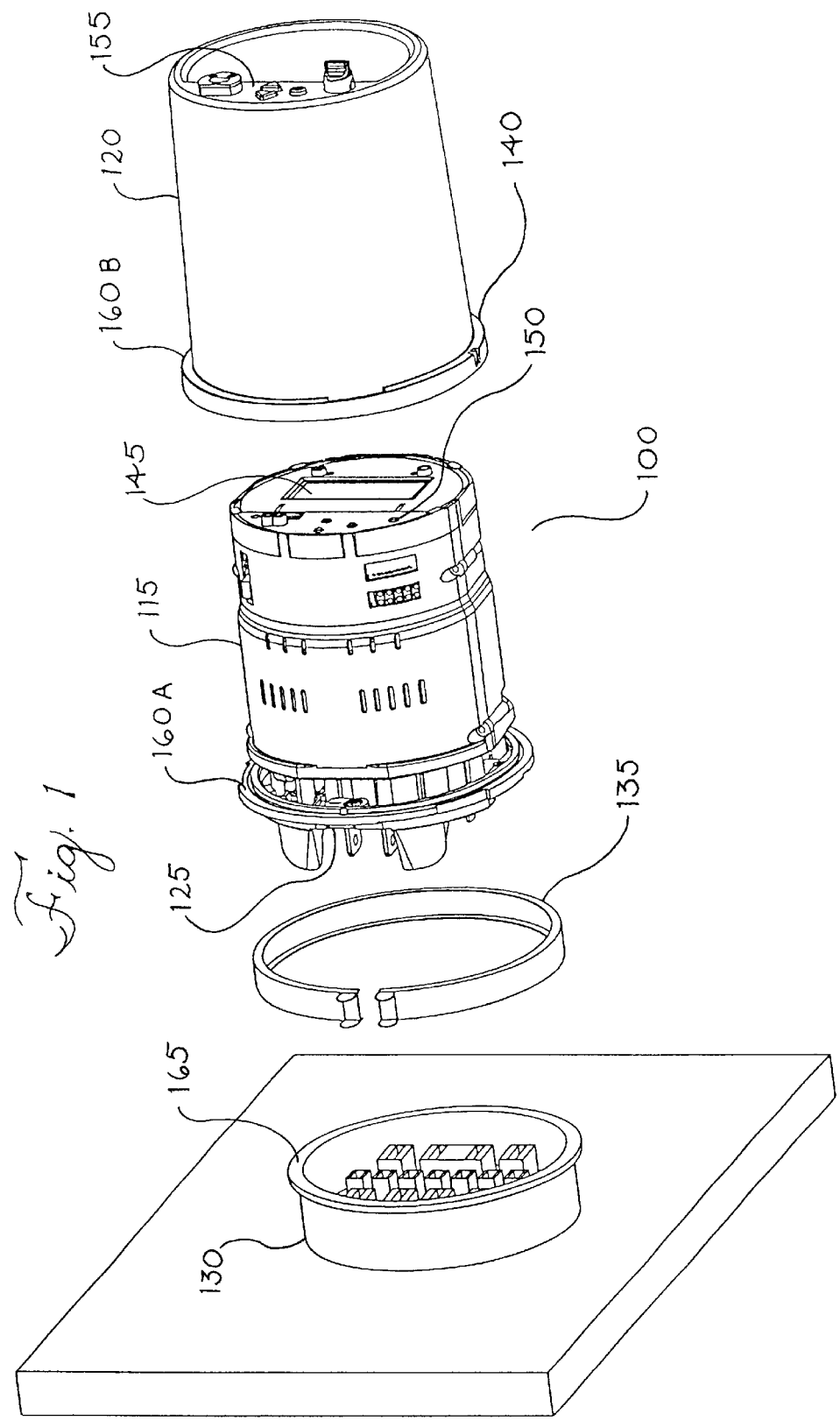
FIG. 1 depicts a perspective view of an exemplary S-Base revenue meter and socket type detachable meter mounting device for connecting the meter to an electrical circuit.

The preferred embodiments relate to highly accurate and detailed power quality event detection, monitoring and quantification in revenue accuracy electrical meters. Herein, the phrase "coupled with" is defined to mean directly coupled with or indirectly coupled to through one or more intermediate components.

Revenue accuracy electrical meters ("revenue meters" or "meters") are metering devices that indicate or record electrical energy and demand (the average power or a related quantity over a specified interval of time) for the purpose of compensating the electric utility for the energy consumption of the end user. Energy is typically the primary billing quantity and is equal to power integrated over time. Energy is measured in Kilowatt Hours ("KWH") and demand is measured in Kilowatts ("KW"). Note that some consumers of electrical energy may also have generation capability. In a case where a consumer is generating more energy than he is consuming, that energy will flow back to the utility for which the consumer will be compensated. Effectively, a consumer with excess generation capacity becomes a supplier and the utility becomes the consumer. The methods, systems and apparatuses disclosed below are equally applicable to this alternative situation.

Revenue meters must comply with American National Standards Institute's ("ANSI") Standards for electric meters which include, but are not limited to, the following:

ANSI C12.1 (1995): American National Standard for Electric Meters-Code for Electricity Metering;

ANSI C12.10 (1987): American National Standard for Electromechanical Watthour Meters;

ANSI C12.13 (1991): American National Standard for Electronic Time of Use Registers for Electricity Meters;

ANSI C12.16 (1991): American National Standard for Solid-State Electricity Meters; and ANSI C12.20 (1998): American National Standard for Electricity Meters 0.2 and 0.5 Accuracy Classes.

All of which are known in the art and are herein incorporated by reference. Other specification/standards which apply to revenue meters include:

ISO Specification MTR1–96, "Engineering Specification for Polyphase Solid State Electricity Meters for Use on the ISO Grid";

Consumer and Corporate Affairs Canada, Legal Metrology Branch, "Specifications for Approval of Type of Electricity Meters, Instrument Transformers and Auxiliary Devices";

International Electrotechnical Commission, 687, "Alternating Current Static Watt-hour Meters for Active Energy (classes 0, 2 S and 0, 5 S)";

Canadian Standards Association, C22.2 No. 115-M1989, "Meter Mounting Devices: Industrial Products"; and Canadian Standards Association, CAN3-C17-M84, "Alternating-Current Electricity Metering: Electric Power Systems and Equipment".

All of which are known in the art and herein incorporated by reference. It will be appreciated by those skilled in the art that there may be other applicable standards in use in the industry as well.

The ANSI standards define two general types of revenue meters, socket based ("S-base" or "Type S") and bottom connected ("A-base" or "Type A"). A third type of revenue meter, known as a "Switchboard Meter" or "Draw-out Meter", is also commonly in use in the industry. These types of revenue meters are distinguished, in at least one respect, by the method in which they are connected to the electric circuit that they are monitoring. All three meter types are designed for connection to a three phase electric circuit.

Figure 2:
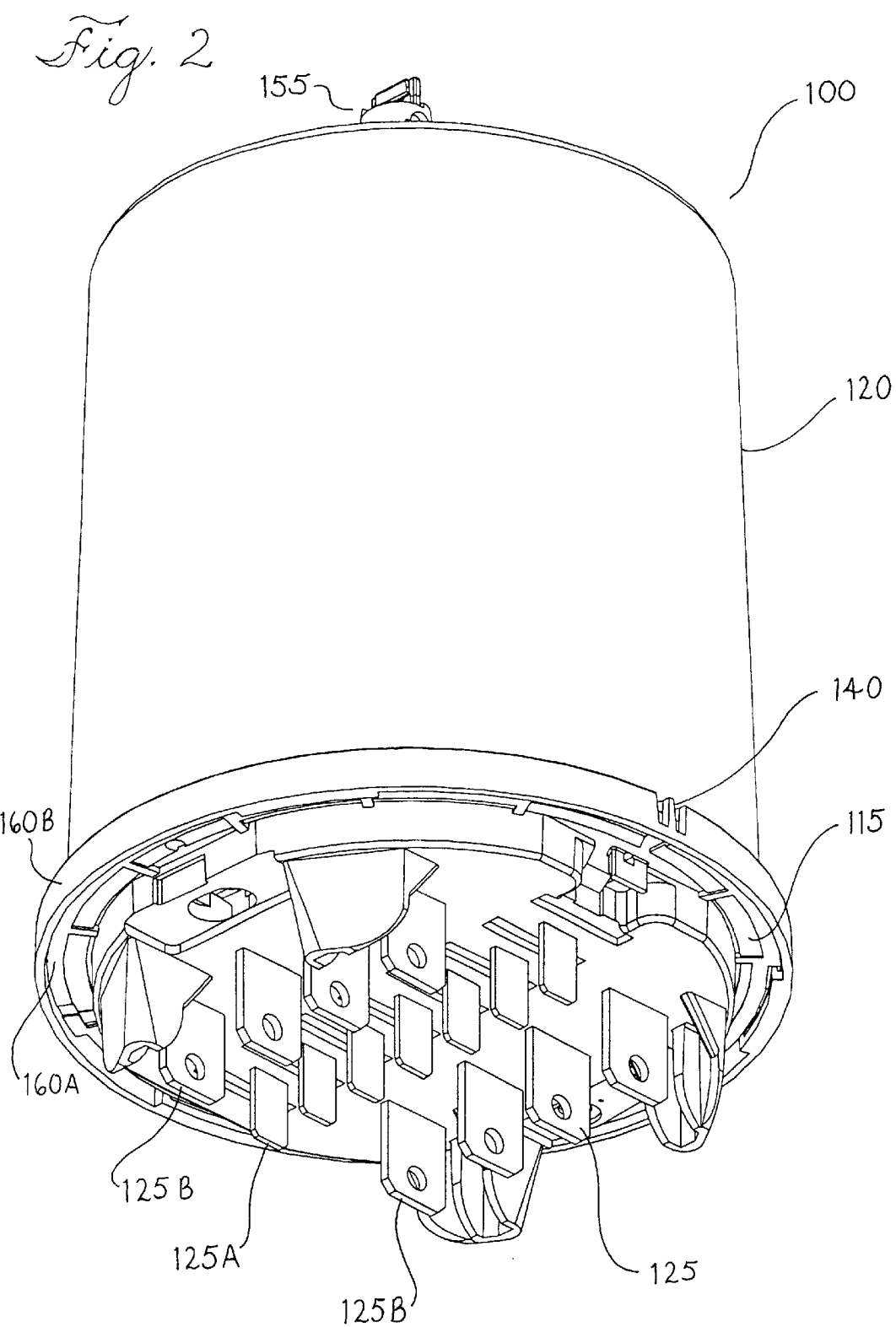
FIG. 2 shows the blade type terminals on the back of the revenue meter depicted in FIG. 1.

Referring now to FIGS. 1 through 3, an S-base revenue meter 100 is shown. Specifically, in FIG. 1, the S-Base revenue meter 100 includes the revenue meter electronics 115, the meter cover 120 and the blade type terminals 125. The meter electronics further include a display 145 and input/output means 150. The input/output means 150 couples with the meter cover 120 when the cover is in place. The meter cover 120 includes a sealed input/output interface 155 which allows a user to interact with the input/output means 150. Also shown in FIG. 1 is the detachable meter mounting device 130 and the sealing means 135. An exemplary S-base revenue meter 100 is the 8500 ION Revenue Meter manufactured by Power Measurement Limited, Saanichton, British Columbia, Canada. For more detail regarding the input/output means 150 and input/output interface 155, see the above referenced U.S. Pat. Application entitled "REVENUE METER WITH GRAPHIC USER INTERFACE".

S-base meters 100 feature blade type terminals 125 disposed on back side of the meter as shown in more detail in FIG. 2. These blade terminals are designed to mate with the matching jaws of a detachable meter mounting device 130 such as a revenue meter socket as shown in more detail in FIG. 3. FIG. 3 shows two variations 130A and 130B of a meter socket as provided in the ANSI standards, although it will be appreciated by those skilled in the art that there are numerous varieties of revenue meter sockets. Referring back to FIG. 1, the detachable meter mounting device 130 is hard wired to the electrical circuit (not shown) and is not meant to be removed. An exemplary detachable meter mounting device 130 is the 3000 Series Ring Type transformer rated meter socket manufactured by Meter Devices Co., Inc., Canton, Ohio. S-base meters 100 also have a cover 120 which encloses the meter electronics 115 and display 145. The cover has a sealing mechanism 140 which prevents unauthorized access to the meter electronics 115. Typically, this sealing mechanism 140 includes a lead wire "T" seal which is threaded through aligned holes in the sealing mechanism 140 and the base of the meter 100. To install the S-base meter 100, the utility plugs the meter 100 into the detachable meter mounting device 130. This makes installation of new meters, and especially replacement of defective meters, extremely simple. Once installed, the installer need only secure the sealing means 135 which ensure that the meter 100 will not be tampered with (as detailed in the ANSI standards). Exemplary sealing means 135 is the Screw Type Sealing Ring, Model 10-9090 manufactured by Ekstrom Industries, Inc., Farmington Hills, Michigan. The meter 100 further includes a flange 160A (The meter cover also has a flange 160B which fits together with flange 160A) and the detachable meter mounting device 130 includes a flange 165. The sealing ring fits around the flanges 160A, 160B and 165 and prevents them from separating. To remove or replace the meter 100, the installer need only remove the sealing means 135 and pull the meter 100 out of the socket. Alternatively, the sealing means 135 can be built into the detachable meter mounting device 130 as is the case with the 3000 Series Ringless Type transformer-rated meter socket manufactured by Meter Devices Co., Inc., Canton, Ohio. This meter socket features a cover with a port for the socket meter 100 that is narrower than flanges 160A and 160B on the meter 100. When the cover is installed, it prevents removal of the meter 100 from the detachable meter mounting device 130 and removal of the meter cover 120.

Referring to FIG. 2, the blades 125 of the revenue meter 100 are shown in more detail. The blades 125 disposed on the back of the meter 100 connect the meter 100 to the electrical circuit (not shown) and allow the meter 100 to sense, measure and record the voltage and current. The smaller blades 125A in the middle of the meter 100 are used to sense voltage from the electric circuit. Voltage is sensed in parallel to the electric circuit, therefore only one set of inputs is necessary. The larger blades 125B located above and below the voltage blade inputs are used for the current inputs. Current is sensed in series with the electric circuit. The two sets of blades 125A, 125B provide a current return loop through the meter 100. It will be appreciated by those skilled in the art that other blade configurations are possible for voltage and current inputs and that other blades may also be used for other purposes such as communications.

Figure 4:
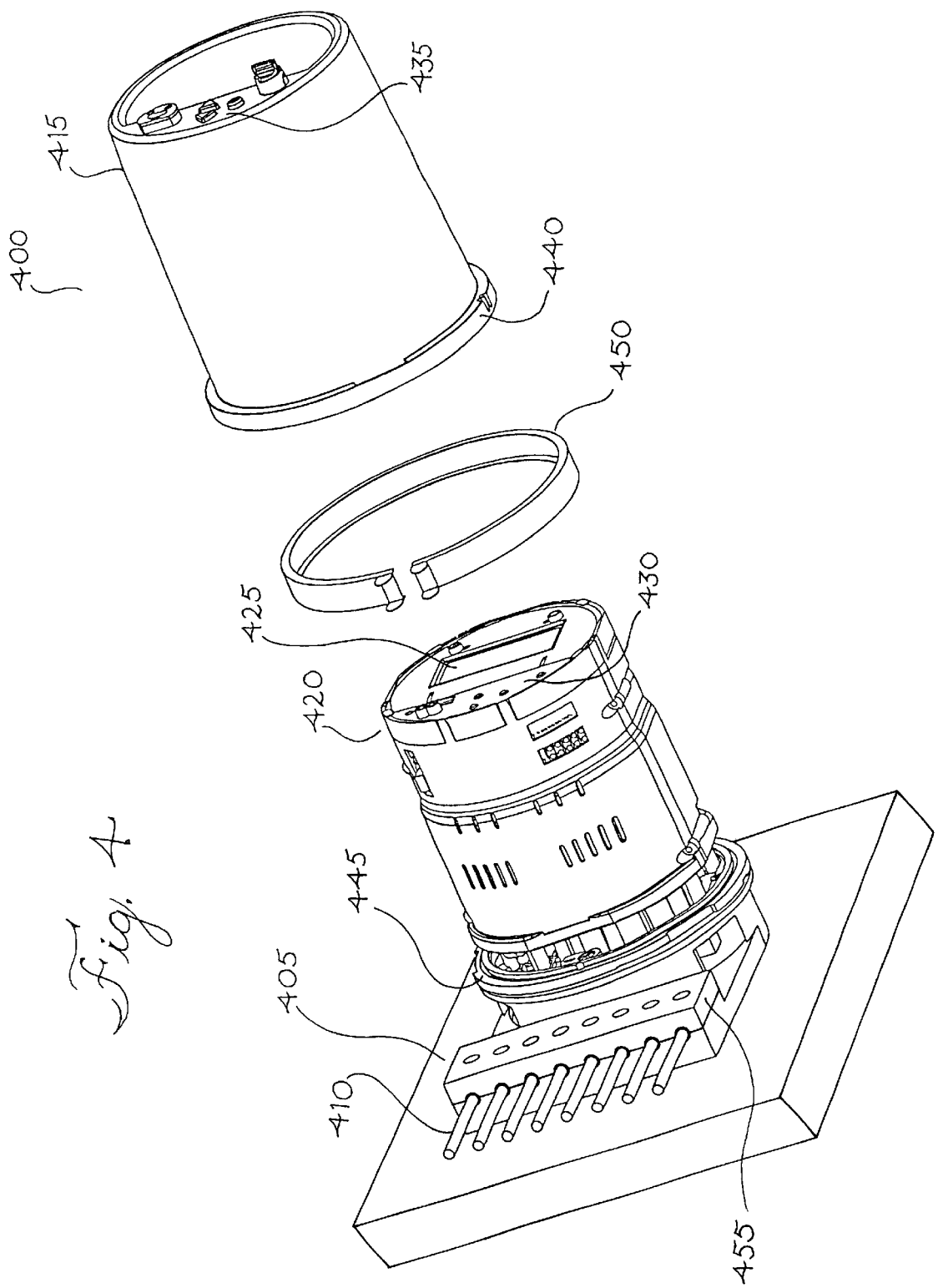
FIG. 4 depicts a perspective view of an exemplary A-Base revenue meter with bottom connected terminals for connecting the meter to an electrical circuit.

Referring now to FIG. 4, an A-base revenue meter 400 is shown. A-base meters feature bottom connected terminals 405 on the bottom side of the meter 400. These terminals 405 are typically screw terminals for receiving the conductors 410 of the electric circuit (not shown). A-base meters 400 further include a meter cover 415, meter electronics 420, a display 425 and input/output means 430. Further, the meter cover 415 includes an input/output interface 435. For more detail regarding the input/output means 430 and input/output interface 435, see the above referenced U.S. Pat. Applications entitled "REVENUE METER WITH GRAPHIC USER INTERFACE" and "A KEYPAD FOR A REVENUE METER". A-base meters 400 are directly connected to the electric circuit and can only be installed or removed by connecting or disconnecting the conductors 410 of the electric circuit. Typically, this means tightening or loosening each terminal 405 to secure or free the end of the conductor 410. A-base meters 400 have a cover 415 which encloses the meter electronics 420 and the display 425. The cover 415 has a sealing mechanism (not shown in this figure but see FIG. 2, Reference 140) which prevents unauthorized tampering with the meter electronics. Further, the base of the cover 415 also features a flange 440. The base of the meter 400 also features a flange 445. When the cover 415 is installed, the flanges 440 and 445 of the cover 415 and meter 400 can be sealed together with a sealing ring 450. An exemplary sealing ring 450 is the Screw Type Sealing Ring, Model 10-9090 manufactured by Ekstrom Industries, Inc., Farmington Hills, Mich. Typically, A-base meters also have a second cover 455 and sealing mechanism (not shown) which encloses the terminal connections 405. This cover 455 and sealing mechanism prevents unauthorized disconnection of the A-base meter 400 from the electric circuit. It is also known in the art to provide a single sealing mechanism (not shown) which seals both the meter cover 415 and the terminal cover 455. For the purposes of this disclosure, A-base meters also include S-base meters in combination with A-base adapters. An A-base adapter is a self-contained S-base to A-base converter which features bottom connected terminals interconnected to a detachable meter mounting device, such as a meter socket, for receiving an S-base meter. An exemplary A-base adapter is the Polyphase Transformer Rated A to S Adapter manufactured by Ekstrom Industries, Incorporated, Farmington Hills, Mich.

Figure 5:
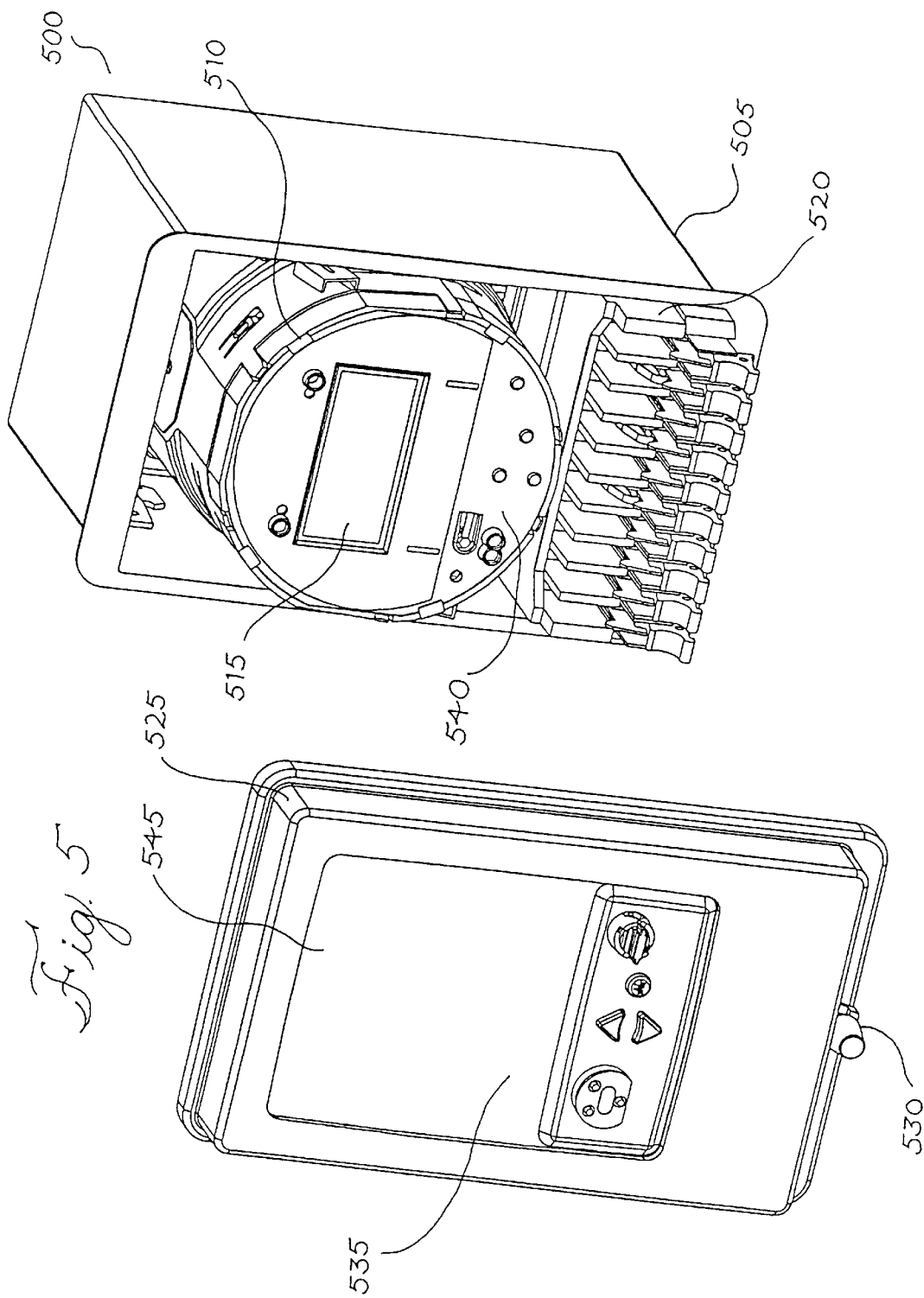
FIG. 5 depicts a perspective view of an exemplary switchboard revenue meter and meter cover.
Figure 6:
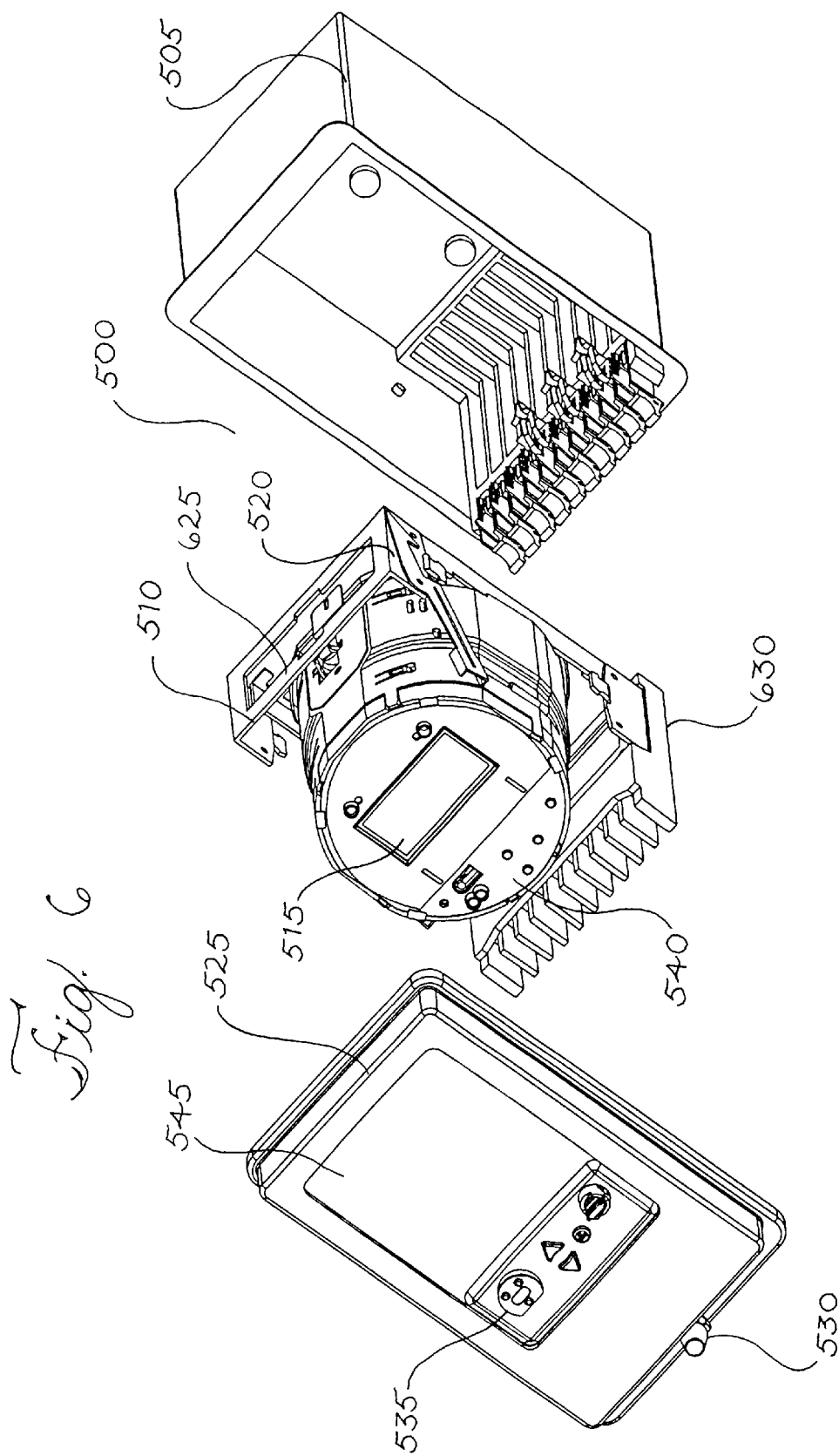
FIG. 6 depicts a perspective view of the exemplary switchboard revenue meter of FIG. 5 with the draw-out chassis removed.

Referring now to FIGS. 5 and 6, there is shown a Switchboard Revenue Meter 500. The Switchboard meter 500 consists of a switchboard enclosure 505 ("enclosure") which is physically mounted and connected to the electrical distribution system (not shown). Exemplary enclosures are the ABB FT-21 and ABB-FT-32 manufactured by ABB Electricity Metering, Raleigh, N.C. The revenue meter, which includes the meter electronics 510 and display 515, is mounted on a draw-out chassis 520 which is removable from the switchboard enclosure 505. The draw-out chassis 520 interconnects the meter electronics 510 with the electrical circuit. The draw-out chassis 520 contains electrical connections (See FIG. 6, Reference 625 and 630) on the top and bottom which mate with matching electrical connectors (not shown) inside the enclosure 505 when the chassis 520 is slid into place. The enclosure 520 also has a cover 525 which completely seals the meter electronics 510 inside the enclosure 520. The cover has a sealing mechanism 530 which prevents removal of the cover 525 and indicates when the cover 525 has been tampered with. The cover 525 further includes a sealed input/output interface 535 which interconnects with input/output means 540 of the meter electronics 510. For more detail regarding the input/output means 540 and input/output interface 535, see the above referenced U.S. Pat. Applications entitled "REVENUE METER WITH GRAPHIC USER INTERFACE" and "A KEYPAD FOR A REVENUE METER".

The relevant ANSI standards specify the exact physical and electrical requirements of the blade terminals for the S-base meters (See FIG. 3) and the bottom connected terminals for the A-base meters. Further, these standards also specify revenue metering requirements common to both S-base and A-base meters as well as Switchboard meters. These standards include accuracy, durability and operating lifetime requirements. They further include requirements for physically sealing the meters to prevent unauthorized tampering.

Referring again to FIGS. 1 through 6, revenue meters must provide sealing mechanisms 135, 140, 450, 455, 530 to both protect the meter from environmental conditions existing in the installed location as well as protect the meter from unauthorized tampering. Typically, A-base 400 and S-base 100 revenue meters are contained entirely within a housing which features a meter cover 120, 415 usually made of a transparent material. Typically, the enclosed components include the meter electronics 115, 420, voltage sensing circuits (not shown), current sensing circuits (not shown), the meter display 145, 425 and the user interface 150, 155, 430, 435 as specified by the ANSI standards. In typical applications, current transformers ("CT") and potential transformers ("PT" or voltage transformer ("VT")) are located remote from the revenue meter and connected with the meter's internal voltage and current sensors via the S-base or A-base connection in order to isolate dangerous high voltage signals from the meter. In the exemplary 8500 ION Revenue Meter, an auxiliary set of CT's is provided inside the meter to provide isolation. Potential (or Voltage) isolation in the exemplary 8500 ION Revenue Meter is accomplished with a network of resistors and op-amps. Further, it is well known in the art to provide revenue meters with external interface mechanisms such as telephony and network connections in order to enhance the meter's capabilities.

Referring back to FIGS. 5 and 6, switchboard meters 500 are typically contained within a switchboard enclosure 505. The switchboard enclosure 505 usually features a cover 525 with a transparent face 545 to allow the meter display 515 to be read and the user interface 535, 540 to be interacted with by the user. The cover 525 also has a sealing mechanism 530 to prevent unauthorized access similar to the S-base and A-base meters.

The transparent meter cover 120, 415, 525, 545 permits the viewing of the meter display 145, 425, 515 without having to remove the meter cover 120, 415, 525. Further, the meter cover 120, 415, 525 may also provide mechanisms 155, 435 535 for interacting with the meter cover 120, 415, 525 in place. Such mechanisms 155, 435 535 include scroll buttons, reset switches or other input devices, and optical couplers, infrared emitters or other output devices. All of these mechanisms are able to function with the meter cover 120, 415, 525 in place as specified in the ANSI standards. The meter cover 120, 415, 525 can be held in place by a separate sealing mechanism (See FIG. 2, Reference 140) which locks the cover 120, 415 to the meter 100, 400 and indicates when there has been unauthorized tampering with the cover 120, 415. Typically, however, the sealing mechanism 135, 450, 530 also serves to lock the meter 100, 400, 500 to the electrical circuit connection. As shown in FIG. 1, in the case of the S-base meter 100, the sealing mechanism 135 also seals the meter 100 to the meter socket 130. Removal of the meter 100 necessitates disengaging the sealing mechanism 135, which would indicate unauthorized tampering. As shown in FIG. 4, in the case of the A-base meter 400, the sealing mechanism 450 also seals a separate (possibly joined) terminal cover 455 which prevents disconnection of the conductors 410 from the terminals 405 without disengaging the sealing mechanism 450. It should be understood that separate sealing mechanisms can be provided to seal the meter cover 415 and seal the meter 400 to the electrical connection and that other methods of tamper detection and environmental protection are well known in the art.

Power quality events are aberrations in the normal delivery of electrical power to the consumer. Normal delivery of electrical power is defined to be sustained delivery of electrical power at the specified fundamental frequency with minimal undesired harmonic frequencies present. The delivered electrical power has a specified voltage and a current which oscillates sinusoidally within a specified range at the defined fundamental frequency. Aberrations in the normal delivery of electrical power can last from a few nanoseconds (or shorter duration) to hours or days. These aberrations include complete power failures, voltage sags or swells, transient events and the presence of undesired harmonic frequencies. It will be appreciated that other aberrations in the delivery of electrical power are known to occur to those skilled in the art. The disclosed embodiments are directed at performing revenue metering functions while simultaneously detecting aberrations in the normal delivery of electrical power to the consumer as well as surviving and recording these aberrations for later diagnosis.

Figure 7:
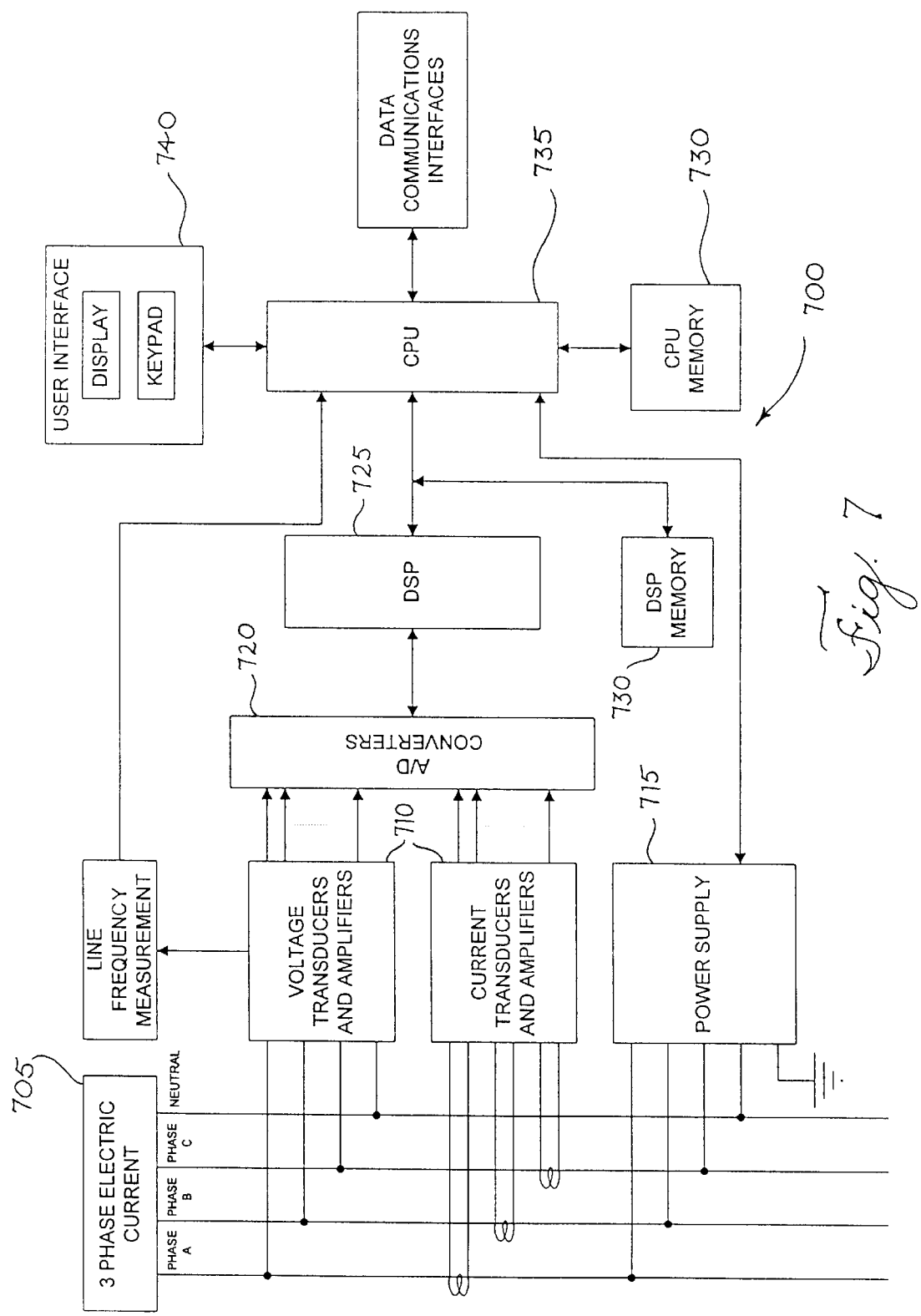
FIG. 7 depicts a block diagram of the power quality event detection, quantification and reporting hardware of the preferred embodiment revenue meter.

FIG. 7 shows a preferred embodiment of a revenue meter 700 which can detect, record and report power quality events. Logically, the preferred embodiment revenue meter is comprised of hardware and software. FIG. 7 shows a typical hardware configuration where the meter 700 is connected to a three phase electric circuit 705. The meter 700 includes transducers 710 which sense the current and voltage in each phase of the electric circuit 705 and a power supply 715 which supplies power for the meter electronics (described in more detail below). The transducers 710 are also connected to an analog to digital ("A/D") converter 720 which samples the current and voltage in each phase of the electric circuit 705. Note, as used herein, that the term A/D converter refers not only to a traditional A/D converters but also to a Time Division Multiplication ("TDM") based converter, or other converter which converts analog signals to digital signals. TDM is a method of measuring instantaneous power over a wide range of input voltages. TDM is accomplished by taking a snapshot of the waveform of the incoming electrical signal and converting it to a square wave over time using a known algorithm. The area of this square wave is then proportional to the power at the time the snapshot was acquired. The snapshot or sample time is dependent on processor speed. An exemplary implementation of TDM is the Quad4-Plus Electric Meter manufactured by Process Systems, A division of Siemens Power and Transmission & Distribution, LLC, located in Raleigh, N.C. which is described in the CD ROM specification for this product.

Referring back to FIG. 7, the digital output of the AID converter 720 is connected to a digital signal processor 725 ("DSP"). The DSP 725 is connected to memory 730 and to a central processing unit 735 ("CPU"). The DSP 725 in conjunction with the CPU 735 executes the power quality event detection and reporting algorithms as detailed below. Note that the preferred embodiment algorithms detailed below operate on samples as provide by the DSP 725 and CPU 735. These algorithms may operate on all samples provided or a subset of them. Typically, they operate utilizing 64 samples which represents ½ cycle. It will be appreciated however, that these computations can be performed with a greater or lesser number of samples (with the corresponding buffers adjusted accordingly), e.g. representing a quarter cycle or eighth of a cycle, down to a single sample. The processing power of the DSP 725 and CPU 735 is a limiting factor.

Continuing with FIG. 7, the CPU 735 is also connected to a user interface 740 which allows users to program the meter 700 or retrieve revenue or power quality data and generally interact with the meter 700. In the preferred embodiment, the user interface 740 includes a graphical display and a keypad as well as LED, infrared and optical interfaces. For more detail regarding the user interface 740, see the above referenced U.S. Pat. Applications entitled "REVENUE METER WITH GRAPHIC USER INTERFACE" and "A KEYPAD FOR A REVENUE METER". It will be appreciated by those skilled in the art that the power quality detection and reporting algorithms detailed herein can be executed by a variety of hardware configurations, all of which are known in the art.

Figure 8:
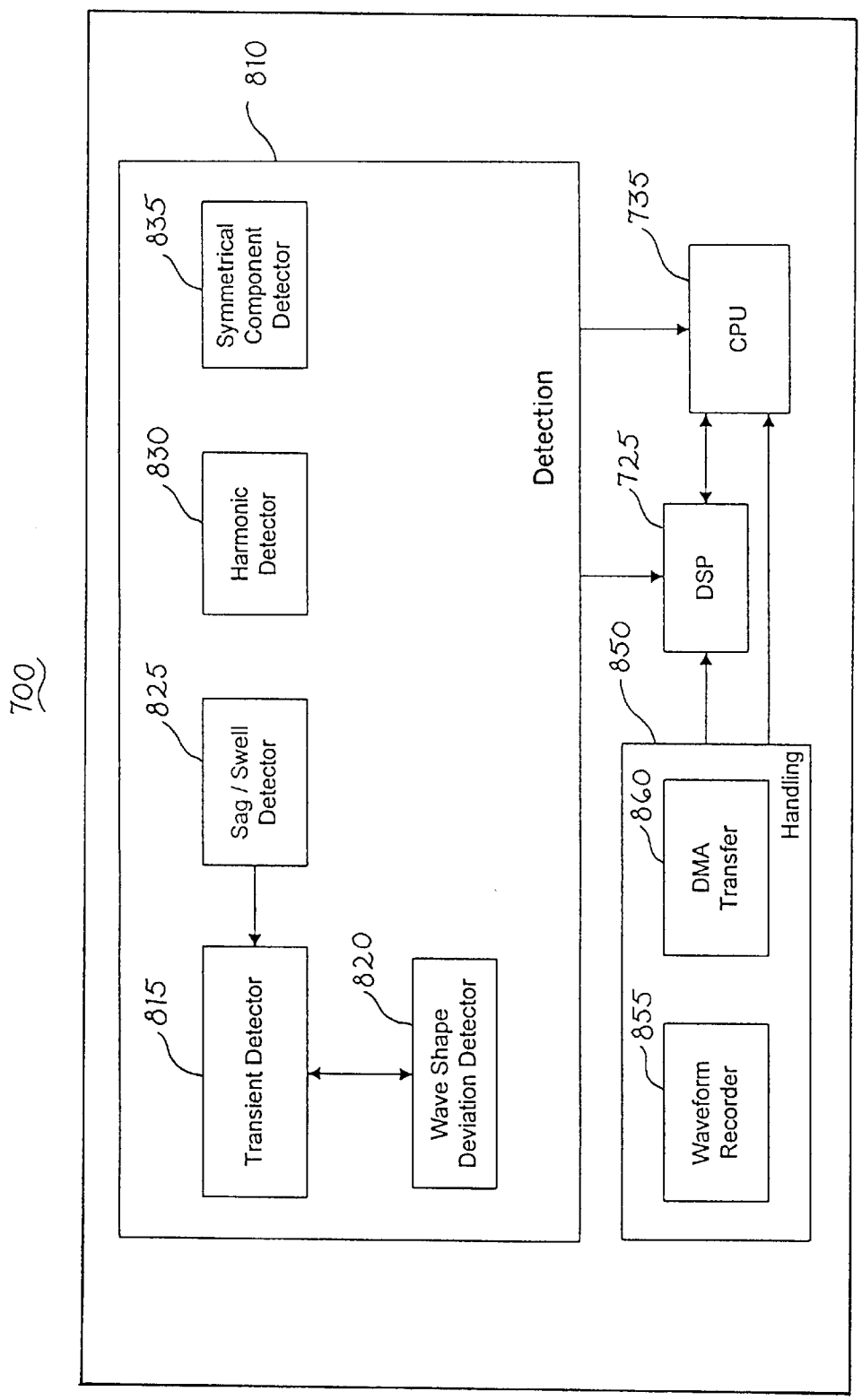
FIG. 8 depicts a block diagram of the power quality event detection, quantification and reporting software of the preferred embodiment revenue meter.
Figure 9:
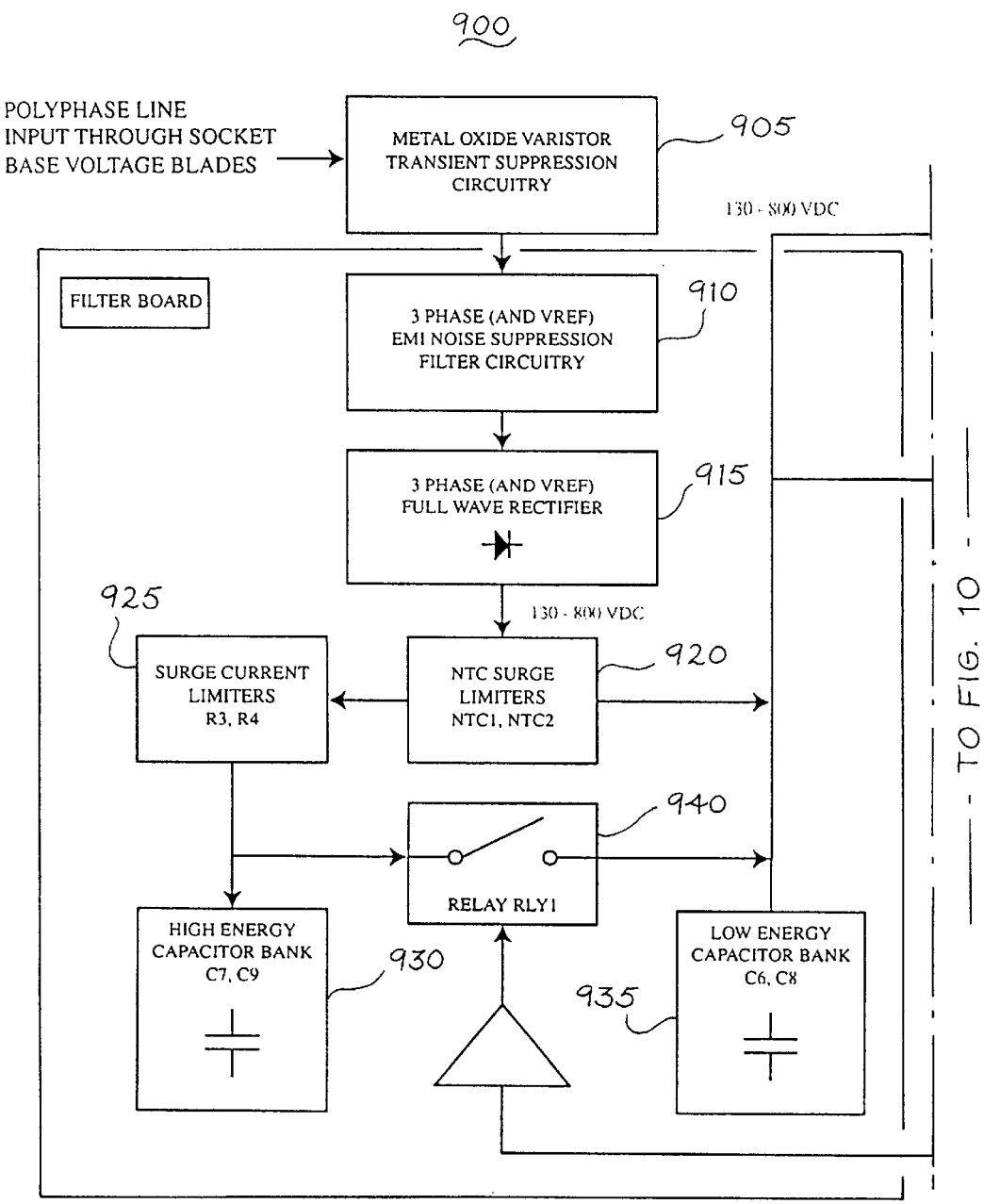
FIG. 9 depicts a block diagram of a preferred filter module of a power supply for use with the preferred embodiment revenue meter.
Figure 10:
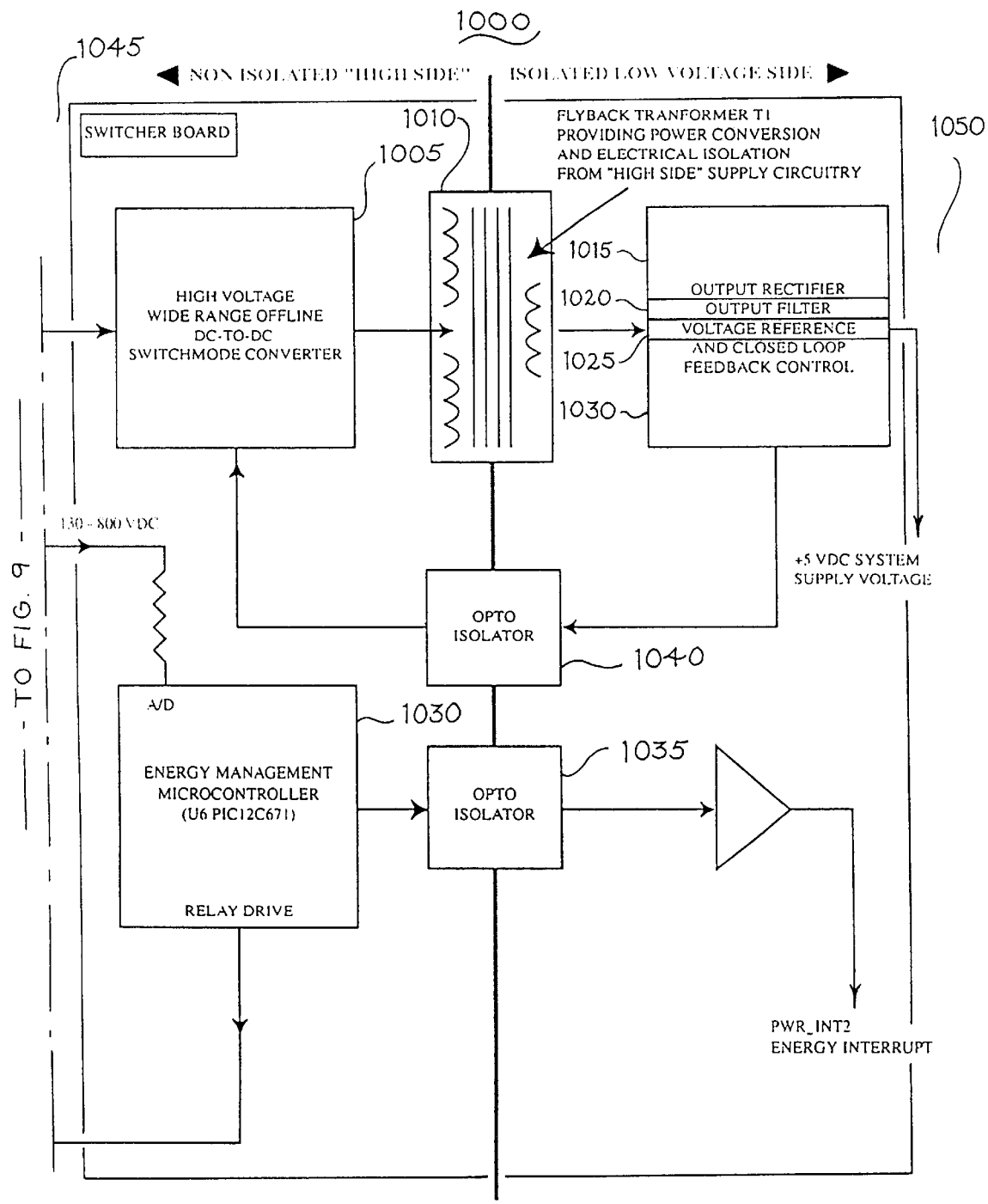
FIG. 10 depicts a block diagram of a preferred switcher module of a power supply for use with the preferred embodiment revenue meter.

FIG. 8 shows a block diagram depicting the power quality event detection 810 and reporting 820 software modules of the revenue meter 700. These modules, executed by the DSP 725 and CPU 735, provide the revenue meter 700 with the capability to detect, quantify, record, communicate and report power quality events. These modules include transient detection 815, wave shape deviation detection 820 (which is used by the transient detection algorithm 815), sag/swell detection 825, harmonic content detection 830 and symmetrical component detection 835.

The transient detection module 815 monitors the waveforms of all of the voltage phases of the electric circuit 705 for transient events. Should a transient event be detected, the transient detection module 815 determines its magnitude and duration. The wave shape deviation detection module 820 is used by the transient detection module 815. It predicts what the shape of the "normal" waveform should be and compares it to the actual waveform in real time. The sag/swell detection module 825 monitors the voltage inputs for disturbances. These disturbances typically appear as one or more of the inputs straying above a high limit or below a low limit. When a disturbance is detected, the module 825 provides information about the entire disturbance. The module 825 is also capable of breaking up the disturbance into discrete components (sub-disturbances) for more detailed analysis. The primary analysis performed is that of voltage quality monitoring. The harmonic content detection module 830 provides detailed harmonic calculations for voltage or current input. The symmetrical component detection module 835 provides information about unbalanced voltages and currents in a three phase power system. A more detailed description of these modules can be found in U.S. Pat. No. 5,650,936 which is herein incorporated by reference.

The reporting modules 850 include a waveform recorder 855 and a Direct Memory Access (DMA) control module 860. These software modules execute on the revenue meter hardware, sampling data, computing results and making those results available to the user. Each of the modules are user configurable and can be activated or deactivated depending on the needs of the user. Each module is discussed in detail below.

II. Power Supply and "Ride Thru"

In revenue metering, an important capability is to be able to monitor, record and quantify as much of a power quality event as possible. One problem, however, is that most revenue meters receive their operating power from the same electric circuit which they are monitoring. Therefore, it is important that the occurrence of a power quality event not impact the meter's performance. Maintaining meter performance during a power quality event is handled by the meter's power supply.

Referring back to FIG. 7, the power supply 715 is shown connected with the electric circuit 705. The power supply 715 supplies operating power to the revenue meter 700. However, as mentioned above, the power supply 715 is susceptible to the same power quality events that the meter 700 is designed to detect. The revenue meter 700 must be able to detect, quantify and report any power quality event, even those events which jeopardize the operating power of the meter itself. Therefore, the power supply 715 is also designed to provide short term isolation of the meter operation from the power quality event. This is known as "Ride-Thru" and enables the revenue meter 700 to continue to quantify and/or record and report the power quality event throughout the duration of the event and before losing operating power due to extended power quality events. Further, ride-thru capability permits the meter to ensure that critical power quality data is safely stored in non-volatile storage for later retrieval before the meter loses power and the data is lost.

Referring to FIGS. 9, 9A and 10, 10A, there is shown detailed block diagrams and schematics of the power supply of the preferred embodiment. The power supply is broken down into two modules, the switcher module 1000 and the filter module 900. The filter module 900, shown in block diagram form in FIG. 9 and schematic form in FIG. 9A, includes metal oxide varistor transient suppression circuitry 905, three-phase (and Vref) EMI noise suppression filter circuitry 910, a three-phase (and Vref) full wave rectifier 915, Negative Temperature Coefficient (NTC) surge limiters 920, surge current limiters 925, a high energy capacitor bank 930, a low energy capacitor bank 935 and a relay 940. The switcher module 1000, shown in block diagram form in FIG. 10 and in schematic form in FIG. 10A, includes a high voltage wide range offline dc to dc switchmode converter 1005, a flyback transformer 1010, an output rectifier 1015, an output filter 1020, a voltage reference 1025 and a closed loop feedback control 1030, an energy management microcontroller 1035 and opto-isolators 1040 and 1045.

The revenue meter power supply provides a regulated and isolated dc supply voltage (+5V, up to 15 watts) that meets the energy requirements of the meter electronics. The power supply also functions to provide constant output voltage under abnormal input line conditions. An "abnormal" condition would include individual phase loss, line sags or swells, and limited-duration total (all three phases) loss of power or the occurrence of other power quality events. As described in more detail below, the ability to provide limited-time regulated output during a total power loss is made possible by the use of energy storage capacitors in combination with an onboard micro-controller based energy management system.

The power supply of the preferred embodiment includes a very wide operating range true three phase power supply. This permits the meter to operate with different input voltage conditions without necessitating different hardware. This allows a utility to stock fewer meter types in their inventory. Exemplary voltage inputs include three phase 120–277 Vrms +/−20% (for a 4 wire Wye 9S connection) or 120–480 Vrms (for a three wire Delta 5S or 35S connection). Wye is a defined wiring system for three phase power where four power carrying conductors are used, one of which is a neutral conductor. Delta is a defined wiring system for three phase power utilizing three power carrying conductors. Either wiring system can include an extra safety ground conductor. Continuing with the power supply, multiphase operation also effectively reduces the power consumption of the meter by equally dividing the meter power requirements between each phase. In addition, true three phase operation provides the ability for the meter to continue normal operation with two out of three input phase loss (single phase operation) in a four wire Wye configuration and the loss of a single phase in a three wire delta configuration.

Extended ride thru capability is provided through an internal high voltage capacitive energy store. This allows post event power quality measurement for a minimum of six cycles (100 ms) after complete power line loss. This also prevents a reset of the meter during power line disturbances.

The unique ride thru capability of the power supply, combined with an on-board energy management microcontroller, makes possible the effective use of inexpensive, high capacity, non-volatile flash memory to implement the meter's file system. The power supply provides power failure indication and sufficient ride thru time so that the flash based file system may be properly maintained and updated during power down events. The use of flash memory results in a significant cost savings on a cost/megabyte basis when compared with alternative volatile battery backed static random access memory. Flash memory does not require a power source for data retention.

As mentioned above, the power supply is divided into two circuit boards or modules; the filter board 900 and the switcher board 1000. Referring back to FIG. 9 and 9A, the filter board 900 provides line filtering, three phase rectification and energy storage via high voltage electrolytic capacitors. The filter board is connected directly to the meter base voltage input terminals through an interconnecting cable assembly. Referring back to FIGS. 10 and 10A, the switcher board 1000 provides high voltage, wide range, isolated power conversion combined with micro-controller based energy management functions. The switcher board 1000 is connected to the filter board 900 via an interconnecting cable 1045 which supplies power to the flyback topology switcher circuitry. The switcher board 1000 is directly plugged into the main CPU backplane circuit board via a multi-pin connector 1050.

Referring back to FIGS. 9 and 9A, the filter board 900 accepts three phase voltage input plus neutral (Vref) and safety ground inputs. The input voltage range for three phase voltage is 120–277 Vrms L-N +/−20% for a 4 wire Wye 9S connection or 120–480 Vrms L-L for a three wire delta connection. Capacitors C1–C5 and C14–C19 combined with inductors L1–L8 form a common and differential mode multi-phase line filter. Conducted noise originating from the switching power supply is attenuated via the conducted path and external noise sources/transients are effectively reduced from entering the meter electronics. A high degree of filtering is required to eliminate self-generated conducted noise from polluting the meter's own voltage input lines which serve both the supply and measurement functions. Further, the high voltage diode array D1–D8 is arranged in the known three phase full wave bridge configuration. Diodes D4 and D8 are normally not conducting (no neutral current) unless a phase imbalance exists which can be the case when a phase is lost during a power quality event.

The energy reservoir capacitor bank 930 and 935 (C6–C9) combines conventional switch mode dc ripple filtering functionality together with energy storage for short term operation of the power supply during line loss events. This energy storage is divided between a low energy capacitor bank 935 (C6, C8) and a high energy capacitor bank 930 (C7, C9). Energy (measured in Joules) stored in each capacitor bank is a function of input voltage and capacitance as given by the formula:

$$E = \frac{1}{2} * C * V^2$$

The low energy capacitor bank 935 (C6, C8) has a total capacitance of 50 micro-farads ("$\mu F$") and under high voltage conditions (approximately 800 Vdc), provides a peak energy storage of 16 Joules. The high energy capacitor bank 930 (C7, C9) has a total capacitance of 195 $\mu F$, and under high voltage conditions (approximately 800 Vdc) provides a peak energy storage of 62.4 Joules. The capacitors of each bank are arranged in a series combination to achieve a high voltage rating capable of withstanding from 130 Vdc to 800 Vdc, depending on AC input line levels and phase relationships. Bleeder resistors R1–R4 equalize voltage imbalances across the series connected capacitor banks in addition to the removal or bleeding of hazardous voltages at power down.

The division of energy storage into two separate high and low energy capacitor banks 930 and 935 is fundamental to the successful operation of the revenue meter, particularly when the meter is being powered by the end user in calibration test fixtures as is typically done in utility company meter shops. Calibration test equipment is periodically used in end user service and verification roles for confirmation of revenue meter performance. These calibration test fixtures typically produce digitally synthesized three phase output voltage and current waveforms for both powering the meter and providing the highly stable waveforms required for meter performance verification. The output voltage amplifiers in these test fixtures invariably suffer from overload when called on to supply the transient energy demand of a modem revenue meter, particularly when the meter incorporates a modem switch-mode power supply combined with large value energy storage capacitors. This transient or surge overload prevents current technology calibration test fixtures from powering a modem, high performance revenue meter, particularly at higher line voltages (such as 277 Vrms three phase). The problem is amplified by the fact that the majority of calibration test fixtures in the field were designed over 20 years ago when revenue meter internal energy requirements were much less demanding. Full backwards compatibility with traditional calibration equipment is a requirement of power utilities.

Referring back to FIGS. 10 and 10A, the switcher board 1000 receives high voltage DC input from the filter board 900. The supplied high voltage DC ranges in value from approximately 130 to 800 Vdc. This represents a more than 6:1 voltage change which is typically beyond the range of standard switching supplies. A discontinuous mode flyback converter is employed that operates beyond its traditional input voltage range of 3:1 without affecting the reliability of operation. This is done by changing its mode of operation with changes in input voltage and through the use of power MOSFETS with breakdown voltages of 1200 volts. The flyback transformer 1010 is specially constructed to meet the combined demands of small size and high voltage isolation capability. The high isolation voltages required of a multiphase, 277 Vrms L-N or 480 Vrms L-L offline switching supply places a particularly heavy demand on the supply flyback transformer. The transformer 1010 is wound on an industry standard, low cost ETD-29 bobbin using Phillips 3C85 magnetic material. A triple insulated Furukawa TEX-E wire is used for the secondary transformer windings. This provides a superior isolation barrier in excess of 5000 Vrms. The topology used in the power supply of the preferred embodiment revenue meter is based on Motorola Application Note AN1327 (herein incorporated by reference), with application specific modifications detailed below. The application note fully describes the operation of the power supply.

The power supply is based on a high performance current mode pulse width modulation (PWM) integrated circuit (IC). An exemplary PWM IC is the UC2844 IC, manufactured by Motorola, Schaumburg, Ill., although it will be apparent to those skilled in the art that any UC2844 PWM IC will work such as those manufactured by Linfinity, Inc., or Unitrode, Inc. Conventional "bootstrap" operation of this IC simply requires a resistive connection to the high voltage DC input. This provides a minimum current (approximately 0.05 mA) which results in a Vcc voltage increase to the operating voltage of the IC. The minimum DC input voltage, combined with the minimum startup current (0.5 mA) essentially fixes the bootstrap resistor chain value. Under high line conditions (+800 Vdc) the resistive power dissipation becomes excessive, especially in the confined and airtight housing of a revenue meter. To minimize internal self heating, an active "bootstrap" or "startup" approach is taken.

A high voltage MOSFET is biased at startup. After startup, the auxiliary winding of the flyback transformer produces a voltage which is rectified by a diode and regulated by a linear regulator producing +12 Vdc Vaux. The application of Vaux biases a transistor "on" which effectively turns another high voltage MOSFET "off". The startup resistor chain is effectively removed from the high voltage DC supply which eliminates any additional long term power dissipation. Continued operation of the PWM IC is provided by the application of +12 Vdc Vaux through a forward biased diode.

A single chip micro-controller 1030 provides energy management by monitoring, in real time, the high voltage input to the switcher board. In the power supply of the preferred embodiment, the micro-controller 1030 is a PIC12C671, manufactured by Microchip, Inc. located in Chandler, Ariz. The measured voltage level effectively indicates the amount of energy stored in the input capacitor bank located on the filter board. The micro-controller 1030 also manages the delayed charging capacitor bank energy storage scheme. Unique to this power supply is that the micro-controller 1030 operates on the "high side" or non-isolated side of the supply. Signaling between the micro-controller 1030 and the main CPU backplane is accomplished via opto-isolators 1035 across the isolation barrier. This simplifies the accurate measurement of the capacitor bank voltage since the capacitor bank is also on the supply "high side".

A regulator IC provides +5 Vdc for the micro-controller 1030 IC. A voltage monitor IC provides the system-reset signal to the micro-controller 1030 IC. High Voltage dc, ranging from +130–800 Vdc is applied to a series voltage divider resistor string. The output of the divider ranges to a maximum of +5.0 Vdc and is applied to an A/D input on the micro-controller IC. The control algorithm executed by the micro-controller is straight forward. The high voltage dc input voltage is continuously digitized, with an 8 bit resolution, at a 1 ms rate. The digital value is compared to a hysteresis threshold window consisting of an upper and lower trigger point every 1 ms. If the high voltage average DC level drops below the lower trip point value, then port pin 6 of the micro-controller IC is asserted high. A transistor switch turns on an opto-isolator which in turn produces an active low interrupt signal to the CPU via the connector. This interrupt is de-asserted when the high voltage average DC level is greater than the upper trigger point.

When the supply AC input power fails (loss of line voltage), the high voltage DC level from the capacitor filter bank 930 and 935 decreases at a rate controlled by the meter power consumption. The meter continues to operate normally, with all aspects of power quality measurement continuing unabated. When the high voltage DC capacitor bank 930 and 935 voltage falls below the lower trigger point (120 Vdc), the meter's CPU is immediately interrupted with the highest priority interrupt. All operation is suspended, non-critical peripheral devices are powered down, and power quality data is written to the flash memory followed by the meter being placed in low power sleep mode. A general meter reset occurs with the return of +5.0 Vdc supply on re-application of input AC power. The meter may also be reset if, on entering sleep mode, the input AC power returns before there is a general loss of +5.0 Vdc supply. In this case, a hardware watchdog timer will reset the meter after approximately 0.5 seconds since the watchdog timer is not being serviced by the sleeping CPU.

The lower trigger point (120 Vdc) is selected to provide sufficient time for the meter operating system to suspend operation and write critical power quality data to the flash memory before the loss of the main supply voltage. The upper trigger point (130 Vdc) is selected to provide a hysteresis window in order to prevent inadvertent assertion of the interrupt signal due to system noise.

Operation of power supply in the preferred embodiment is as follows. On initial application of power, the capacitor isolation relay 940 (RLY1) is open and the high energy bank 930 (C7, C9) is charged over a 5 second period up to the maximum operation voltage through resistors R5 and R6. The 5 second time constant effectively limits the peak power surge (Peak Energy/5 seconds) required to charge the high energy capacitor bank 930 to levels acceptable by traditional calibration test fixtures. The low energy capacitor bank 935 (C6, C8) is charged rapidly, with a time constant and surge current limiting action provided by Negative Temperature Coefficient Thermistor ("NTC") current limiters 920 (NTC1 and NTC2). The peak power required by the low energy capacitor bank 935 during charging is limited by the NTC surge resistance and the fact that the low energy bank 935 capacitance is significantly lower than the high energy bank 930. After a five second delay, the micro-controller 1030 on the switcher board activates relay 940 (RLY1) which connects the low and high energy capacitor banks 930 and 935 in parallel. The high and low energy capacitor banks 930 and 935 are effectively combined and at this point in time the power supply is now able to provide the required ride thru time through the combined bank energy storage. An advantage to this switching scheme is that, on initial power up, the low energy capacitor bank 935 is rapidly charged and the power supply operating voltage (+5 Vdc) is available in less than 200 ms. The main meter can therefore begin the code booting sequence with full operation commencing after the 5 second charging delay.

The large combined capacitance value (245 uF) provided by the combined capacitor banks 930 and 935, once charged after the 5 second delay, serves as a temporary energy storage reservoir in the event of a power loss. This equates to approximately 6 cycles or 100 ms additional operating time at low line (96 Vrms, 60 Hz) and single phase worst case conditions (see the equation for energy stored above). For high line (277 Vrms) three phase normal operation, the operating time from power failure can be as high as approximately 15 seconds. The exact time period is a function of meter power consumption and varies depending on installed hardware options.

In addition, detailed schematics of the power supply of the preferred embodiment are included herein as microfiche appendix B.

III. Power Quality Event Detection a. Transient Detection

The transient detection module monitors the waveforms for all of the voltage phases of the electric circuit. Upon detection of a transient event, the module will determine its magnitude and duration. A transient is a momentary variation in the voltage and/or current, which ultimately disappears. Transients encompass spikes, sags, swells, blackouts, noise as well as other momentary fluctuations in the delivered electrical energy. Note that while sags and swells are considered transient events, they typically last longer than one cycle and therefore, in the preferred embodiment, detection of these events are handled by a separate algorithm. A transient usually lasts for less than one cycle or 16 ms. It is very important to be able to detect and report transient events while providing revenue accurate energy and power measurements.

Figure 11:
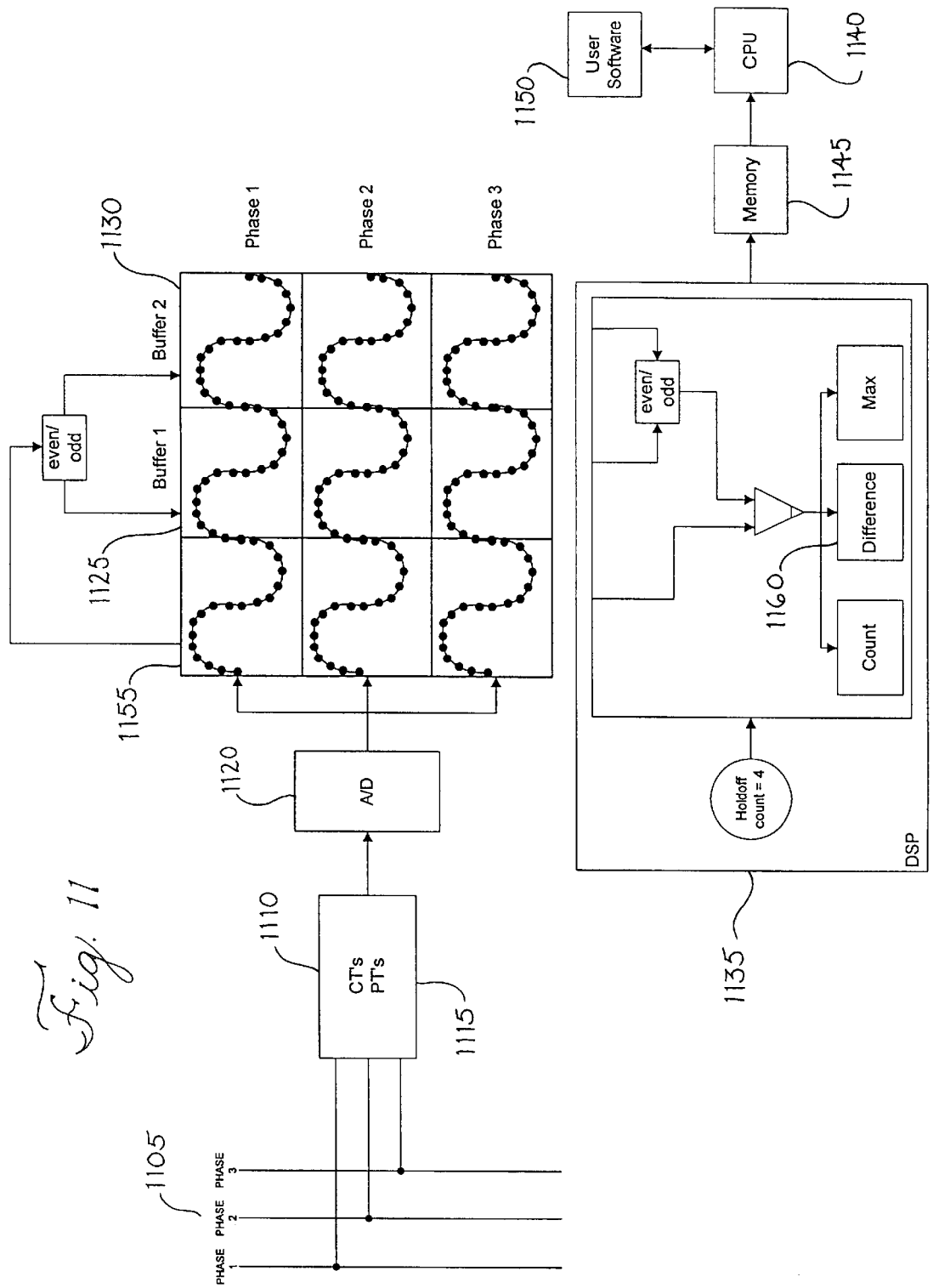
FIG. 11 depicts a preferred embodiment revenue meter for detecting transient events.

In the preferred embodiment, transient detection is broken down into two parts. The digital signal processor ("DSP") side and the central processing unit ("CPU") side. Referring now to FIG. 11, there is shown a preferred embodiment of a revenue meter 1100 for detecting transient events from a three phase electric circuit 1105. The revenue meter includes current transducers 1110 ("CT") and voltage transducers 1115 ("PT") coupled with the electric circuit 1105 and an analog to digital ("A/D") converter 1120 for sampling the voltage and current from each phase of the electric circuit 1105 and converting them to digital samples. Two reference buffers 1125 and 1130 for each phase, described in more detail below, are further provided to hold digital samples for comparison. The revenue meter also includes a DSP 1135 and a CPU 1140 as well as memory 1145 and a user interface 1150. The DSP 1135 executes the transient detection algorithms as described below and supplies the results to the CPU 1140. The CPU 1140 then supplies the results to the user via the user interface 1150. An exemplary DSP 1135 is the TMS 320C203 manufactured by Texas Instruments, Inc., located in Dallas, Tex. An exemplary CPU 1140 is the Power PC MPC821, manufactured by Motorola, Inc., located in Schaumburg, Ill.

The DSP 1135 samples voltages from the overvoltage gain stage which is connected to the electric circuit 1105 and transients are detected using the algorithm detailed below. In the exemplary revenue meter 1100, the overvoltage range for the overvoltage gain stage is 1000V or greater. Alternatively, other voltage ranges can be used as well. The DSP samples the voltage at a rate of 128 samples per cycle to achieve a 130 micro-second resolution at 60 Hz. It is preferable that the sampling frequencies range from 18–72 Hz and more preferable that the sampling frequencies range from 20–70 Hz. It will be appreciated that sampling rates as low as 32 samples per cycle can also be used. The results of the algorithm are passed to the CPU 1140 via direct memory access. Alternatively, other methods of sharing data between the CPU 1140 and DSP 1135 can also be used. The CPU 1140 manages and stores the results for later user access.

The transient detection algorithms also prevent duplicative results when sag or swell events occur. This is because when a sag or swell occurs, sometimes it will not be detected as a sag or swell until the second cycle of the event. By this time, however, a transient, in the first cycle of the sag or swell, would have already been detected. To prevent duplicative reporting of both a transient and a sag or swell, the transient detection algorithm does not report the transient immediately. The algorithm will wait for the next cycle of samples and report based on the aggregate results of the two cycles. The sag and swell detection algorithm can utilize this reporting delay to suppress reporting of the transient once it detects a sag or swell occurring.

Referring now more specifically to FIG. 11, there is shown a block diagram depicting the transient detection mechanism. The A/D converter 1120 samples voltages from each phase of the electric circuit 1105 via the current and voltage transducers 1110 and 1115. The voltages are converted to digital samples and stored in a current cycle buffer 1155 on the DSP 1135. According to the algorithms detailed below and in the Figures, the DSP compares the samples stored in the current cycle buffer with the samples stored in the reference buffers 1125 and 1130. There are two reference buffers, an even buffer 1125 and an odd buffer 1130. Depending on whether the current cycle is even or odd, the DSP compares the current cycle with the contents of the proper reference buffer. Differences between the reference sample and current sample are stored in a difference buffer 1160.

Figure 12:
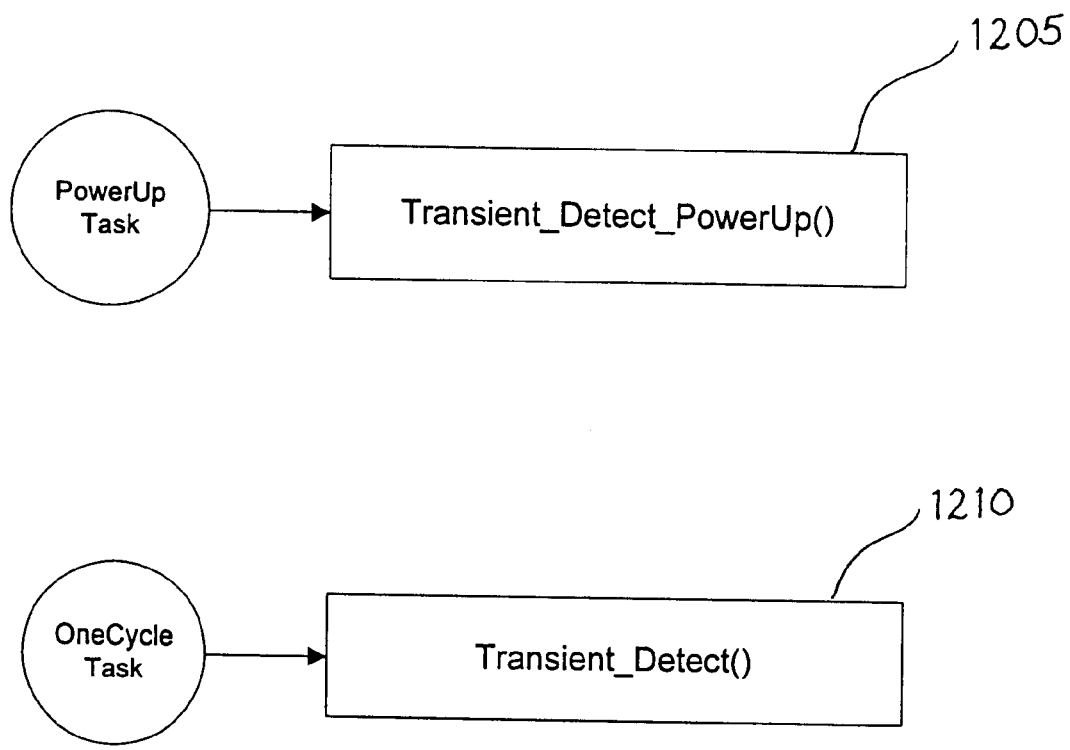
FIG. 12 shows a block diagram depicting the transient detection module of the preferred embodiment revenue meter.
Figure 13:
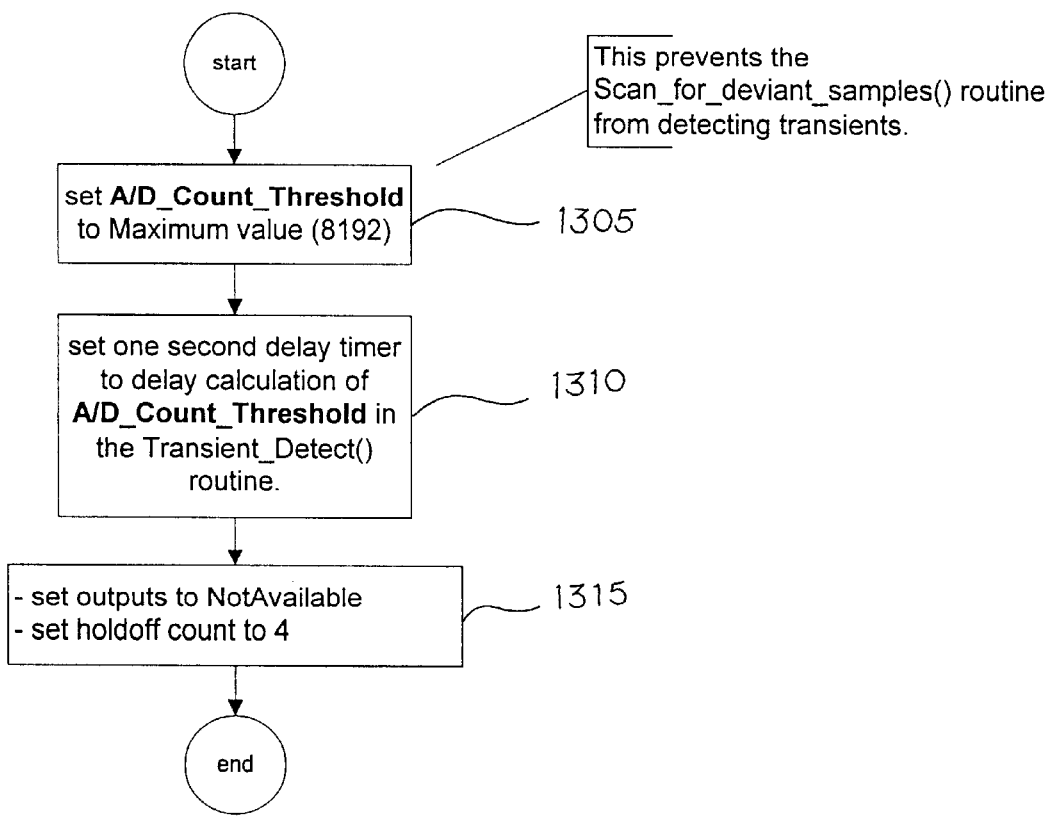
FIG. 13 shows a block diagram depicting the Transient_Detect_PowerUp routine of the transient detection module of FIG. 12.
Figure 14:
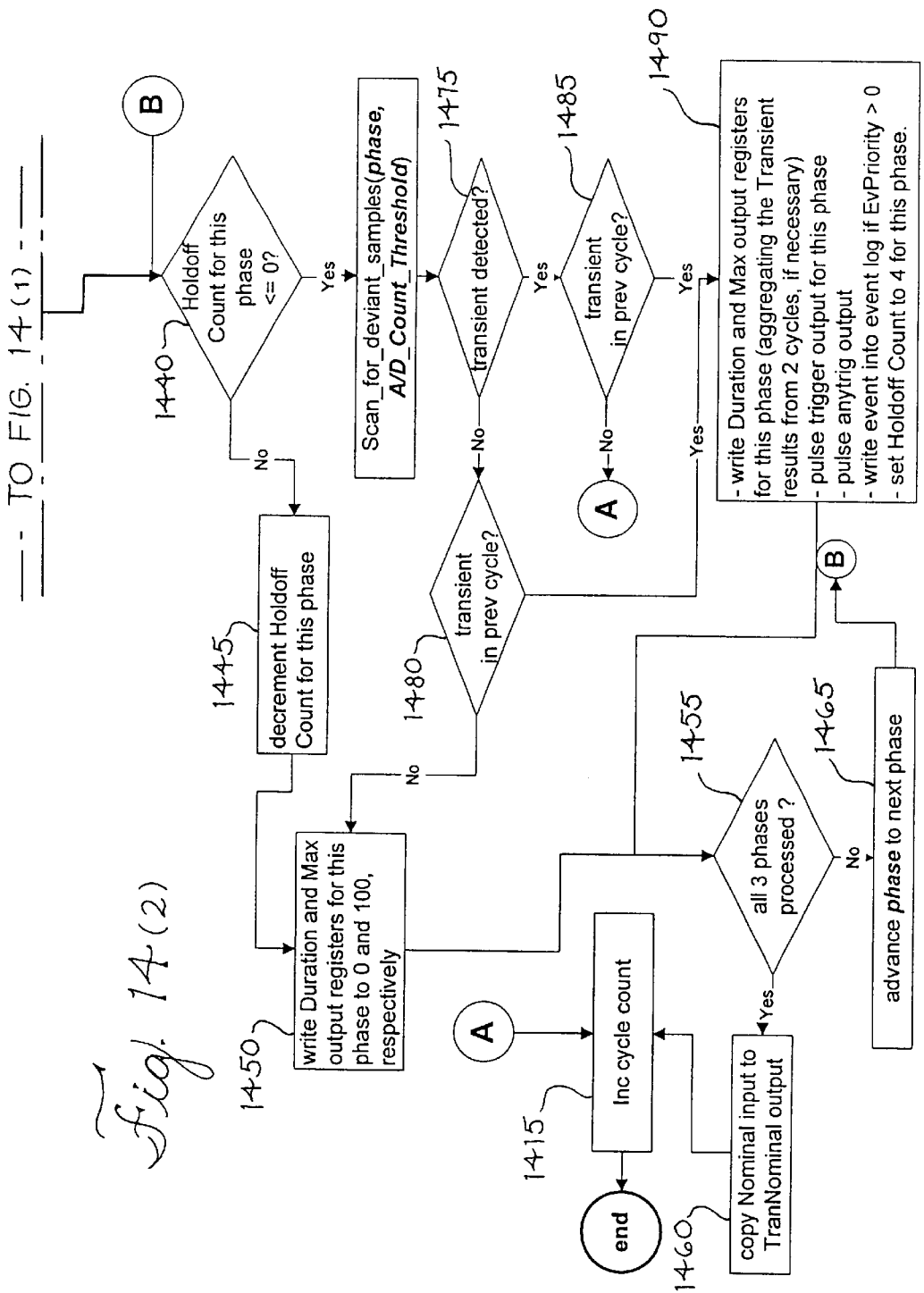
FIG. 14 shows a block diagram depicting the Transient_Detect routine of the transient detection module of FIG. 12.

FIGS. 12 through 14 detail the algorithm used by the preferred embodiment to detect transient events. FIG. 12 shows a top level view of the algorithm as broken up into a power up routine (Block 1205) and a one cycle transient detection task (Block 1210) which executes every one cycle. It will be appreciated that the transient detection task can execute at other intervals. FIG. 13 shows the blocks executed by the meter when power is first applied. First, the A/D_Count_Threshold is set to the maximum value (Block 1305). During execution of the transient detection algorithm, this value is calculated dynamically (as detailed below) and will be used to compare with samples from the electric circuit to determine if a transient has occurred. Initially, this value is set to the maximum to prevent the detection mechanism from detecting transients during this power up phase. Next, a one second delay timer is set to delay calculation of the A/D_Count_Threshold value (Block 1310). Finally, the algorithm outputs are set to a not_available state and the holdoff counter is initialized to four (Block 1315). The holdoff counter is used to prevent duplicative reporting of transient events due to transient echoes as detailed below. Transient echoes are defined as the condition where the reference samples/buffers (see below) contain a transient that has already been reported.

Referring once again to FIG. 12, once the power up routine (Block 1205) is complete, the meter will begin executing the transient detection algorithm (Block 1210). In the preferred embodiment, the transient detection algorithm is executed on every cycle. Alternatively, the algorithm can be executed according to a longer or shorter interval.

FIG. 14 shows the details of the transient detection algorithm which is executed on every cycle. It is first determined if the transient detection algorithm is enabled (Block 1405). If it is not enabled then the hold off counter for all phases of the power input is initialized and the output registers are set to a "not available" state (Block 1410). The holdoff counter is used to prevent duplicative reporting of transient events from the detection of transient echoes and the back ends of sag and swell events. The hold off counter is a count down timer which prevents detection of transient events during the count down period. In the preferred embodiment, the hold off time period is set to 4 cycles although it will be appreciated by those skilled in the art that a longer or shorter duration can be used. Finally, a cycle counter is incremented (Block 1415) and the routine ends for the current cycle. The cycle counter is used by the sample comparison routine to determine whether this is a even or odd cycle, as described in more detail below.

If the transient detection module is enabled, it is next determined whether there is nominal voltage input available (Block 1420). If there is no nominal voltage input, the routine sets the output registers to the unavailable state, sets the hold off counter to four cycles for all phases, increments the cycle counter and the routine ends for the current cycle (Blocks 1410, 1415). If the nominal voltage input is available or non-zero, the routine checks to see if it has been at least one second since the A/D_Count_Threshold ("threshold") has been calculated (Block 1425). The threshold is used to compare with the sampled voltage values to determine whether a transient is occurring. This threshold is computed dynamically every 1 second. Alternatively, longer or shorter delays can be used for re-computing the threshold. If it has been one second since the last threshold calculation, the threshold is re-calculated according to the following formula (Block 1430):

A/D_Count_Threshold=Transient Module Threshold %*Normal_A/D_Peak

Where Normal_AID_Peak=Nominal_A/D_Peak*(PT Secondary/Meter Input Voltage)/(nominal voltage/PT Primary)

Transient Module Threshold %: The amount that the voltage can deviate from normal before a transient is reported. This value is expressed as a percentage of nominal voltage.

Normal_A/D_peak: The analog to digital ("A/D") converter value for the peak sample of the voltage waveforms that would occur when the voltage waveform is purely sinusoidal with a magnitude equal to the nominal voltage.

Nominal A/D_peak: The A/D converter value for the peak sample of a sinusoidal voltage input that is applied at the rated meter input voltage. This value is preferably equal to 4095.

Meter Input Voltage: The rated maximum voltage that can be applied at the voltage terminals.

Nominal Voltage: The nominal operating voltage in the power system (i.e., the AC power line voltage).

PT Secondary: The voltage rating on the Potential Transformer secondary winding.

PT Primary: The voltage rating on the Potential Transformer primary winding.

Once the threshold is calculated, or if it has not yet been 1 second since the last threshold computation, the routine sets the phase to be examined for a transient event to phase A (Block 1435). The blocks following this block will be repeated for each phase of the electric circuit being monitored. It is then determined whether or not the holdoff counter for this particular phase is less than or equal to zero (i.e., has counted down 4 cycles) (Block 1440). If the hold off counter for this phase is not less than zero, the holdoff counter is decremented (Block 1445), the Duration output register is set to 0 and the Max output register is set to 100 for this phase (Block 1450). This avoids reporting transient echoes. If all three phases have been processed at this point (Block 1455), the Nominal output is copied to the Tran-Nominal Output (Block 1460), the cycle count is incremented (Block 1415) and the routine ends for the current cycle. The cycle count is used to control which reference buffer will be used in the waveshape deviation routine (See below). If all of the phases have not yet been processed (Block 1455), the routine advances to the next phase (Block 1465) and returns to check the holdoff counter for this next phase.

If the holdoff counter for the current phase undergoing analysis is less than or equal to zero (Block 1440), then the routine checks to see if there is a transient present by executing the Scan_For_Deviant_Samples algorithm (Described in more detail below) (Block 1470). If a transient is not detected in the current cycle (Block 1475), it is determined whether or not a transient occurred in the previous cycle (Block 1480). If there was no transient in the previous cycle, then the Duration output register is set to 0 and the Max output register is set to 100 for this phase (Block 1450). This indicates that no transient is present. If all three phases have been processed at this point (Block 1455), the Nominal output is copied to the TranNominal Output (Block 1460), the cycle count is incremented (Block 1415) and the routine ends for the current cycle. At this point, all three phases have been checked for transients for the current cycle. If all of the phases have not yet been processed, the routine advances to the next phase and returns to check the holdoff counter for this next phase. If a transient is detected in the current cycle and there was no transient in the previous cycle (Block 1485), the cycle count is incremented (Block 1415) and the routine ends for the current cycle.

Whether or not there is a transient in the current cycle, if there was a transient in the previous cycle (Block 1485), the Duration and Max output registers for the current phase under analysis are written, aggregating the results of the current and prior cycle if necessary. The trigger output for this phase is pulsed and the Anytrig output is pulsed. This triggers the waveform recorder and the data recorder to store transient information if any phase has a transient. Further, the event is written into the event log if EvPriority is greater than zero. EvPriority is a value set by the user and is used to control the reporting of transients based on the severity of the transient. This variable has a range from 0–255 where a value of zero will suppress transient reporting. Alternatively, other value ranges can be used and other values can be used to indicate transient reporting suppression.

Finally, the holdoff counter for this phase is reset back to 4 (Block 1490). If all three phases have been processed (Block 1455), the Nominal output is copied to the Tran-Nominal Output (Block 1460), the cycle count is incremented (Block 1415) and the routine ends for the current cycle. At this point, all three phases have been checked for transients for the current cycle. If all of the phases have not yet been processed (Block 1455), the routine advances to the next phase (Block 1465) and returns to check the holdoff counter for this next phase.

As can be seen from the algorithm, transients are detected on each phase within a window of one cycle. Further, transient reporting is delayed by one cycle. This prevents duplicative reporting of transient events due to sags and swells as well as transient echoes by giving the sag/swell detection routines a one cycle delay to suppress transient reporting. The sag/swell module will disable transient reporting when it detects a sag/swell event (discussed in more detail below).

b. Wave Shape Deviation Detection

Figure 16:
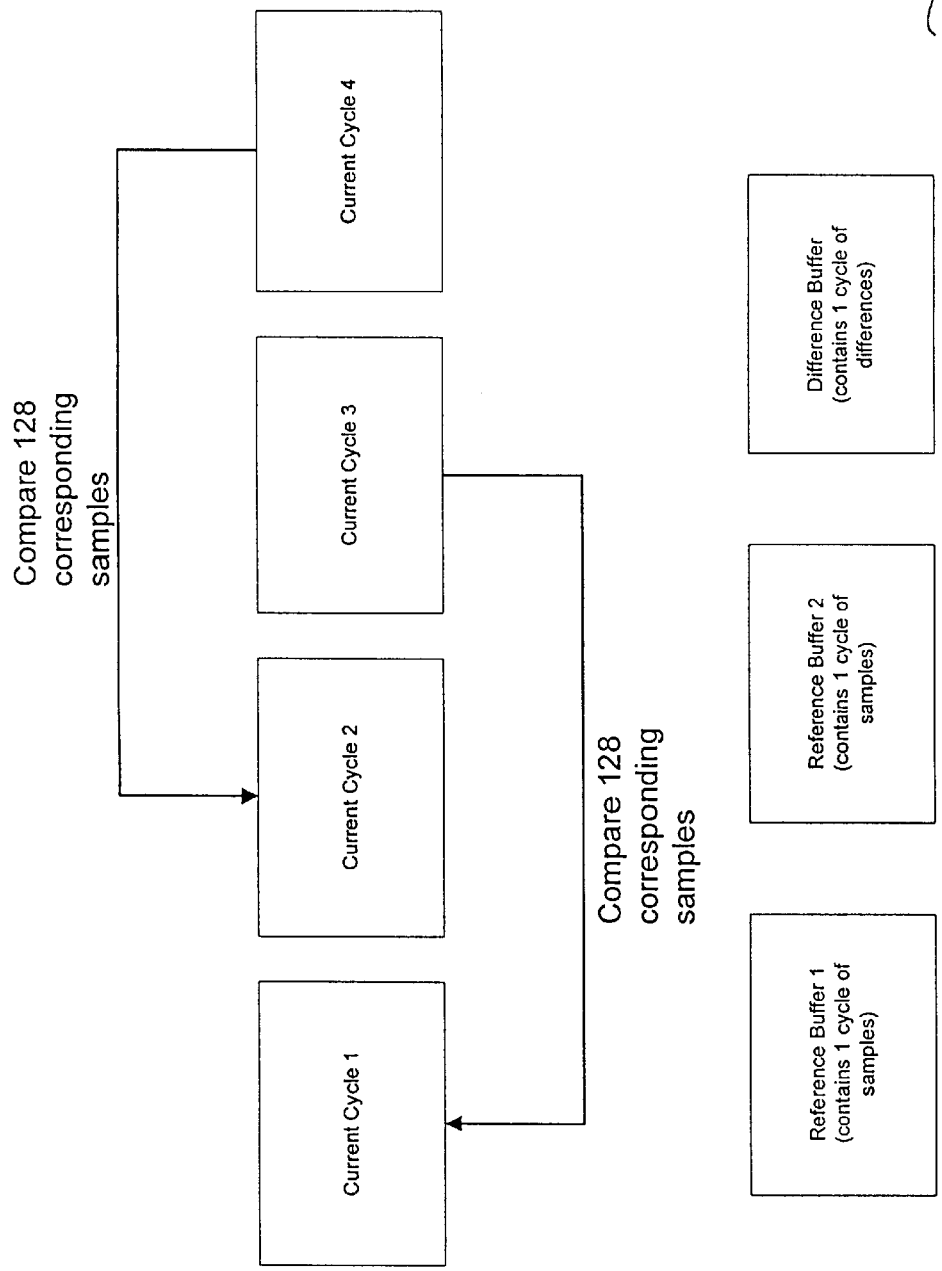
FIG. 16 shows a block diagram depicting DSP buffer comparison arrangement of the transient detection module of FIG. 12.

Referring now to FIGS. 15 and 16, there is shown an algorithm for detecting transient events on an input waveform as well as a block diagram illustrating the comparison method. The wave shape deviation module predicts what the shape of the "normal" waveform should be and compares this predicted waveform to the actual waveform. Any detected deviations which exceed a given threshold will be reported. This routine is called by the transient detection algorithm (FIG. 14, Block 1470) which provides the current phase undergoing analysis as well as the current value of the dynamically calculated threshold for determining whether there is a transient occurring. As described above, the threshold is computed dynamically every one second.

The routine first selects the buffer holding the digital samples for the current cycle for the voltage phase currently being analyzed (Block 1505) (See also FIG. 11). It is next determined which reference buffer will be used to compare to the current cycle buffer (Block 1510). This determination is based on whether the current cycle is even or odd utilizing the current cycle count. This is done so as to compare the current cycle data with data from two cycles earlier. It will be appreciated that any previous cycle that is non-consecutive (i.e. more than one cycle earlier) with the current cycle can also be used to perform the comparison. In this way, non-consecutive cycles are compared with each other. FIG. 16 shows a block diagram of the buffer comparison arrangement. These buffers hold 128 samples due to the sampling frequency of 128 samples per cycle. Alternatively, a higher or lower sampling rate can be used or the buffers could store only a subset of the sampled data. Once the appropriate reference buffer is chosen (Block 1510), each sample from the current cycle is compared with the corresponding non-consecutive sample in the reference buffer and an absolute difference for each sample is computed and stored in a difference buffer (Block 1525). The difference buffer also has 128 elements.

Next, the contents of the current cycle buffer are copied to the reference buffer for comparison 2 cycles later (Block 1530). The routine then compares each sample in the difference buffer with the threshold value and counts the number of samples which exceed the threshold (Block 1535). This is the deviant sample count. The maximum difference/deviation between any one sample and the threshold is also computed (Block 1535). The deviant sample count and the maximum deviation are then passed back to the transient detection algorithm. This data is sent to the CPU via direct memory access (DMA) (See below for further detail). Note that in the preferred embodiment, the current cycle wave shape is compared with the wave shape from 2 cycles prior, however, it will be apparent to one of ordinary skill in the art that the comparison of the current cycle can be with any prior non-consecutive cycle's waveshape.

c. Sag/Swell Detection

The sag/swell module monitors voltage inputs for disturbances (for example, where one or more inputs strays above a high limit or below a low limit). When a disturbance is detected, the module provides information about the entire disturbance. The module can also break up the disturbance into discrete components or sub-disturbances for more detailed analysis. This module provides data for detailed historical analysis of power quality.

Voltage sags occur when the AC power line voltage drops below its rated or specified level. Conversely, disturbances where the line voltage exceeds its rated or specified level are referred to as voltage swells. A sag is typically considered a momentary 15% to 100% reduction in the RMS voltage of an AC power source while a swell is a similarly characterized increase. Sags and swells typically have a minimum duration of two cycles. In detecting sags and swells, it is important that identical sags and swells repeatedly applied to different points on the waveform all be detected and consistently quantified. It is also important that the quantified data be of sufficient accuracy to be used for financial settlements.

In the prefer-red embodiment, a root mean square ("RMS") voltage is computed on a rolling basis over a window which moves each time a sample is added. The preferred measurement window for sag/swell detection is one cycle because this is the shortest measurement window that is not affected by even harmonics.

The RMS value is computed by buffering all of the samples over the measurement window and computing the RMS of all of the samples over the measurement window. With the rolling RMS method of the preferred embodiment, this value is recomputed each time a new sample is acquired by moving the computation window to include the newest sample and exclude the oldest sample. After each calculation update, the computed value is compared to sag and swell threshold values to determine if a sag or swell has occurred, is continuing or has ended. In the preferred embodiment, a running squared sum value is computed for the window. With each new sample, the square of the new sample is added to the running sum and the square of the oldest sample value is subtracted out. The running sum is then used for comparison. It will be appreciated by those skilled in the art that other methods can be used to compute a rolling RMS value. The preferred method is executed at least 16 times per cycle. It will be appreciated that other computation intervals can be used as long as the interval is frequent enough to achieve a sub-cycle rolling window. The interval can range all the way down to the time difference between two successive samples.

Figure 17:
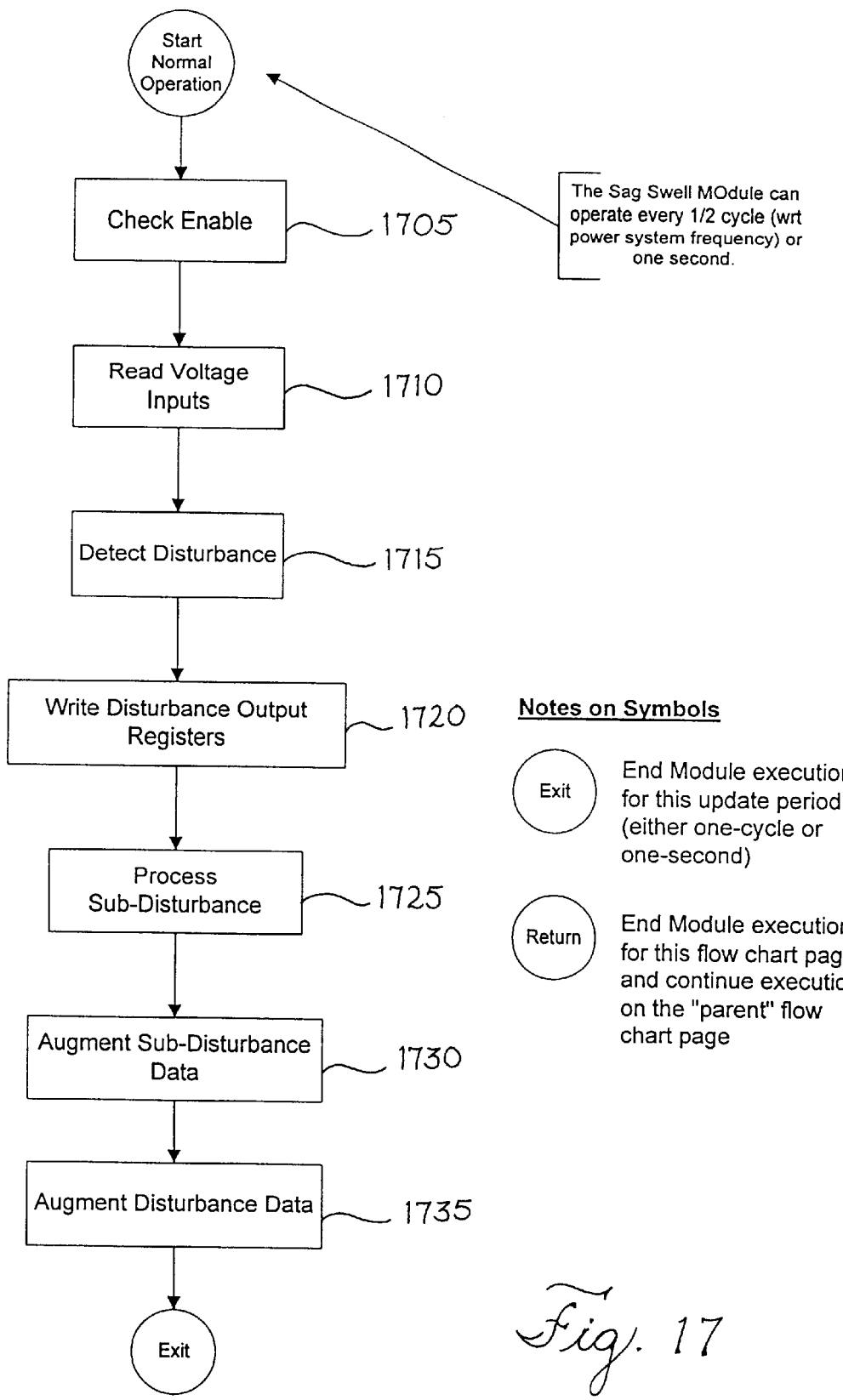
FIG. 17 shows a block diagram depicting the Sag/Swell detection module of the preferred embodiment revenue meter.
Figure 18:
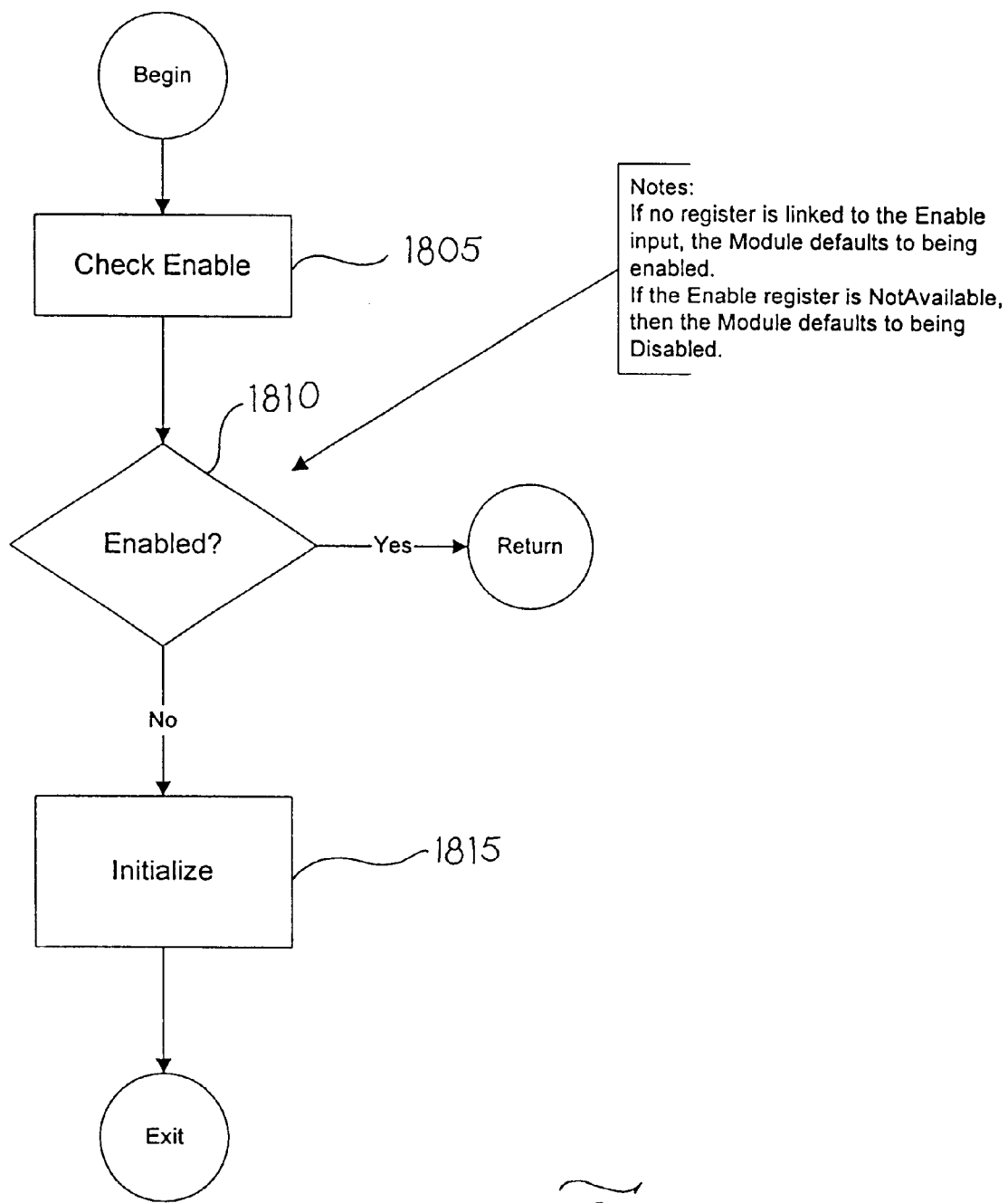
FIG. 18 shows a block diagram depicting the Check_Enable routine of the Sag/Swell detection module of FIG. 17.

FIGS. 17 through 27 show a flow chart for a top level of a preferred sag/swell detection algorithm. The algorithm can operate every one-half cycle with respect to the power system frequency or, alternatively, every one second. FIG. 17 shows the overall operation. This includes the following subroutines: Check_Enable (Block 1705), Read_Voltage_Inputs (Block 1710), Detect_Disturbance (Block 1715), Write_Disturbance_Output_Registers (Block 1720), Process_Sub-Disturbance (Block 1725), Augment_Sub-Disturbance_Data (Block 1730), and Augment_Disturbance_Data (Block 1735).

Figure 19:
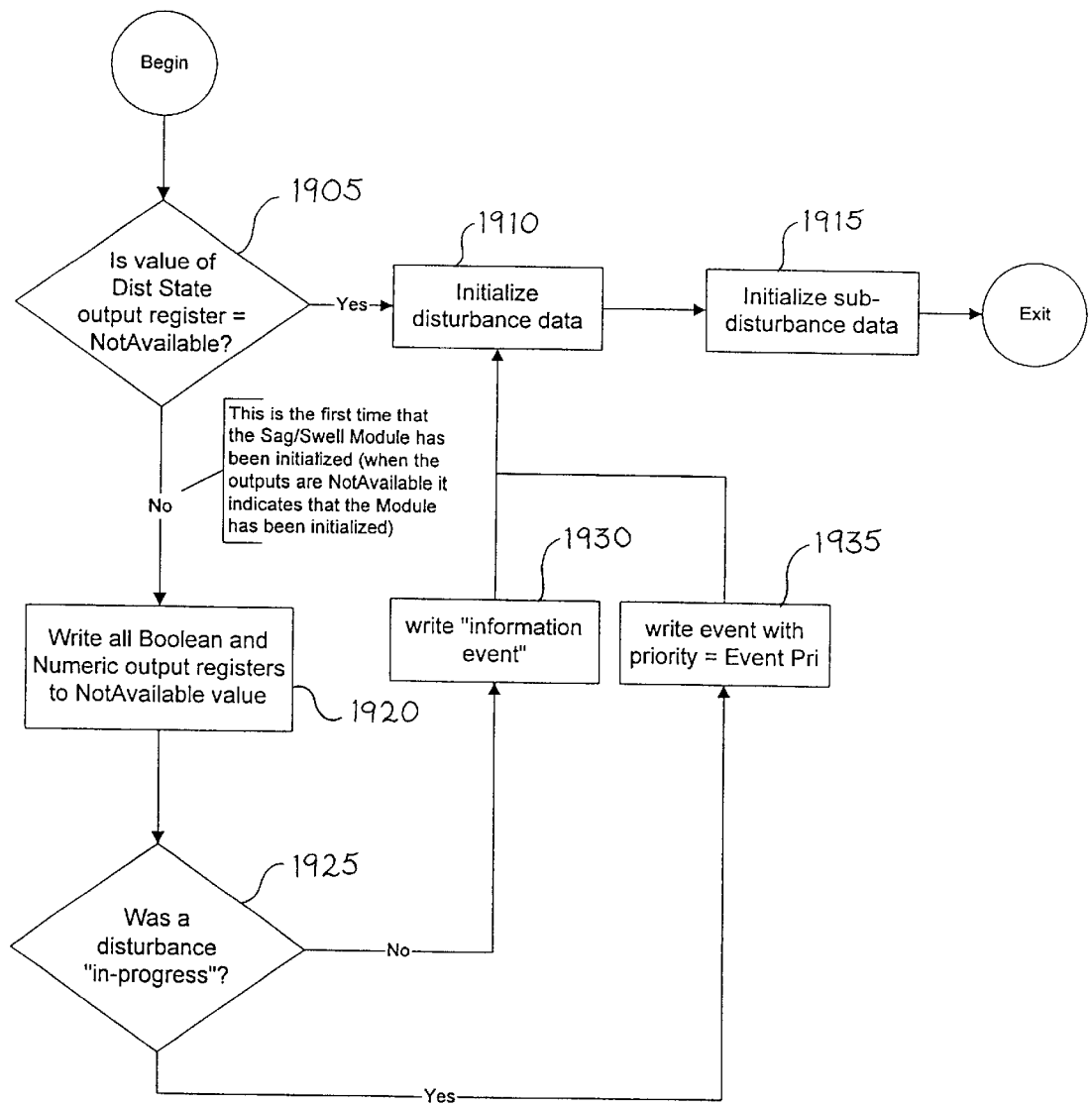
FIG. 19 shows a block diagram depicting the Initialize routine of the Sag/Swell detection module of FIG. 17.
Figure 20:
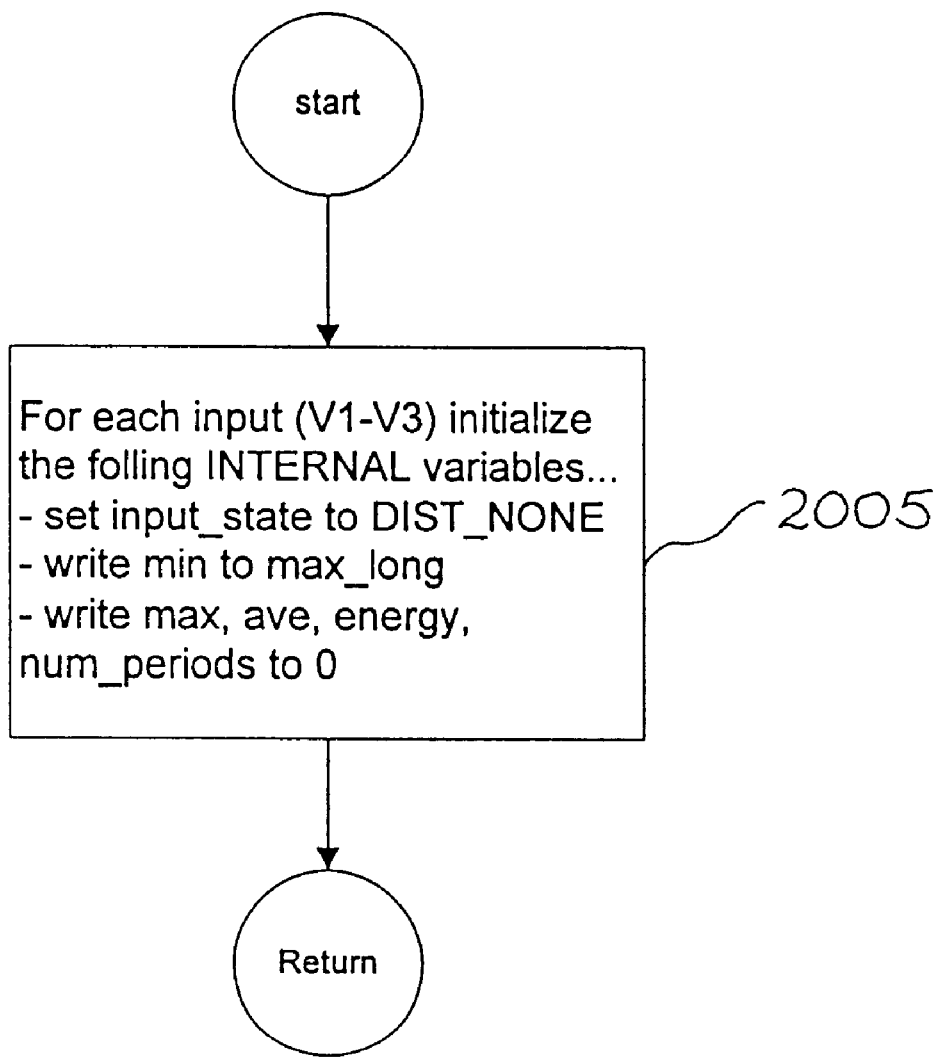
FIG. 20 shows a block diagram depicting the Initialize Disturbance routine of the Sag/Swell detection module of FIG. 17.

The top level routine first calls the check_enable subroutine (FIG. 18) to determine if sag/swell detection is enabled. The register linked to the enable input of the module is read (Block 1805). If the module is enabled, control returns to the main routine (Block 1810). If the module is not enabled, then the initialize sub-routine (FIG. 19) is called (Block 1815). Referring to FIG. 19, in the initialize sub-routine, the value of the disturbance state output register is checked (Block 1905). If this value is anything other than not_available, the initialize routine calls the initialize disturbance data sub-routine (Block 1910) which, referring to FIG. 20, initializes the following internal variables for each phase (Block 2005):

Input-state=DIST_NONE

Min_output=Max_long

Max, ave., energy, num_periods=0

Figure 21:
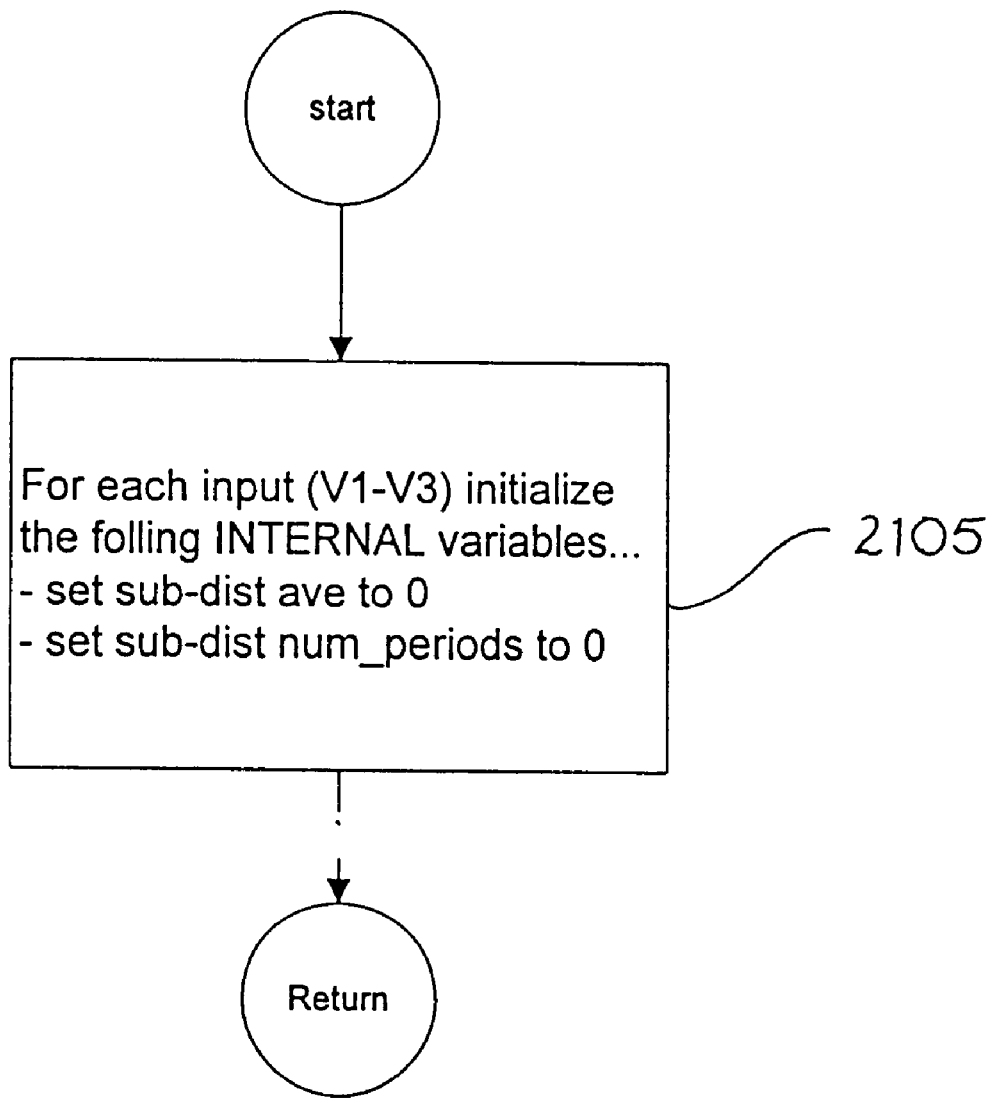
FIG. 21 shows a block diagram depicting the Initialize_Sub-Disturbance routine of the Sag/Swell detection module of FIG. 17.

Referring back to FIG. 19, following the initialize disturbance data subroutine (Block 1910), the initialize subroutine calls the initialize sub-disturbance data subroutine (Block 1915) which, referring to FIG. 21, initializes the following internal variables for each phase (Block 2105):

Sub-dist ave=0

Sub-dist numperiods=0

The initialize subroutine then exits.

Referring back to FIG. 19, if disturbance state output register value is not-available (Block 1905), this indicates that this is the first time the sag/swell module has been initialized. All of the boolean and numeric output registers are set to not_available (Block 1920). It is next checked whether or not a disturbance was in progress (Block 1925). If there was no disturbance in progress, an information event is written and the initialize disturbance data (Block 1910) and initialize sub-disturbance data (Block 1915) subroutines are called as detailed above (Block 1930). The information event indicates an abnormal input condition that may require user attention. If there was a disturbance in progress, an event is written with priority equal to Event_Pri (Block 1935) and the initialize disturbance data (Block 1910) and initialize sub-disturbance data (Block 1915) subroutines are called as detailed above. The event is written to indicate that the routine is no longer capable of detecting the sag/swell due to the abnormal input condition. The sag/swell routine then ends for the current detection period.

Figure 22:
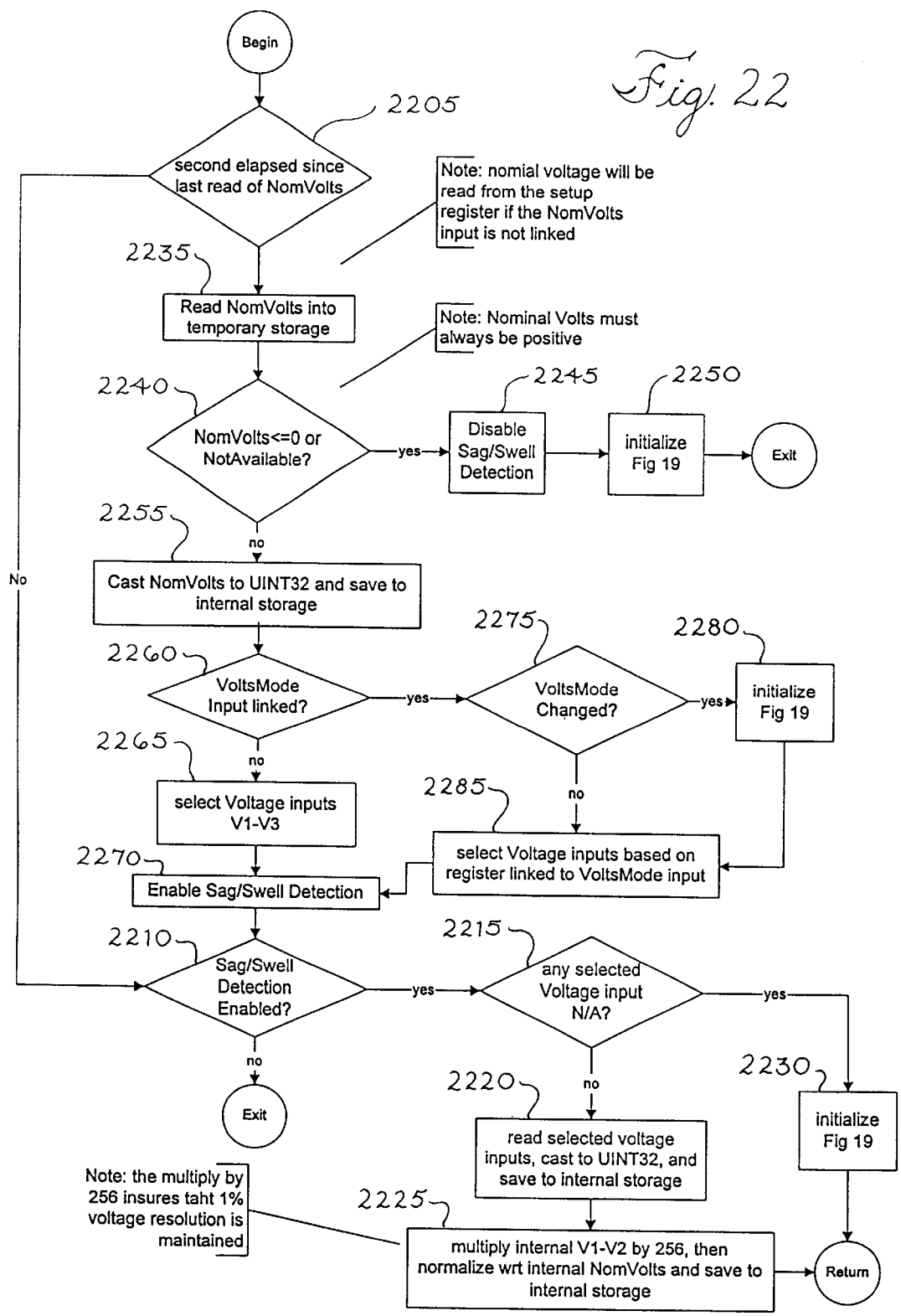
FIG. 22 shows a block diagram depicting the Read_Inputs routine of the Sag/Swell detection module of FIG. 17.

Referring back to FIG. 17, if the sag/swell module is enabled, the initialize routine will return control back to the next block to read the voltage inputs. Referring now to FIG. 22, there is shown a detailed block diagram of the read_voltage_inputs_sub-routine. It is first determined whether or not one second has elapsed since the last reading of the nominal voltage (Block 2205). If not, and if sag/swell detection is not enabled (Block 2210), then the routine exits for the current detection period. If sag/swell detection is enabled, it is determined if any selected voltage input is not available (Block 2215). If the selected voltage input is available, then the voltage inputs are read, cast to unsigned 32 bit numbers and saved to internal storage (Block 2220). Next the internal V1–V3 are multiplied by 256 to insure that a 1% voltage resolution is maintained (Block 2225). These are then normalized with respect to the internal nominal voltage and saved to internal storage. Control is then returned to the top level routine (FIG. 17). If any selected voltage input is not available (Block 2215), then the read inputs routine passes control to the initialize routine (Block 2230) (FIG. 19 and detailed above). Once the initialize routine completes, control returns to the top level (FIG. 17).

If one second has elapsed since the last time the nominal voltage was read (Block 2205), the nominal voltage is read and stored in temporary storage (Block 2235). The one second delay is used to reduce processing power needs. If the nominal voltage is less than or equal to zero or not available (Block 2240), sag/swell detection is disabled (Block 2245), the initialize routine is called (Block 2250) (FIG. 19 and detailed above) and the routine exits for this detection period. If the nominal voltage is greater than zero (Block 2240) then the nominal voltage is cast into an unsigned 32 bit number and stored in internal storage (Block 2255). It is next checked if the VoltsMode input is linked (Block 2260). Voltsmode defines the wiring configuration of the meter (Delta or Wye, etc.) and instructs the module which voltage inputs have valid RMS data. Linking the Voltsmode is a software mechanism for backwards compatibility with meters which cannot automatically detect the wiring configuration and allows the software to pick up the value from a register set at the time the meter was configured.

If the VoltsMode input is not linked, the voltage inputs, V1–V3 are selected and control is passed through the next blocks to determine if any selected voltage input is not available (Blocks 2265, 2270, 2210, 2215). If the selected voltage input is available, then the voltage inputs are read, cast to an unsigned 32 bit number and saved to internal storage (Block 2220). Next the internal V1–V3 are multiplied by 256 to insure that a 1% voltage resolution is maintained (Block 2225). These are then normalized with respect to the internal nominal voltage and saved to internal storage. Control is then returned to the top level routine (FIG. 17). If any selected voltage input is not available, then the read inputs routine passes control to the initialize routine (Block 2230) (FIG. 19 and detailed above). Once the initialize routine completes, control returns to the top level (FIG. 17).

If the VoltsMode input is linked (Block 2260), then it is checked whether or not the VoltsMode has changed (Block 2275). If it has changed, then the initialize routine is called (Block 2280) (FIG. 19 and detailed above). If it has not changed or once the initialize routine completes, the voltage inputs are selected based on the register linked to the VoltsMode input (Block 2285). Control is then passed through the next blocks to determine if any selected voltage input is not available (Blocks 2270, 2210, 2215). If the selected voltage input is available, then the voltage inputs are read, cast to an unsigned 32 bit number and saved to internal storage (Block 2220). Next the internal V1–V3 are multiplied by 256 to insure that a 1% voltage resolution is maintained (Block 2225). These are then normalized with respect to the internal nominal voltage and saved to internal storage. Control is then returned to the top level routine (FIG. 17). If any selected voltage input is not available, then the read inputs routine passes control to the initialize routine (Block 2230) (FIG. 19 and detailed above). Once the initialize routine completes, control returns to the top level (FIG. 17).

Figure 23:
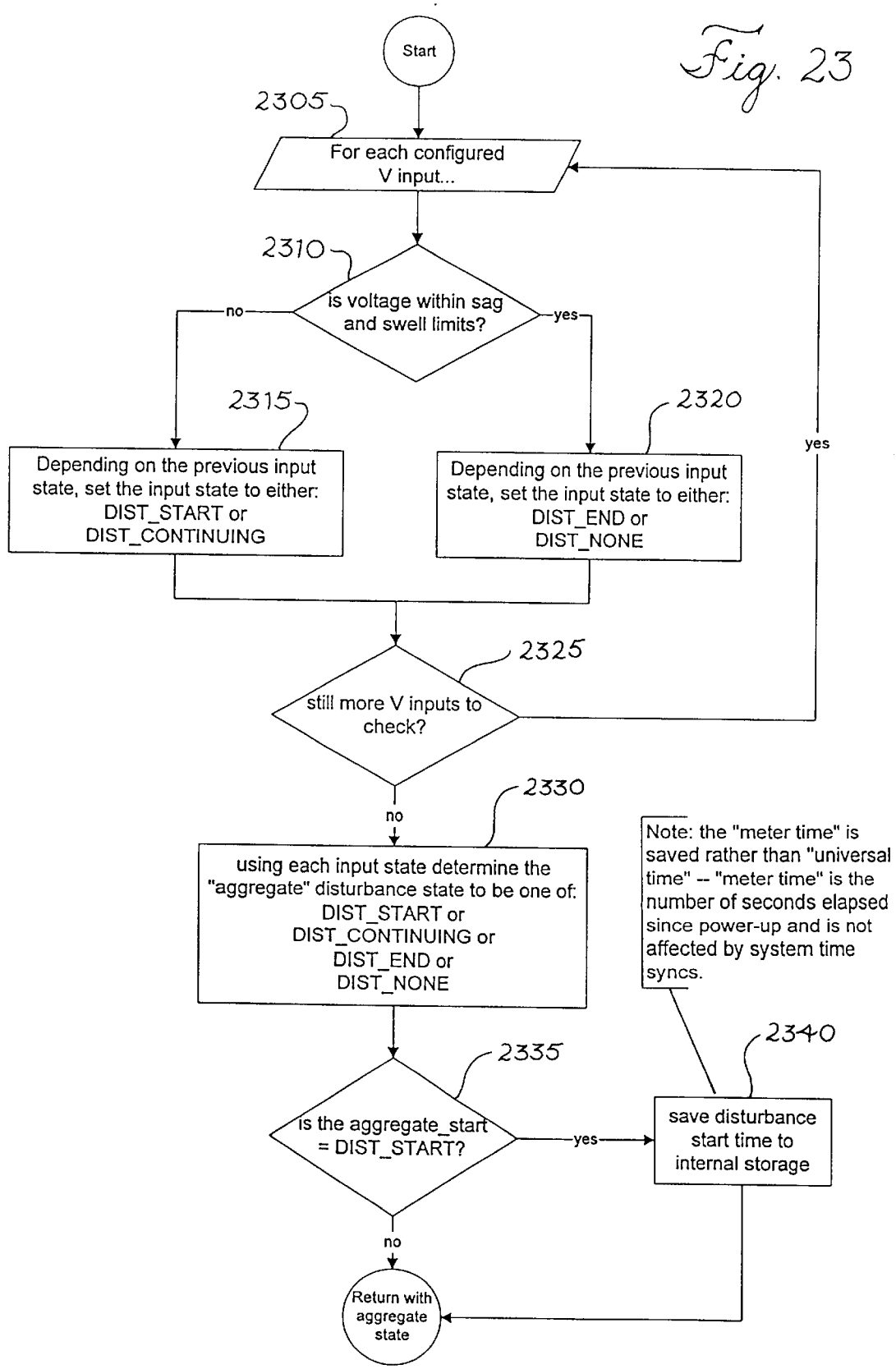
FIG. 23 shows a block diagram depicting the Detect_Disturbance routine of the Sag/Swell detection module of FIG. 17.

FIG. 23 shows a flow chart depicting the detect_disturbance subroutine. The routine first checks each configured voltage input (Block 2305). For each input, it is determined whether or not the voltage is within the sag and swell limits (Block 2310). If it is not within these limits, the input state is set to either Dist_Start state or Dist_Continuing state (Block 2315). If prior to this point, the input state was already in Dist_Start or Dist_Continuing, then the input state will be set to Dist_Continuing. If not, then the input state will be set to Dist_Start. If the voltage is within the sag and swell limits, then the input state is set to either Dist_End or Dist_None (Block 2320). If the prior state of the input state was Dist_Start or Dist_Continuing then the input state will be set to Dist_End otherwise it will be set to Dist_None.

Once all inputs have been checked (Block 2325), an aggregate input state from all input is determined (Block 2330). The aggregate state is computed by OR'ing all of the inputs together. If the aggregate state is Dist_Start (Block 2335), then the disturbance start time is saved in internal storage (Block 2340). In this block, it is the "meter time" which is saved rather than "universal time." Meter time is the number of seconds elapsed since power-up and is not affected by system time synchronization's. After the start time is saved or if the aggregate state is other than Dist_Start, then control returns to the top level routine along with the aggregate state.

Figure 24:
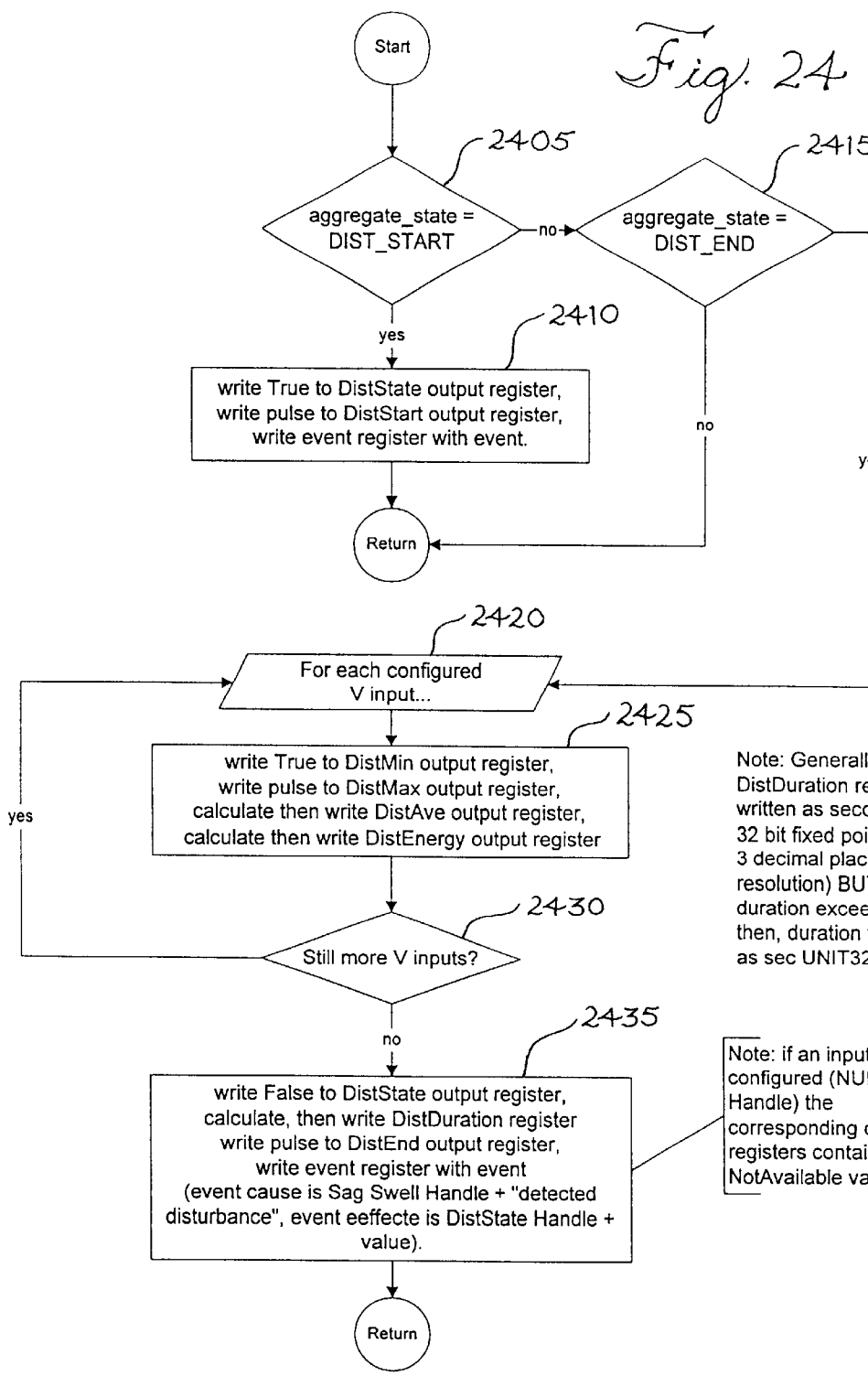
FIG. 24 shows a block diagram depicting the Write_Disturbance_Outputs routine of the Sag/Swell detection module of FIG. 17.

FIG. 24 depicts a flow chart showing the write_disturbance outputs subroutine. It is first determined if the aggregate state is Dist_Start (Block 2405). If so, a value of true is written to the DistState output register, a pulse is written to the DistStart output register and the event register is written with the event (Block 2410). This adds the event to the event log which will give the user information on the start of the sag/swell event. Control is then passed back to the top level routine (FIG. 17). If the aggregate state is not Dist_Start and not Dist_End (Block 2415), then control is passed back to the top level routine (FIG. 17).

If the aggregate state is any other value except Dist_Start or Dist_End, then for each configured voltage input (Block 2420), DistMin and DistMax output registers are written. The Disturbance Average is calculated according to the following formula and then written to the DistAve output register.

Dist_Ave=100×((sum of all voltage RMS values)/# of RMS values in the sum)/$V_{nominal(RMS)}$ The Disturbance Energy is calculated according to the following formula and then written to the DistEnergy output register.

Dist_Energy=100×(($\Sigma(V_{rms}^2)$/# RMS values in sum))/$V_{nominal(RMS)}^2$ For any non-configured voltage input, the corresponding output registers will be written with a Not_Available value (Block 2425). Once all of the configured voltage inputs have been completed (Block 2430), a value of False is written to the DistState output register and the Disturbance duration is calculated by computing the elapsed time since Dist_Start was first pulsed. The duration is then written to the DistDuration output register. In addition, a write pulse is sent to the DistEnd output register and the event register is written with the event cause set to the sag swell handle+"detected disturbance" (Block 2435). Control is then passed back to the top level routine (FIG. 17).

Figure 25:
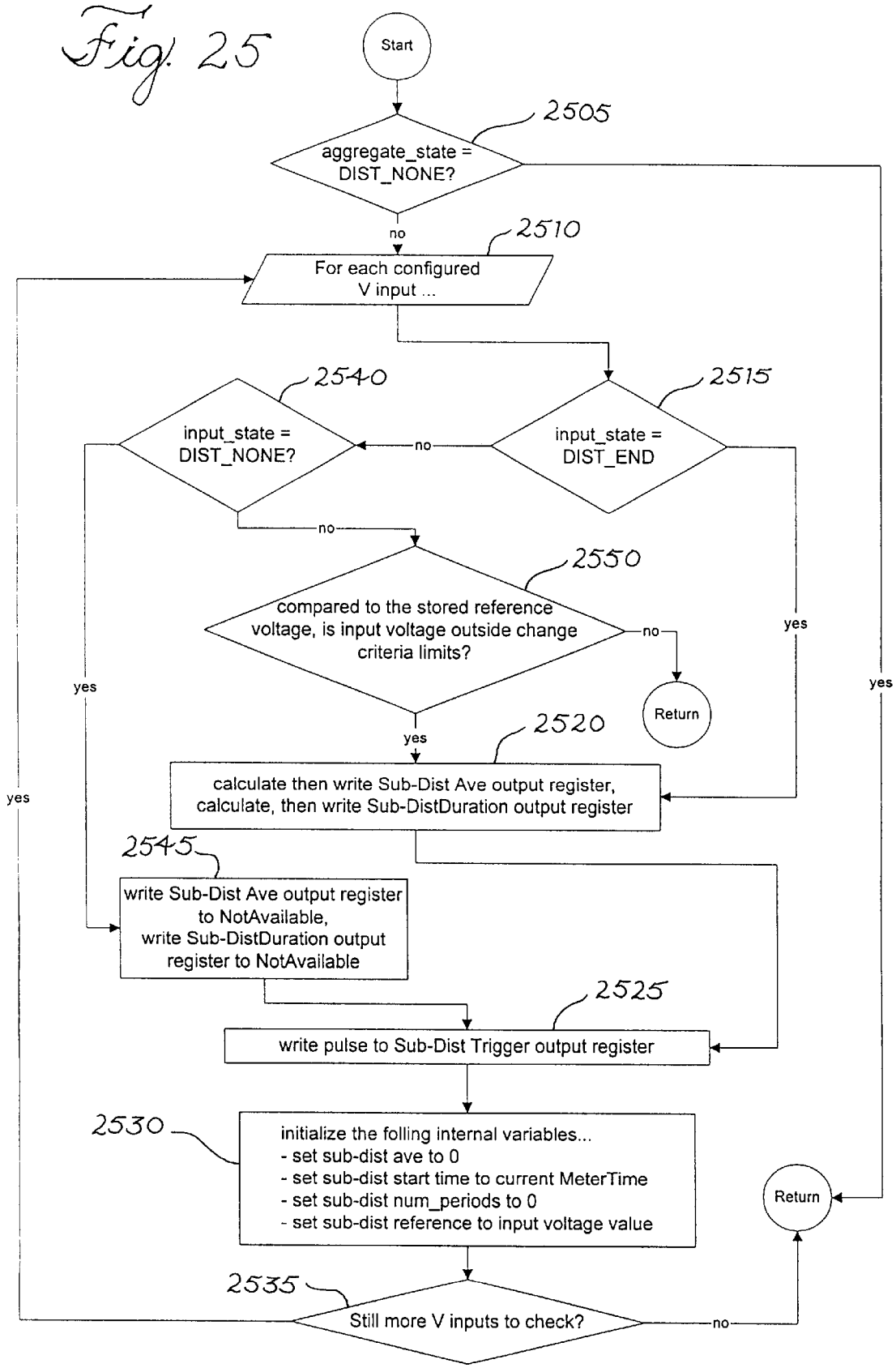
FIG. 25 shows a block diagram depicting the Process_Sub-Disturbance routine of the Sag/Swell detection module of FIG. 17.

FIG. 25 depicts a flow chart showing the process_sub-disturbance_subroutine. If the aggregate state is Dist_None (Block 2505), then the routine returns control to the top level (FIG. 17). If the aggregate state is any other state then the following blocks are executed for each configured voltage input (Block 2510). If the input state is Dist_End (Block 2515), then the sub-disturbance average is calculated and written to the sub-Dist Ave output register and the sub-disturbance duration output register is calculated and written to the Sub-DistDuration output register (Block 2520). A pulse is written to the Sub-Dist trigger output register and the following internal variables are set (Blocks 2525 and 2530):

Sub-dist ave=0

Sub-dist start time−current meter time

Sub-dist num_periods=0

Sub-dist reference=input voltage value

If there are no other voltage inputs to check then control is returned to the top level routine (Block 2535) (FIG. 17).

If the input state is Dist_Start (Block 2540), then the sub-dist ave and sub-DistDuration output registers are set to not_available (Block 2545). A pulse is written to the Sub-Dist trigger output register and the following internal variables are set (Blocks 2525 and 2530):

Sub-dist ave=0

Sub-dist start time−current meter time

Sub-dist num_periods=0

Sub-dist reference=input voltage value

If there are no other voltage inputs to check then control is returned to the top level routine (Block 2535) (FIG. 17).

If the input state is anything other than Dist_None, Dist_Start or Dist_End then the stored reference voltage is compared to the input voltage (Block 2550). If the input voltage is outside the change criteria limits then the sub-disturbance average is calculated and written to the sub-Dist Ave output register and the sub-disturbance duration output register is calculated and written to the Sub-DistDuration output register (Block 2520). The change criteria limits are set by the user. A pulse is written to the Sub-Dist trigger output register and the following internal variables are set (Blocks 2525 and 2530):

Sub-dist ave=0

Sub-dist start time=current meter time

Sub-dist numperiods=0

Sub-dist reference=input voltage value

If there are no other voltage inputs to check then control is returned to the top level routine (Block 2535) (FIG. 17).

If the input voltage is not outside the change criteria limits (Block 2550) then control is returned to the top level routine (FIG. 17).

Figure 26:
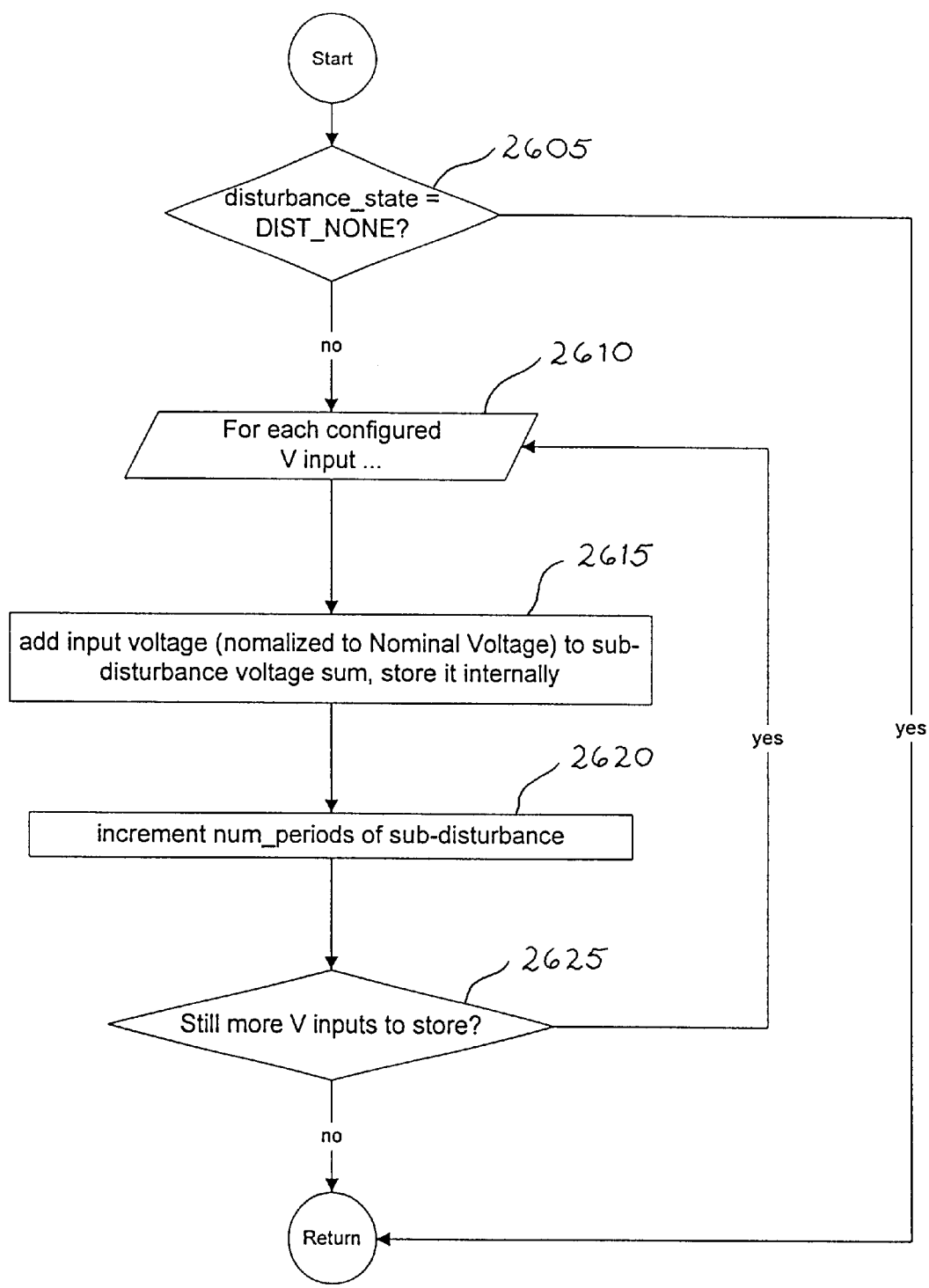
FIG. 26 shows a block diagram depicting the Augment_Sub-Disturbance_Data routine of the Sag/Swell detection module of FIG. 17.

FIG. 26 shows a flow chart depicting the augment_sub-disturbance_data subroutine. If the disturbance state is Dist_None (Block 2605), then control is passed back to the top level routine (FIG. 17). If the disturbance state is any other value, then the following blocks are executed for each configured voltage input (Block 2610). The input voltage is normalized to the nominal voltage, added to a sub-disturbance voltage sum and stored internally (Block 2615). Finally, the variable num_periods of sub-disturbance is incremented (Block 2620).

Figure 27:
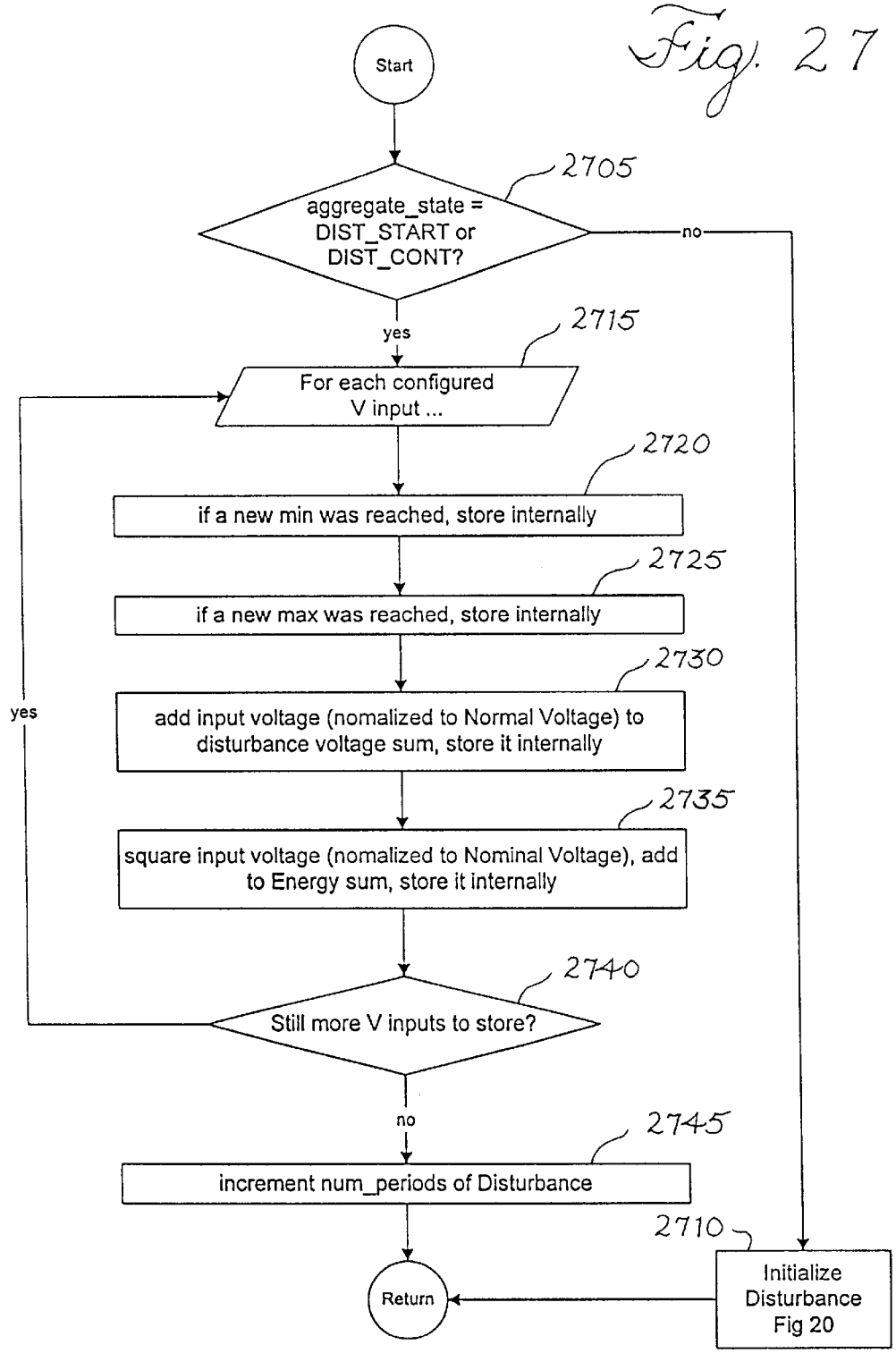
FIG. 27 shows a block diagram depicting the Augment_Disturbance Data routine of the Sag/Swell detection module of FIG. 17.

FIG. 27 shows a flow chart depicting the augment_disturbance_data subroutine. If the aggregate state is any state but Dist_Start or Dist_Cont (Block 2705), then the initialize disturbance subroutine is called (Block 2710) (FIG. 20 and detailed above) and control is passed back to the top level (FIG. 17). If the aggregate state is Dist_Start or Dist_Cont, then the following blocks are executed for each configured voltage input (Block 2715). If a new min or max was reached, then these values are stored internally (Blocks 2720 and 2725). The input voltage is normalized to the nominal voltage, added to the disturbance voltage sum and stored internally (Block 2730). The input voltage is normalized to the nominal voltage, then squared, added to the Energy sum and stored internally (Block 2735). Once all configured voltage inputs have been dealt with (Block 2740), the num_periods of disturbance variable is incremented (Block 2745) and control is passed back to the top level routine (FIG. 17).

d. Harmonic Detection and Calculation

Figure 28:
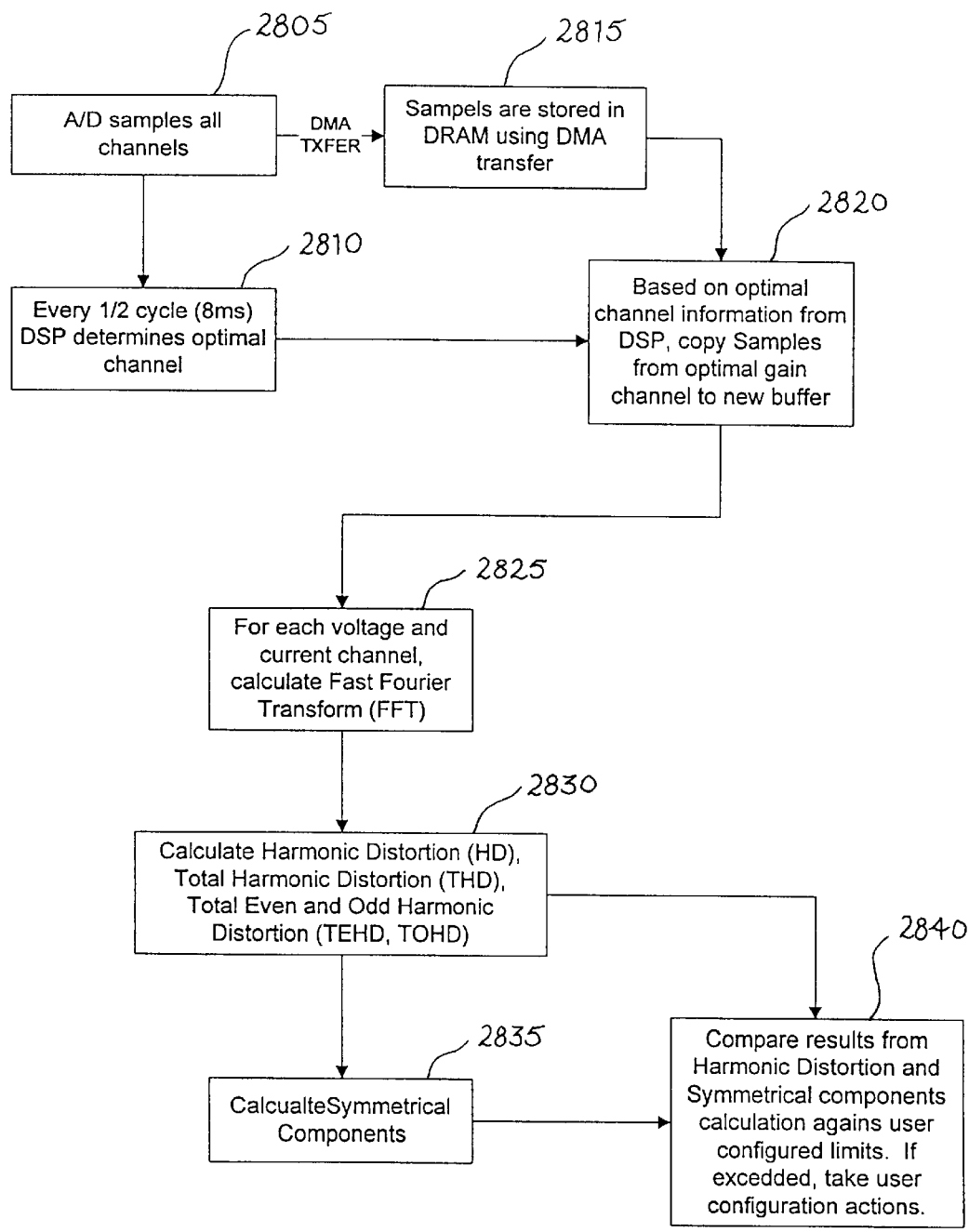
FIG. 28 shows a block diagram depicting the harmonics detection module of the preferred embodiment revenue meter.

Harmonics are voltage or current signals that are not at the desired fundamental frequency (often 50 or 60 Hz), but rather at some multiple of the fundamental frequency. It is important to detect harmonic frequencies present in the supplied power in order to select properly rated transformers for equipment as well as to effect an accurate power quality analysis and properly detect faults in the system. Referring now to FIG. 28, in order to detect harmonic frequencies, the analog to digital converter synchronously samples voltage and current signals from the electric circuit (Block 2805). These samples are taken from all input channels. The preferred sampling rate is at least 64 samples per cycle although higher sampling rates can also be used. Typically, a sample rate which is synchronous to the fundamental frequency of the input voltage is used.

The digital signal processor determines the best channel for each input via autoranging (Block 2810) and transfers all of the samples and "best channel"information to the CPU using direct memory access techniques (Block 2815). Autoranging is described in more detail in the above referenced U.S. Pat. Application entitled "METHOD AND APPARATUS FOR AUTOMATICALLY CONTROLLED GAIN SWITCHING OF POWER MONITORS". The best channel will be one which is non-saturated with the most resolution. The "best" samples from most optimal channel will then be copied to a new buffer on the CPU (Block 2820). On the CPU, a Fast Fourier Transform (FFT) algorithm is performed on one cycle of the "best" samples (Block 2825). One FFT is performed each second on a different input signal.

The FFT produces a set of complex pairs that can be manipulated by the CPU using techniques known in the art to produce the harmonic content for harmonics 2–63. These are measured as a percentage of the fundamental frequency. In addition, the magnitude and phase angle of the detected harmonic frequencies are also computed. The detected harmonics, magnitude and phase angle are recorded for access by the user. Further, the magnitude of the detected harmonics is compared to a pre-set threshold set by the user to determine if the presence of harmonics in the electric circuit exceeds the specification for normal power delivery. If the magnitude does exceed the threshold value, the waveform will be recorded (see detail below) for future diagnosis.

Harmonic Distortion measurements are indicative of the quality of the power being delivered to the customer. The 8500 measures harmonic distortion levels for individual harmonics up to the 63rd harmonic, as well as total harmonic distortion, total even harmonic distortion (all even harmonics), total odd harmonic distortion (all odd harmonics), and symmetrical components (see below).

In the exemplary revenue meter, harmonic calculations are based on the waveform sampled by the Digital Signal Processor (DSP). The DSP continuously samples the voltage and current gain channels at 128 samples per cycle, using three A/D converters. The data from the A/D converters is continuously transferred from the DSP to the CPU. All gain channels are transferred into six "half-cycle" DMA waveform buffers as a temporary storage area. The chain of those six buffers is used in a circular fashion. When the gain selection data becomes available, two cycles after the samples, the CPU uses it to locate the optimal data, and copy it to a harmonic calculation buffer. Optimal data will come from the gain channel with the highest voltage range which is not saturated.

The data in the harmonic calculation buffer consists of 1 cycle worth of raw A/D samples for each voltage and current channel. For each voltage and current channel, the raw sample data is converted to the frequency domain using a Fast Fourier Transform ("FFT"). The result from the FFT consists of an array of 63 complex numbers representing the complex voltage/current at the 1–63rd harmonics. These 63 complex numbers are then used to calculate the harmonic distortion measurements using the equations listed below.

$$H_N = \frac{FFT_N}{FFT_1} \qquad HD_N = \frac{\frac{FFT_N}{FFT_1}}{100}$$

Where $FFT_N$ is the nth complex number from the FFT result. $HD_N$ is the harmonic distortion at the nth harmonic.

$$THD = \frac{\sqrt{\sum_{N=2}^{63} H_N^2}}{100}$$

$$TOHD = \frac{\sqrt{\sum_{N=3,5}^{63} H_N^2}}{100} \qquad TEHD = \frac{\sqrt{\sum_{N=2,4}^{62} H_N^2}}{100}$$

Where THD is the total harmonic distortion, TOHD and TEHD are the total odd and even harmonic distortions respectively (Block 2830).

Once these values are computed, they are compared with user defined limits. If the values exceed the pre-defined limits, actions, as prescribed by the user are taken. This includes recording the waveform and/or reporting an error (Block 2840).

e. Symmetrical Component Detection and Calculation

The symmetrical component detection module provides information about unbalanced voltages and currents in a three phase power system. This allows identification or prediction of how electrical equipment might be affected. This information can be used to reduce induced circulations currents in motor windings, prevent equipment damage and prolong motor and transformer life. For a more detailed description of symmetrical components of electrical power, see "Protective Relaying Theory and Applications," edited by Walter A. Elmore, pages 17–37 (1994).

The positive, negative and zero sequence components of the electric signal are computed using the equations listed below which use the fundamental complex FFT pairs for the voltage and current inputs. The positive sequence component consists of the three phasors, equal in magnitude, each 120 degrees apart with the same sequence (a-b-c) as the original phasors. The negative sequence component consists of three phasors, equal in magnitude, each 120 degrees apart with the opposite sequence (a-c-b) as the of the original phasors. The zero sequence component consists of three identical phasors (i.e. equal in magnitude and with no relative phase displacement). For a more detailed discussion of symmetrical components, see Stanley E. Zocholl, "An Introduction to Symmetrical Components" (Schweitzer Engineering Laboratories, Inc., Pullman, Wash. 1997).

In order to compute the zero sequence current or voltage, the fundamental voltage or current vector is computed from the magnitude and phase angle of the fundamental frequency of each phase of the electric circuit. These fundamental voltage or current vectors are then added together using vector addition.

To compute the positive sequence voltage or current, one phase's fundamental voltage or current vector is shifted by plus 120 degrees. A second phase's fundamental voltage or current vector is shifted by minus 120 degrees. These two phases plus the un-shifted third phase are then added together using vector addition. The computation of the negative sequence voltage or current is the same as the positive sequence except that the phase that was shifted by plus 120 degrees is now shifted by minus 120 degrees and the phase which was shifted by minus 120 degrees is now shifted by plus 120 degrees. It will be appreciated by those skilled in the art that these calculations are based on a 360 degree circle, and that subtracting 120 degrees from a vector is the same as adding 240 degrees, etc.

Once computed, the sequence voltages or currents can be compared with a threshold value to determine if there is a problem.

In the exemplary revenue meter, the FFT results from the harmonic content calculations are also used to calculate the symmetrical component vectors for both voltage and current (Refer to FIG. 28, Block 2835). The symmetrical components consist of three vectors each for current and voltage. These three vectors are the zero component sequence vector, the positive component sequence vector, and the negative sequence component vector. The equations used to calculate each vector are illustrated below.

$$V_0 = \tfrac{1}{3}(FFT_{A,1} + FFT_{B,1} + FFT_{C,1})$$

Where $V_0$ represents the zero sequence vector, $FFT_{A,1}$, $FFT_{B,1}$, $FFT_{C,1}$, represent the $1^{st}$ complex number (fundamental)

from the FFT result for phase A, B, C respectively.

$$V_1 = \tfrac{1}{3}(FFT_{A,1} + a \times FFT_{B,1} + a^2 \times FFT_{C,1})$$

Where $V_1$ represents the positive sequence vector, a represent a 120 degrees phase shift operator and $a^2$ represents a 240 degrees phase shift operator.

$$V_2 = \tfrac{1}{3}(FFT_{A,1} + a^2 \times FFT_{B,1} + a \times FFT_{C,1})$$

Where $V_2$ represents the negative sequence vector.

IV. Power Quality Event Handling a. Waveform Recording

Once a power quality event is detected, it is preferred that as much data as possible be recorded so that the event cause can be documented and diagnosed, either in real time (such as by the meter itself, or by a technician) or post-processed at a later time in order to ascertain possible causes of the event. As well, such diagnosis can be done either locally or remote from the meter. Not only must as much data be recorded about the event as is possible, but it must be recorded with sufficient detail to provide meaningful information long after the event as passed. In all of the above embodiments, when the particular power quality event is detected, recording of data about the power quality event will be immediately triggered so as to capture data early in the lifespan of the event. This is critical as some power quality events are only momentary, such as transient events.

The preferred method of capturing such power quality data is to record a waveform which represents the input voltages and currents from the different phases of the electric circuit as they change over time. The waveform is constructed by measuring and sampling the input voltages and currents and plotting these values with respect to time. It is also preferred that the waveform recorder be configurable depending on amount of information needed to be stored and level of detail required by the user. In the preferred embodiment 8500 Power Meter, waveform recording is implemented using the ION Waveform Recording Module, manufactured by Power Measurement, Ltd., Saanichton, British Columbia, Canada.

Figure 29:
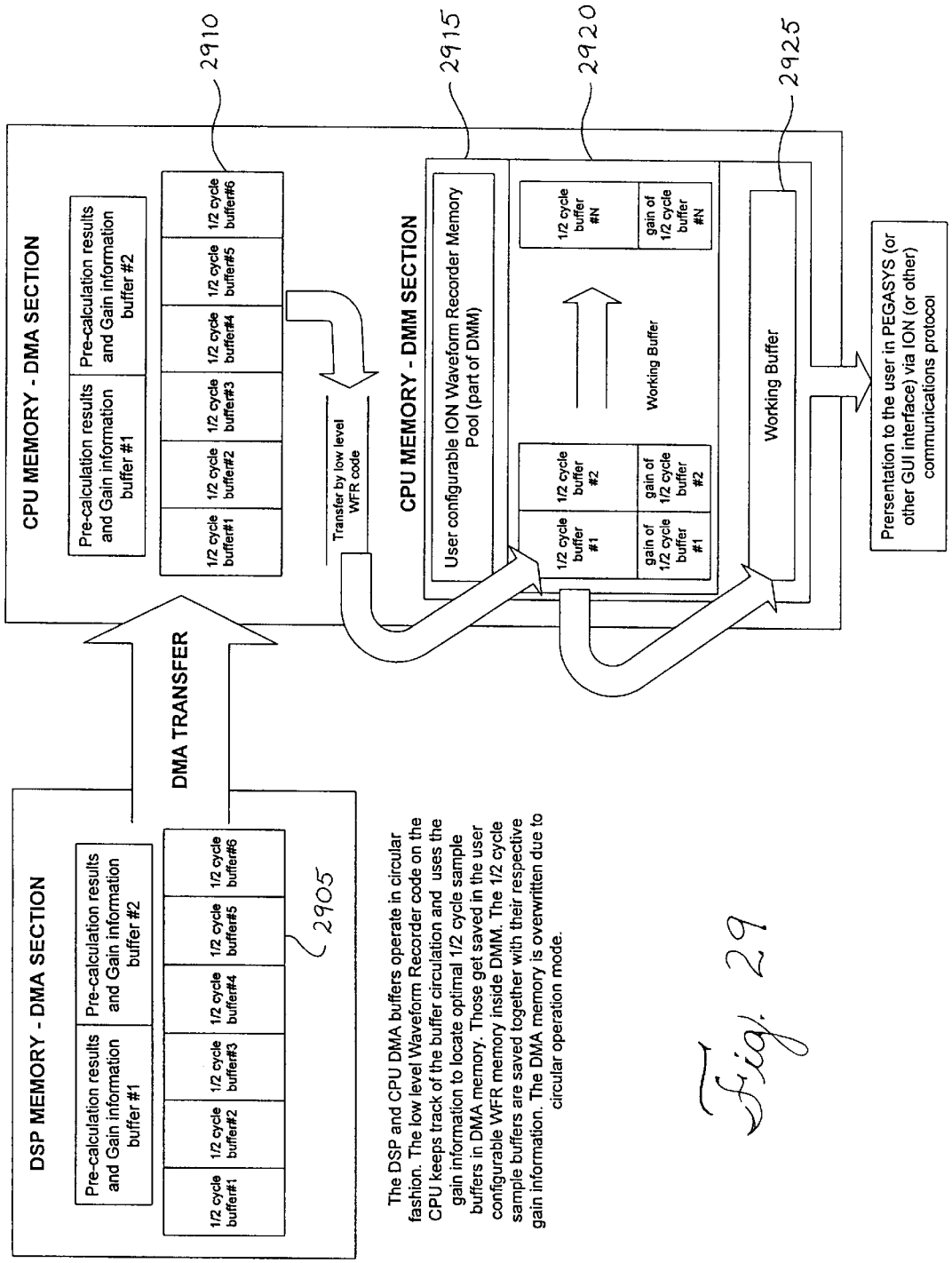
FIG. 29 shows a block diagram depicting the data flow of the preferred waveform recording module.

Referring now to FIG. 29, a block diagram depicting the data flow in the preferred waveform recording module is shown. The voltages and currents for each phase in the three phase electric circuit first pass through the analog gain stages. These gain stages are described in more detail in the above referenced co-pending and commonly assigned U.S. Pat. Application entitled "METHOD AND APPARATUS FOR AUTOMATICALLY CONTROLLED GAIN SWITCHING OF POWER MONITORS". The gain stages are connected to the physical hardware input terminals of the meter which are connected to the three phase power system. The gain stages break up the input voltages and currents that come into the meter through the hardware terminals into multiple channels based on the voltage or current range of the input signal. There are 2 channels for each voltage input, Nominal and Overrange. In the preferred embodiment, the Nominal channel ranges from 0–156 Vrms and the Overrange channel ranges from 0–1000 Vrms. There are four channels for each current input, Creep, Underrange, Normal and Overrange. In the preferred embodiment, the Creep channel ranges from 0–0.78 A, the Underrange channel ranges from 0–3.125 A, the Nominal channel ranges from 0–12.5 A and the Overrange channel ranges from 0–50 A. Alternatively, one of ordinary skill in the art will recognize that other channel and range combinations are possible. For applications involving a fourth current input, the fourth current input is broken up into two channels, Underrange and Overrange. The Underrange channel ranges from 0–3.125 A and the Overrange channel ranges from 0–50 A. Each of the channels (twenty-four in the preferred embodiment) is connected to an analog to digital ("A/D") converter which samples each of the channels and converts the analog signals to digital samples. The A/D converter preferably converts the analog signals at a rate of 128 samples per cycle although other rates can be used. The digital samples are fed to the digital signal processor ("DSP") which stores the samples locally in a RAM buffer 2905. In the preferred embodiment, the RAM buffer 2905 consists of 6 buffers each capable of holding ½ cycle, although it will be appreciated that more or less buffers of larger or smaller sizes can also be used. The DSP then executes the autoranging routine, described in more detail in the above mentioned reference, to find the gain stage which provides the best resolution. This will be the first non-saturated channel for each input. On every ½ cycle, the CPU initiates a DMA transfer from the DSP RAM buffer 2905 to a RAM buffer 2910 on the CPU side. The RAM buffer 2910 on the CPU side also includes six buffers each holding ½ cycle corresponding to the DSP RAM buffer 2905. The CPU RAM buffers 2910 are used in a circular fashion. Concurrently, on every ½ cycle, for every configured ION Waveform Module, the CPU transfers 64 samples representing ½ cycle of the first non-saturated channel and gain stage information for that channel to the Dynamic Memory Manager ("DMM") 2915. Alternatively, a larger or smaller number of samples can be transferred. Further, the transfer can occur on a larger or smaller frequency. The samples may be decimated from 64 samples to some other power of two as specified in the ION Waveform Recorder Module Format Setup Register. The samples and gain stage information are initially stored in a working buffer in the DMM 2920. The working buffer can hold six sets of samples, each containing 64 samples or ½ cycle. Note that the working buffers can hold more or less data. There is preferably, one DMM working buffer 2920 for each ION Waveform Module that exists (typically fourteen). The working buffer 2920 format is dictated by the Format Setup Register of the corresponding ION Waveform Recorder Module. The sub-buffers of the working buffer 2920 are used in a circular fashion until a record pulse is received. When and if the ION Waveform Recorder Module receives a record pulse, the Module may instruct the DMM to start a new working buffer 2925 and save the existing working buffer 2920 into more permanent DMM storage for later retrieval by client software, such as the Pegasys Client. In this way, the Recorder Module continually records and re-uses buffer space until it is instructed to save what it has recorded. It then stops reusing the current working buffer 2920, and starts a new working buffer 2925. This continual recording methodology ensures that the context, before and after a power quality event is detected, will be saved for later analysis. This is useful, because later analysis may require knowing what the electrical signal look like up to the occurrence of the power quality event. Note that it will be apparent to those skilled in the art that the size of the data transfers and the size of the buffers can vary depending on the processor power, the available storage capacity, the desired power quality event context and the desired resolution of recording.

The low level waveform recorder firmware continuously transfers samples from the Digital Signal Processor (DSP) to the Central Processing Unit (CPU). Referring back to FIG. 29, all gain channels are transferred into six "half cycle" DMA waveform buffers 2920 as a temporary storage area. The chain of those six buffers is used in a circular fashion and forms the working buffer. When the gain selection data becomes available, two cycles after the samples, the CPU copies it to the user-configurable waveform recording buffers 2920 for the corresponding samples. Those buffers are under control of the Waveform Recording Module.

The Module can be enabled or disabled. If the module is disabled, the waveform data is not copied out of the DMA buffers which results in a reduction of the CPU load. However, the DMA portion of the waveform recorder continues to transfer samples from the DSP to the CPU in order to support harmonic calculations (detailed above). The preferred waveform recording module can be configured to save waveforms using 128, 64, 32 or 16 samples per cycle. This information is made available to the low level code which selects and copies required samples from the DMA buffers 2910 into the waveform recorder buffers 2915 to produce waveforms in the desired format.

The Waveform Recorder firmware is configured by the user to log waveforms of a specified duration at a specified resolution. The Waveform Recorder Module is used to take a snapshot of each input's voltage and/or current waveforms over a specific number of cycles as programmed by the user.

Figure 30:
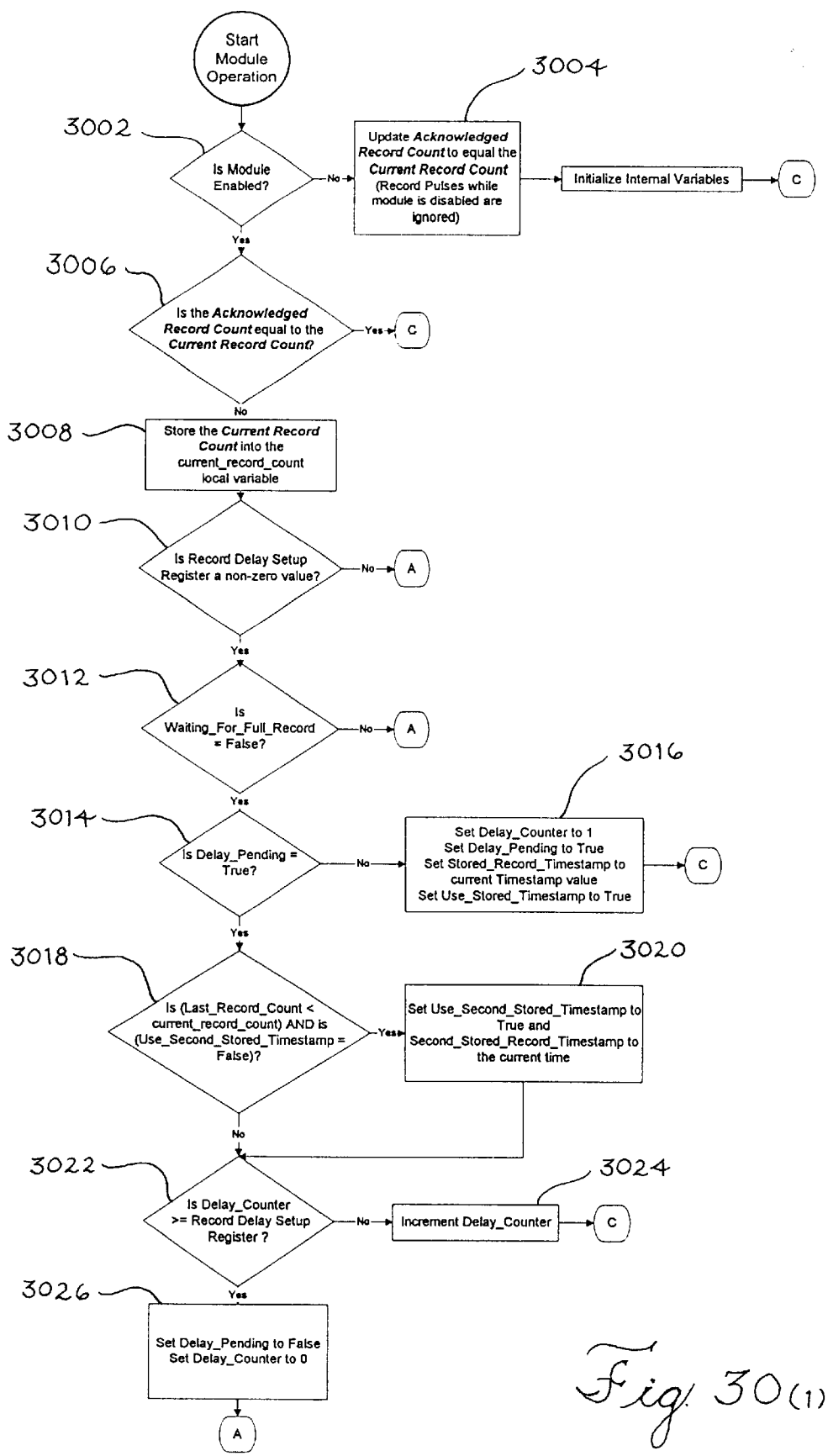
FIG. 30 shows a block diagram depicting a portion of the waveform recorder firmware of the waveform recorder module.
Figure 31:
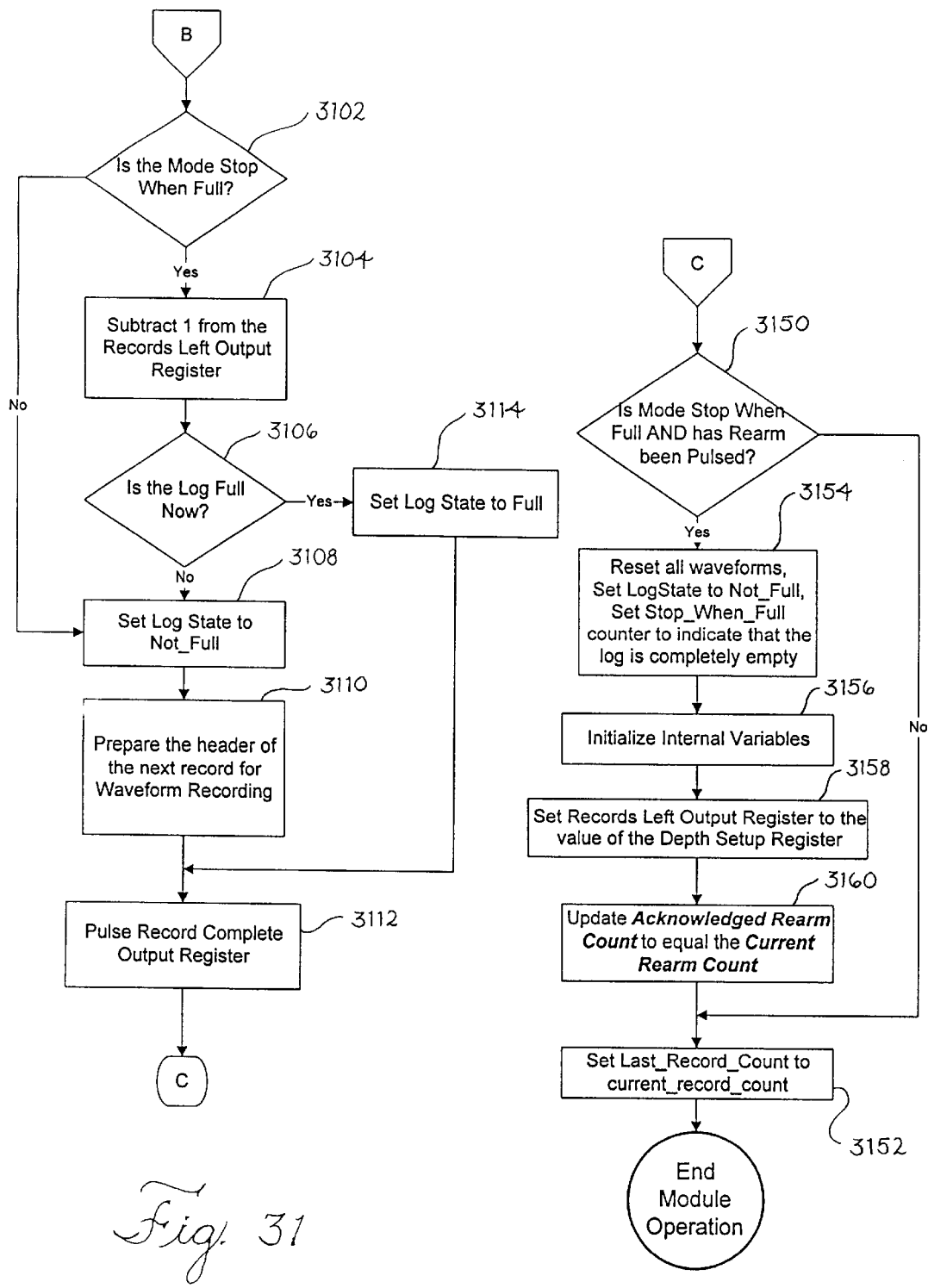
FIG. 31 shows a block diagram depicting the remaining portion of the waveform recorder firmware of the waveform recorder module.
Figure 32:
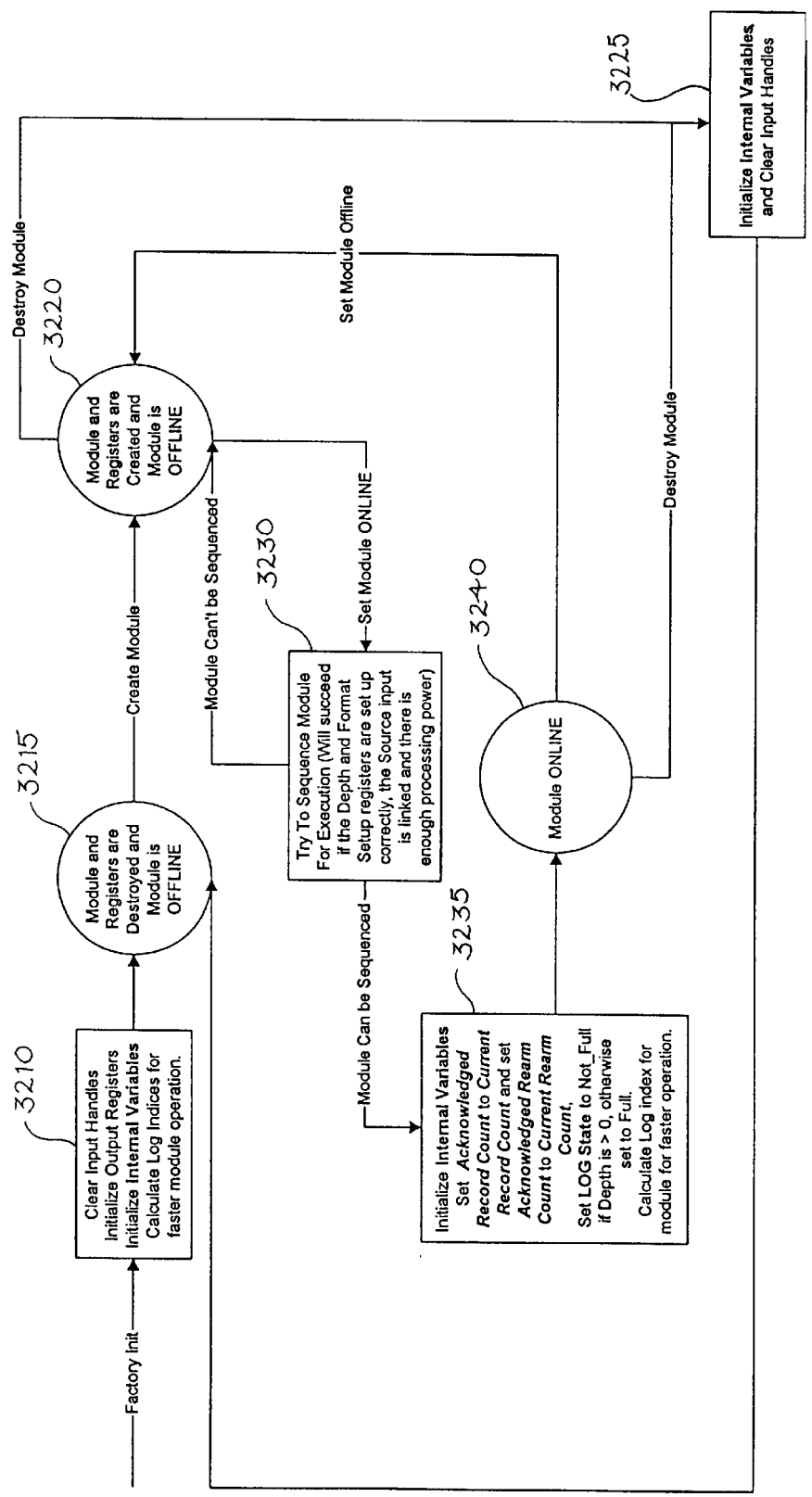
FIG. 32 shows a block diagram depicting the create and destroy behavior of the waveform recorder module.

FIGS. 30, 31 and 32 depict a flowchart of the Recorder module's operation. Generally, the blocks of these flow charts are executed on every half cycle with regard to the power frequency. The module first ascertains whether it needs to attempt to store a waveform during the current half-cycle of operation, prepare to store waveform in a subsequent half-cycle of operation or exit the current cycle of operation without storing a waveform.

If the module is to attempt to store a waveform in the current half-cycle, the module must determine if there is enough room in the waveform log to store the waveform and whether or not the current waveform is full. The current waveform is full if it contains enough cycles of data to make a full waveform. If both of these criteria are met, then the module will store the waveform with the appropriate trigger timestamp. The trigger timestamp indicates what triggered the recording of the waveform and the time of triggering. Next, output registers are updated to indicate how many waveforms can still be stored in the log (this is the Records_Left output register) and whether the log is full or not (in the Log_State output register).

The blocks of the module are executed no matter what operation is performed. The firmware checks to see if the Re-arm input has been pulsed. If this has been pulsed, then all of the waveforms will be cleared from the log, the output registers will be set such that they indicate that the log is empty and internal module variables will be initialized.

Referring now to FIGS. 30 and 31 in more detail, the blocks executed by the waveform recorder module are shown, for simplicity, as broken down into a main routine and three subroutines, A (FIG. 30), B and C (FIG. 31) which will be described below. Referring now to FIG. 30, the main routine begins by determining whether or not the recorder module is enabled (Block 3002). If it is not enabled, the module will ignore record pulses by updating the acknowledged_record_count to equal the current_record_count which ensures that all record pulses are processed (Block 3004). Record pulses are the input to the Waveform recorder ION module which triggers recording. This ensures that any pulses that occur on the Record input are ignored when the module is disabled. The routine will then jump to subroutine C (see FIG. 31 and below).

If the recorder module is enabled (Block 3002), it is then checked whether the acknowledged_record_count is equal to the current_record_count (Block 3006). If it is, then control transfers to subroutine C (See FIG. 31 and below). If it is not equal, the current_record_count is stored in a local variable (Block 3008) and the routine then checks if the record_delay_startup is a nonzero value (Block 3010). If it is not non-zero, then control passes to subroutine A (See below). If the value is non-zero, the value of waiting_for_full_record is checked (Block 3012). If this value is True, indicating that the record is not yet full, then control passes to subroutine A (See below). If the value is false, that is the record is full, then it is checked if there is a delay_pending (Block 3014). If there is no delay pending then the following variables are set (Block 3016) and control passes to subroutine C (See FIG. 31 and below):

Delay_Counter=1
   Delay_Pending=True
   Stored_Record_Timestamp=current timestamp value
   Use_Stored_Timestamp=True If there is a delay pending, then it is determined if the last_record_count is less then the current_record_count and the value of the use_second_stored_timestamp variable is set to false (Block 3018). If these conditions are met, then use_second_stored_timestamp is set to true and second_stored_record_timestamp is set to the current time (Block 3020). After this block, or if the conditions are not met, the delay_counter is checked to see if it is greater than or equal to the value of the record_delay setup register (Block 3022). If not, the delay_counter is incremented (Block 3024) and control passes to subroutine C (See FIG. 31 and below). If delay_counter is greater than or equal to the value of the record_delay_setup register, then delay$_{13}$ pending is set to false, the delay counter is set to zero (Block 3026) and control passes to subroutine A.

Subroutine A first checks to see if the Mode of operation is not stop_when_full or if the log is not full (Block 3050). If these conditions are met, the records_left_output register is decremented by one (Block 3052), the acknowledged_record_count is updated to equal the current_record_count (Block 3054) and control passes to subroutine C (See FIG. 31 and below). If the mode of operation is Stop_When_Full or the log is full, then it is checked whether or not the current wave form record is full yet (Block 3056). If not, waiting_for_full_record is set to true (Block 3058) and use_stored_timestamp is checked (Block 3060). If use_stored_timestamp equals true, then it is checked whether or not record delay setup value is non-zero (Block 3062). If it is not non-zero, then control passes to subroutine C (See FIG. 31 and below). If it is non-zero, then it is determined if the last_record_count is less then the current_record_count and the value of the use_second_stored_timestamp variable is set to false (Block 3064). If these conditions are met, then use_second_stored_timestamp is set to true and second_stored_record_timestamp is set to the current time (Block 3066). After this block, or if the conditions of Block 3064 are not met control passes to subroutine C (See FIG. 31 and below). If use_stored_timestamp is false (Block 3060), then stored_record_timestamp is set to current timestamp value and use_stored_timestamp is set to true (Block 3068). Control then passes to subroutine C (See FIG. 31 and below).

If the current waveform record is full, then use_stored_timestamp is checked (Block 3070). If this variable is False then the waveform timestamp is set to the current time stamp (Block 3072). If this variable is true, the waveform timestamp is set to the value of the stored_record_timestamp and the use_stored_timestamp variable is set to false (Block 3074). Next the scale and offset are obtained, waveform header information is written and the routine sets up the Next_Waveform_Record for recording (Block 3076).

Subroutine A then checks to see if the record_delay_setup register is a non-zero value (Block 3078). If it is not non-zero, or if the use_second_stored_timestamp is false (Block 3080), then the acknowledged_record_count is updated to equal the current_record_count to indicate that the record pulse has been dealt with (Block 3082). Finally the waiting_for_full_record is set to false (Block 3084) and control passes to subroutine B (See FIG. 31 and below). If the record_delay_setup register is non-zero (Block 3078) and the use_second_stored_timestamp is true (Block 3080), then the acknowledged_record_count is updated to the current_record_count value minus one (Block 3086). Waiting_for_full_record is set to true (Block 3088), use_stored_timestamp is set to true, use_second_stored_timestamp is set to false, the value of the second_stored_record_timestamp is stored into the stored_record_timestamp (Block 3090) and control is passed to subroutine B.

FIG. 31 shows a flow chart depicting the blocks of subroutine B of the waveform recording firmware. The mode of operation is first checked (Block 3102). If the mode of operation is "stop when full", then the records_left_ output register is decremented by one (Block 3104) and the log is checked to see if it is full (Block 3106). If the log is not full or if the mode of operation is not "stop when full", then the log state is set to not_full (Block 3108), the next header of the next record is prepared for waveform recording (Block 3110), the record complete output register is pulsed (Block 3112) and control passes to subroutine C (See below). If the log is full (Block 3106), the log state is set to Full (Block 3114), the record_complete_output register is pulsed (Block 3112) and control passes to subroutine C.

Referring again to FIG. 31, subroutine C first checks if the mode of operation is stop_when_full and if Rearm has been pulsed (Block 3150). If this is not true, the routine sets the last_record_count to equal the current_record_count (Block 3152) and exits for the current interval. If the operation mode is "stop when full" and Rearm has been pulsed, then all waveforms are reset, the LogState is set to Not_full and the stop_when_full counter is set to indicate that the log is completely empty (Block 3154). The routine then initializes internal variables (Block 3156), sets the records_left_output register to the value of the depth_ setup register (Block 3158) and updates the acknowledged_ rearm count to equal the current_rearm_count (Block 3160). Finally, the routine sets the last_record_count to equal the current_record_count (Block 3152) and exits for the current interval. In the preferred embodiment, this interval is preferably ½ cycle. Alternatively, longer or shorter intervals can be used.

FIG. 32 shows a state diagram of the create and destroy behavior of the waveform recorder module with regards to waveforms. From the "factory initialization", the next state is to Clear Input Handles, Initialize Output Registers, Initialize Internal Variables and Calculate Log Indices for faster module operation (State 3210). The module transitions to the next state where the Module and Registers are Destroyed and the Module is set to offline (State 3215). In response to "create module", the Module and Registers are created and the Module is Offline (State 3220). In response to "destroy module", Internal Variables are initialized and Input Handles are Cleared (State 3225) and the module transitions to State 3215. From State 3220, in response to "set module online", the Recorder Module attempts to Sequence the Module for Execution (State 3230). This will succeed if the Depth and Format Setup Registers are set up correctly, the Source input is linked and there is enough processing power. From this state (State 3230), if the "Module Cannot Be Sequenced", the Recorder Module transitions back to (State 3220). If the "Module Can Be Sequenced", then the Recorder Module transitions to State 3235. In state 3235, Internal Variables are initialized, Acknowledged Record Count is set to Current Record Count, Acknowledged Rearm Count is set to Current Rearm Count, Log State is set to Not_Full if Depth is greater than zero, otherwise it is set to Full and the log index is calculated for faster module operation (State 3235). The Recorder Module then transitions to state 3240 where the module is set ONLINE (State 3240). From State 3240, in response to "Set Module Offline", the Recorder Module transitions to State 3220. From State 3240, in response to "Destroy Module", the Recorder Module transitions to State 3225.

As was discussed above, the stored data can be analyzed in real time as well as post-processed at a later time. Further, the data can be transmitted to a location remote from the meter to undergo initial or further analysis. The meter provides communications means to transmit this data to the remote location. Exemplary communications means include modems and communications network connections. This communications may be via digital serial, digital parallel, analog, digital pulse, Ethernet, optical or other communications methodology as is known in the art. It will be appreciated that any form of communication of digital data is contemplated for use with the presently disclosed embodiments.

b. Direct Memory Access

Figure 33:
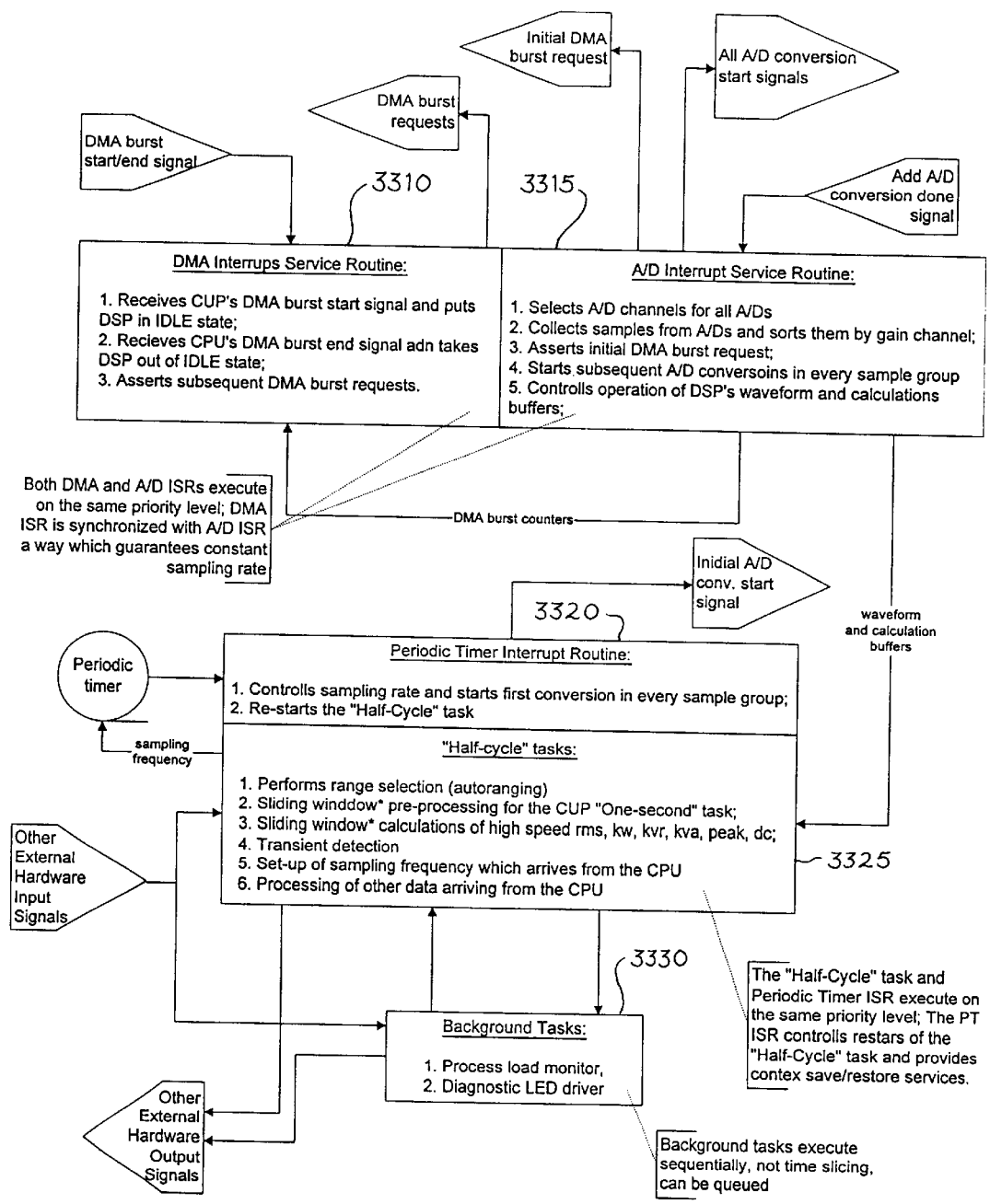
FIG. 33 shows a block diagram depicting the Direct Memory Access ("DMA") firmware organization for the preferred embodiment revenue meter.

Referring now to FIG. 33, there is shown a block diagram depicting the direct memory access ("DMA") firmware organization. FIG. 34 is a timeline representation of DMA activity showing when the data transfers take place with respect to the sampling. The exemplary revenue meter's sampling algorithm produces approximately 600 kB of raw samples every second. This large amount of data needs to be pre-processed on the DSP and transferred to the CPU along with the results of the pre-processing. The data transfers must not compromise deadlines of any real time tasks running on the main CPU and must not disrupt continuous fixed rate sampling on the DSP. The samples produced by the sampling algorithm must be synchronized in time with the voltage and current RMS, power and other calculations to support operation of setpoint-triggered power line waveform recordings. The majority of the data is transferred from the DSP to the CPU, but there is also a need for a much smaller amount of data to be delivered from the CPU to the DSP.

The DMA implementation provides synchronized to sampling DMA data transfers which solves the problem of efficient data transfers between the DSP and CPU with minimal usage of clock cycles on both processors.

The DMA transfer requires minimal external hardware to operate. There is no need for use of costly dual port memories, which results in significant cost savings. The synchronized to sampling DMA method also provides a higher overall data throughput with less CPU loading.

The synchronized to sampling DMA data transfer uses the passive DMA capabilities of the DSP processor and DMA controller functionality provided by the main CPU. The DSP executes its sampling algorithm and collects samples sorted by channel in buffers located in designated SRAM memory area. The buffers are big enough to hold 6 half cycles of data for each input gain channel. In addition to waveform buffers, there are two identical calculation buffers allocated for the pre-processing data transfers and data transfers from the CPU to the DSP (opposite direction to the main data flow). Identical buffer arrangement exists in the CPU DRAM memory.

The sampling occurs on 24 gain channels at a rate of 128 samples per cycle per channel which results in 3072 bytes of data every half cycle. Additional calculation buffers reserved for the pre-processing results hold 1024 bytes of data. A 64 byte data flow channel from the CPU to the DSP is reserved to allow direct memory access ("DMA") from the CPU to the DSP. The total amount of data to be transferred in one half cycle is set to 4096 bytes.

During the DMA transfer the DSP processor is in IDLE state (no code execution), and its address, data and control bus are in TRI-STATE mode. To maintain the constant sampling rate, the DMA transfer must be fast enough and small enough to fit in between consecutive sample groups (every sample group consists of 8×3=24 samples arriving simultaneously from three A/D converters). To achieve this, the DMA controller on the CPU executes four bursts of DMA transfers per every sample group which results in 64×4=256 burst DMA transfers every half cycle. The total amount of data transferred per half cycle equals:

256 bursts/half cycle×16 Bytes/burst=4096 Bytes/half cycle.

The DMA transfer requests are issued by the DSP processor and are synchronized with the sampling algorithm in a way that maintains constant sampling rate. Depending on the line frequency from which the sampling rate is derived, the above scheme results in a data transfer rate of 174,456 bytes/second at 18 Hz up to 589,824 bytes/second at 72 Hz.

Due to the pre-processing that occurs on the DSP, the calculation data are delayed by 2 half cycles with respect to the corresponding samples. The 6 half cycle sample buffers are necessary to provide synchronization and correct operation of the waveform recorders.

Referring to FIG. 33, the DSP Firmware consists of several independent routines. The DMA_Interrupt_Service routine 3310 ("DMA ISR") receives the DMA burst start or end signal from the CPU and either puts the DSP into, or takes it out of, idle state. This routine also asserts subsequent DMA burst requests. The A/D_Interrupt_Service routine 3315 ("AID ISR") selects A/D channels for all of the A/D converters (A/D's), collects and sorts samples from all of the A/D's by gain channel and asserts the initial DMA burst request. This routine also starts subsequent A/D conversions in every sample group and controls operation of the DSP's waveform and calculation buffers. Both the DMA 3310 and A/D 3315 ISR's execute on the same priority level. They are synchronized in a way which guarantees a constant sampling rate.

The DSP firmware further includes a periodic timer interrupt routine 3320 and a half cycle task routine 3325. The periodic timer interrupt routine 3320 controls the sampling rate and starts the first conversion in every sample group. It also restarts the half cycle task routine. The half cycle task routine 3325 performs range selection which implements the autoranging functionality. The routine further controls the sliding window pre-processing for the CPU "one second task" routine and performs the sliding window calculations of high speed RMS, KW, KVR, KVA, peak and dc. RMS is root mean square, KW is kilowatts or active power, KVR is Kilovars or reactive power, KVA is kilovolt amperes or apparent power, peak is the instantaneous peak in every cycle and dc is direct current. Finally, the half cycle task routine sets up the sampling frequency which arrives from the CPU and processes other data arriving from the CPU such as the transient detection threshold or execution error information. The DSP half cycle task 3325 works with a corresponding half cycle task routine on the CPU. The periodic timer interrupt routine 3320 and half cycle task routine 3325 execute on the same priority level. The periodic timer interrupt routine 3320 controls restarts of the half cycle task routine 3325 and provides context save/restore services.

The DSP firmware further includes background tasks 3330 which monitor the processor load and drive diagnostic LED's.

Figure 35:
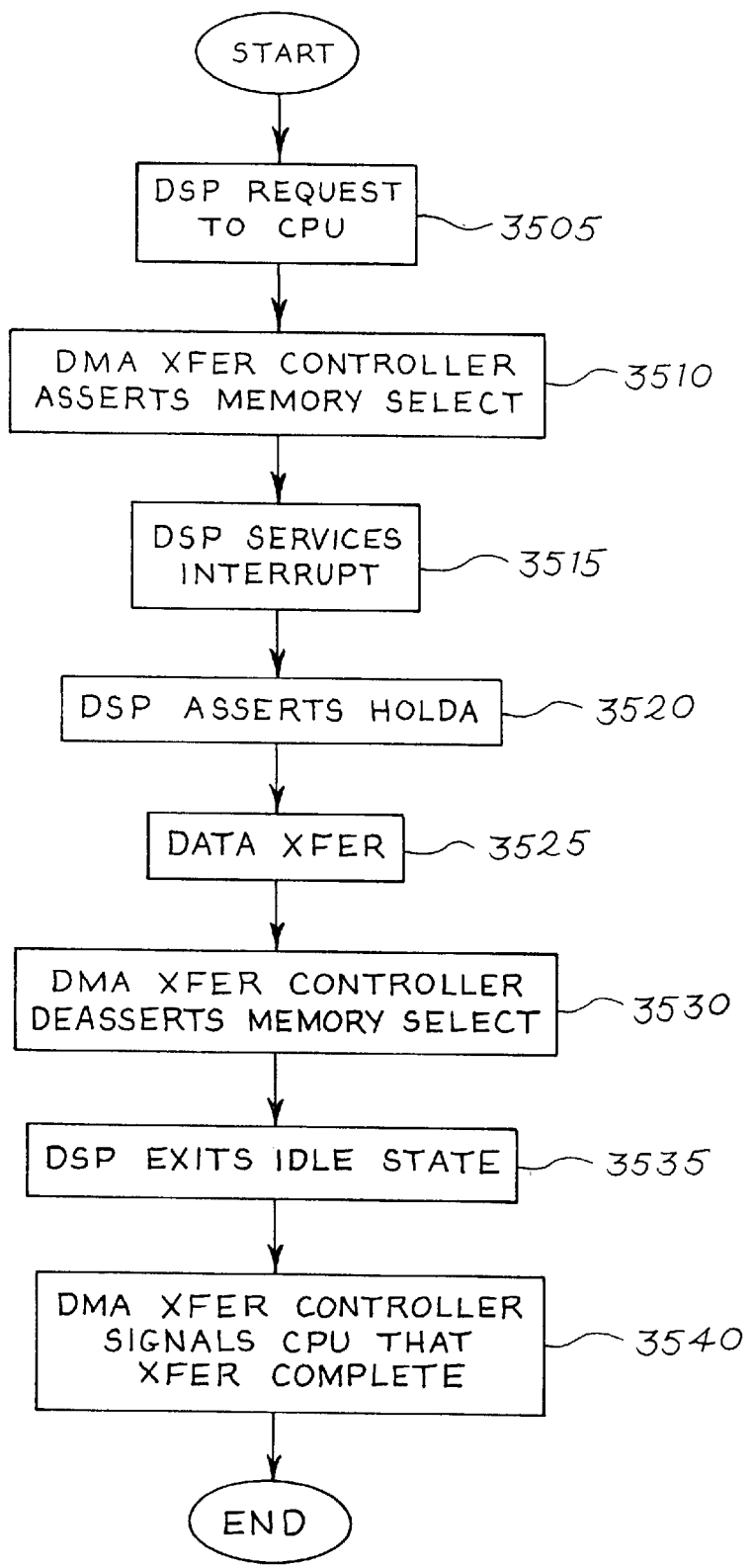
FIG. 35 shows a flow chart depicting a typical DMA transaction.

A flow chart depicting an exemplary method for executing direct memory ("DMA") transfers is shown in FIG. 35. A typical DMA transfer occurs as follows. The digital signal processor (DSP) asserts a data transfer request to the DMA transfer controller built into the Power PC processor (Block 3505). To initiate the data transfer, the DMA transfer controller then asserts the memory select line to select the DSP memory space (Block 3510). This causes assertion of the HOLD interrupt line to the DSP and assertion of the chip select line to the DSP memory. The DSP services the interrupt caused by the assertion of the HOLD line and enters an IDLE state which releases control of its data and address busses (Block 3515). Once in IDLE state, the DSP asserts the HOLDA (Hold Acknowledge) line (Block 3520). The combination of asserting the HOLD and HOLDA signals causes the data buffers to open and couple the DSP bus to the Power PC bus. The Power PC then waits for a prescribed delay after which it is guaranteed that the coupling is complete and the DSP is ready for the data transfer. The minimum wait time is dependent upon the CPU bus timing, the DSP HOLD/HOLDA signal timing and the bus coupling circuit timing. Alternatively, the WAIT signal line can be used to signal the Power PC that the DSP is ready. The DMA transfer controller in the Power PC then executes at least one burst data transfer (Block 3525). Upon completion of the burst data transfer, the DMA transfer controller de-asserts the memory select line which de-selects the DSP memory space(Block 3530). This causes the removal of the HOLD signal from the DSP input which further causes the buffers to close and de-couple the data busses. The removal of the HOLD signal causes an interrupt to the DSP. The DSP responds to the interrupt/removal of the HOLD signal by exiting from IDLE state (Block 3535). By the time the DSP exits from IDLE state, it is guaranteed that the data busses will be isolated. Again, this delay is dependent upon the CPU bus timing, the DSP HOLD/HOLDA signal timing and the bus coupling circuit timing. Alternatively, a signaling system can be used to indicate to the DSP that the data busses are isolated. Once out of IDLE state, the DSP acquires control of its data and address busses. Finally, the DMA transfer controller signals the Power PC that one or more data transfers was completed (Block 3540). It will be appreciated by those skilled in the art that either processor can initiate the data transfer between its memory and the memory of the other processor.

Exemplary computer object code for implementing the above algorithms is included in microfiche appendix A. This code contains all of the software modules disclosed in this specification and is intended to function on hardware as detailed in the schematics of microfiche appendix B. The following description will enable one of ordinary skill in the art to execute this code on the detailed hardware. In the hardware as detailed in appendix B, the object code is implemented in firmware stored in two 4 MB flash EEPROM flash memory chips. Preferably, these flash EEPROM's are DT28F320S5 EEPROM's manufactured by Intel, Inc. located in Sunnyvale, Calif. It will be appreciated that other flash memory chips can also be used as well as other non-volatile as well as volatile memory devices. The computer object code is compiled from source code written in the C language. It is presented in an S19 Srecord format which is defined in M68332BUG Debug Monitor User's Manual (1990) published by Motorola, Inc. The Srecords of the object code are first programmed into the two flash memory chips using a standard EEPROM programmer. This programming method is well known in the art. In addition, it will be appreciated that there are many techniques for programming object code into a memory device which can be used with the presently disclosed embodiments. One memory device is programmed with the object code starting at address 0x000000 to 0x3FFFFF (hexadecimal), the other memory chip is programmed with the object code starting at 0x400000 to 0x7FFFFF. While the disclosed embodiments use two memory chips, a single memory device with sufficient capacity can also work. Utilizing the hardware as detailed in appendix B, with the code programmed as detailed above, the first memory chip is connected to Chip Select ("CS") 0 of the MPC821BGA (schematic notation: U1) processor and the second memory device is connected to CS 1. Jumpers J1 and J2 are added to connect CS 0 to CS_FLSH1 and connect CS 1 to CS_DSP. When power is applied to the given hardware, the processor will commence executing the object code at hexadecimal address 0x100.

Alternative methods of power quality monitoring, detection, quantification, communication and reporting are also contemplated. The disclosed embodiments contemplate use of alternative meter inputs to enhance power quality assessment. For example, ANSI Standards define a form 76S and form 39S socket meters which include a fourth current input pair (designated I41 and I42) on the base of the meter. The purpose of the fourth current input pair is to allow the meter to directly measure the magnitude and/or phase of either the neutral or ground current.

Meters without a fourth current input pair can only derive the value of the neutral current mathematically. This mathematical derivation of neutral current may not be as accurate as a direct measurement if the electrical network star point is resistively coupled to ground. Meters equipped with a fourth current input pair are able to directly measure, with high precision, the magnitude and/or phase of the neutral or ground current. The ability to measure neutral or ground current is useful to modem commercial and industrial consumers using non-linear loads that cause high harmonic currents on the neutral conductor. Meters, so equipped with the fourth current input pair, can directly measure the harmonic content of the neutral or ground current, including the magnitude and phase angle of each harmonic component. This information is useful to the energy supplier and the consumer when attempting to identify the nature of the source causing the neutral or ground current.

In addition, with the direct measurement of neutral or ground current, the meter can provide detailed historical records of the current magnitude and phase over time. This information is useful when diagnosing subtle long-term trends in network or electrical system power quality. Further, a suitably equipped meter can provide real-time alarm and control signals if the magnitude or phase angle of the neutral or ground current differs from (exceeds or drops below) user-specified thresholds. The alarm and/or control signal can be used to prevent damage to plant and equipment when safety limits are exceeded.

Further, alternate applications of a fourth current input pair include: the ability to measure an additional single phase load across the voltage of either a Delta or Wye network; enabling one metering device to measure two 2-element Delta loads, or enable one device to measure several single phase loads fed by the same voltage.

In addition, although the ANSI specifications only specify a fourth current input pair, fifth, sixth or more current input pairs are contemplated. Further, current input pairs can be implemented utilizing alternative inputs to the meter such as via "pig-tail" auxiliary cable inputs.

Further applications of a fourth (or more) current input pair include the ability to communicate in real time, the magnitude and phase angle of the $4^{th}$ or additional current input. This communications may be via digital serial, digital parallel, analog, digital pulse, Ethernet, optical or other communications methodology as is known in the art.

These applications are useful because many electrical system problems and customer equipment problems are caused by poor power quality. Traditional electrical systems are designed to operate with balanced and linear loads. Under "normal" operating conditions, the neutral conductor is not required to carry currents as large as the phase conductors. Therefore, the current-capacity of the neutral conductor can be reduced to save costs.

When non-linear loads are connected to the electrical network, harmonic currents are induced in the phase and neutral conductors. This can cause the magnitude of the neutral current to be much greater than originally estimated for the design of the electrical system. In some cases, non-linear loads can cause the neutral current to exceed the current-carrying capacity of the neutral conductor. If this occurs, the safety of the plant and the equipment can be placed at risk because the neutral conductor could overload and cause a fire or other damage.

Prior to the point at which the magnitude of the neutral current reaches a dangerous limit, a meter that is capable of measuring the magnitude of the neutral current and continuously testing this magnitude against user-specified limits, can be used to generate an alarm or control signal. This alarm or control signal can be used to protect the electrical network from damage. In addition, the ability to measure and record the magnitude of the neutral current over time will allow system operators and users to monitor long term trends. This information allows designers to take pro-active steps to correct system abnormalities or to adjust the system design as required.

It is to be understood that a wide range of changes and modifications to the embodiments described above will be apparent to those skilled in the art, and are contemplated. It is therefore intended that the foregoing detailed description be regarded as illustrative rather than limiting, and that it be understood that it is the following claims, including all equivalents, that are intended to define the spirit and scope of this invention.

What is claimed is:

1. A revenue meter for measuring the delivery of electrical energy from an energy supplier to a consumer through an electric circuit, said meter comprising:

bayonet terminals disposed on said meter mateable with matching jaws of a detachable meter mounting device;

a seal connected between said meter and said detachable meter mounting device, said seal operative to prevent removal of said meter and indicate tampering with said meter;

one or more sensors coupled with said electric circuit and operative to sense one or more power parameters in said electric circuit and generate one or more analog signals indicative of said power parameters;

at least one analog to digital converter coupled with said sensors and operative to convert said analog signals to one or more digital samples; and a detector coupled with said analog to digital converter and operative to compare each of said digital samples to a threshold and indicate a power quality event when said digital sample deviates from said threshold.

2. The revenue meter of claim 1 wherein said analog to digital converter converts said analog signals to said one or more digital samples at a rate of at least 32 samples per cycle.

3. The revenue meter of claim 1 wherein said detector comprises a digital signal processor.

4. The revenue meter of claim 1 wherein said detector is further operative to calculate and record the amount by which each of said digital samples deviates from said threshold.

5. The revenue meter of claim 4 wherein said detector is further operative to calculate and record the maximum amount by which any one of said digital samples deviates from said threshold for subsequent of said digital samples which deviate from said threshold.

6. The revenue meter of claim 1 wherein said detector is further operative to calculate and record the duration for which subsequent of said digital samples deviate from said threshold.

7. The revenue meter of claim 1 wherein said threshold is computed dynamically.

8. The revenue meter of claim 7 wherein said computation is based on a nominal voltage of said electric circuit and a scale of said meter.

9. The revenue meter of claim 1 wherein said detector is further operative to trigger a waveform recorder when any of said digital samples deviate from said threshold.

10. The revenue meter of claim 1 wherein said detector is further operative to indicate the occurrence of a single power quality event for subsequent of said digital samples which deviate from said threshold.

11. The revenue meter of claim 1 wherein said power parameters include parameters selected from the group consisting of voltage and current.

12. The revenue meter of claim 1 wherein said power quality event includes events selected from group consisting of transient, sag, swell, wave shape deviation, harmonic deviation and component symmetry deviation.

13. The revenue meter of claim 12 wherein said detector is further operative to suppress indication of a transient event when a sag/swell event is concurrently detected.

14. The revenue meter of claim 1 further comprising a memory coupled with said analog to digital converter and operative to receive and store said digital samples and wherein said detector is coupled with said memory and operative to compare at least one of said digital samples to at least one other of said stored digital samples.

15. A revenue meter for measuring the delivery of electrical energy from an energy supplier to a consumer through an electric circuit, said meter comprising:
bayonet terminals disposed on said meter mateable with matching jaws of a detachable meter mounting device;
a seal connected between said meter and said detachable meter mounting device, said seal operative to prevent removal of said meter and indicate tampering with said meter;
a sensor coupled with said electric circuit and operative to sense a voltage in said electric circuit and generate an analog signal indicative of said voltage;
an analog to digital converter coupled with said sensor and operative to convert said analog signal to one or more digital samples; and
a detector coupled with said analog to digital converter and operative to compare each of said digital samples to a threshold and indicate a transient event when said digital sample exceeds said threshold.

16. The revenue meter of claim 15 wherein said analog to digital converter converts said analog signals to said one or more digital samples at a rate of at least 32 samples per cycle.

17. The revenue meter of claim 15 wherein said detector comprises a digital signal processor.

18. The revenue meter of claim 15 wherein said detector is further operative to calculate and record the amount by which said digital samples exceed said threshold.

19. The revenue meter of claim 18 wherein said detector is further operative to calculate and record the maximum amount by which any one of said digital samples exceeds said threshold for subsequent of said digital samples which exceed said threshold.

20. The revenue meter of claim 15 wherein said detector is further operative to calculate and record the duration for which subsequent of said digital samples exceed said threshold.

21. The revenue meter of claim 15 wherein said threshold is computed dynamically.

22. The revenue meter of claim 21 wherein said computation is based on a nominal voltage of said electric circuit and a scale of said meter.

23. The revenue meter of claim 15 wherein said detector is further operative to trigger a waveform recorder when said digital samples exceed said threshold.

24. The revenue meter of claim 15 wherein said detector is further operative to indicate the occurrence of a single transient event for subsequent of said digital samples which exceed said threshold.

25. The revenue meter of claim 15 wherein said detector is further operative to suppress said indication when a sag/swell event is concurrently detected.

26. A revenue meter for measuring the delivery of electrical energy from an energy supplier to a consumer through an electric circuit, said meter comprising:
bayonet terminals disposed on said meter mateable with matching jaws of a detachable meter mounting device;
a seal connected between said meter and said detachable meter mounting device, said seal operative to prevent removal of said meter and indicate tampering with said meter;
a sensor coupled with said electric circuit and operative to sense the voltage in said electric circuit and generate an analog signal indicative of said voltage, said voltage having a wave shape;
an analog to digital converter coupled with said sensor and operative to convert said analog signal to one or more digital samples;
a memory coupled with said analog to digital converter and operative to receive and store at least 2 cycles worth of said one or more digital samples; and
a detector coupled with said memory and operative to compare a first of said digital samples to a second of said digital samples and calculate a difference, said second digital sample being non-consecutive with said first digital sample, said detector further operative to compare said difference to a threshold and indicate a deviation in said wave shape when said difference exceeds said threshold.

27. The revenue meter of claim 26 wherein said analog to digital converter converts said analog signals to said one or more digital samples at a rate of at least 32 samples per cycle.

28. The revenue meter of claim 26 wherein said detector is further operative to calculate and record the amount by which said difference exceeds said threshold.

29. The revenue meter of claim 28 wherein said detector is further operative to calculate and record the maximum amount by which any one of said differences exceeds said threshold for successive of said differences which exceed said threshold.

30. The revenue meter of claim 26 wherein said detector is further operative to calculate and record the duration for which successive of said differences exceed said threshold.

31. The revenue meter of claim 26 wherein said detector is further operative to trigger a waveform recorder when said difference exceeds said threshold.

32. A switchboard revenue meter for measuring the delivery of electrical energy from an energy supplier to a consumer through an electric circuit, said meter comprising:
a draw-out chassis coupled with said meter and operative to fit within a switchboard enclosure;
terminals disposed on said chassis for engaging matching terminals within said enclosure;

a display;

a meter cover operative to enclose said meter and said display within said enclosure;

a seal connected with said meter cover and operative to prevent removal of said meter cover and indicate tampering with said meter;

one or more sensors coupled with said electric circuit and operative to sense one or more power parameters in said electric circuit and generate one or more analog signals indicative of said power parameters;

at least one analog to digital converter coupled with said sensors and operative to convert said analog signals to one or more digital samples; and a detector coupled with said analog to digital converter and operative to compare each of said digital samples to a threshold and indicate a power quality event when said digital sample deviates from said threshold.

33. The revenue meter of claim 32 wherein said analog to digital converter converts said analog signals to said one or more digital samples at a rate of at least 32 samples per cycle.

34. The revenue meter of claim 32 wherein said detector comprises a digital signal processor.

35. The revenue meter of claim 32 wherein said detector is further operative to calculate and record the amount by which each of said digital samples deviates from said threshold.

36. The revenue meter of claim 35 wherein said detector is further operative to calculate and record the maximum amount by which any one of said digital samples deviates from said threshold for successive of said digital samples which deviate from said threshold.

37. The revenue meter of claim 32 wherein said detector is further operative to calculate and record the duration for which subsequent of said digital samples deviate from said threshold.

38. The revenue meter of claim 32 wherein said threshold is computed dynamically.

39. The revenue meter of claim 38 wherein said computation is based on a nominal voltage of said electric circuit and a scale of said meter.

40. The revenue meter of claim 32 wherein said detector is further operative to trigger a waveform recorder when any of said digital samples deviate from said threshold.

41. The revenue meter of claim 33 wherein said detector is further operative to indicate the occurrence of a single power quality event for subsequent of said digital samples which deviate from said threshold.

42. The revenue meter of claim 32 wherein said power parameters include parameters selected from the group consisting of voltage and current.

43. The revenue meter of claim 32 wherein said power quality event includes events selected from group consisting of transient, sag, swell, wave shape deviation, harmonic deviation and component symmetry deviation.

44. The revenue meter of claim 43 wherein said detector is further operative to suppress indication of a transient event when a sag/swell event is concurrently detected.

45. The revenue meter of claim 32 further comprising a memory coupled with said analog to digital converter and operative to receive and store said digital samples and wherein said detector is coupled with said memory and operative to compare at least one of said digital samples to at least one other of said stored digital samples.

46. A switchboard revenue meter for measuring the delivery of electrical energy from an energy supplier to a consumer through an electric circuit, said meter comprising:

a draw-out chassis coupled with said meter and operative to fit within a switchboard enclosure;

terminals disposed on said chassis for engaging matching terminals within said enclosure;

a display;

a meter cover operative to enclose said meter and said display within said enclosure;

a seal connected with said meter cover and operative to prevent removal of said meter cover and indicate tampering with said meter;

a sensor coupled with said electric circuit and operative to sense a voltage in said electric circuit and generate an analog signal indicative of said voltage;

an analog to digital converter coupled with said sensor and operative to convert said analog signal to one or more digital samples; and a detector coupled with said analog to digital converter and operative to compare each of said digital samples to a threshold and indicate a transient event when said digital sample exceeds said threshold.

47. The revenue meter of claim 46 wherein said analog to digital converter converts said analog signals to said one or more digital samples at a rate of at least 32 samples per cycle.

48. The revenue meter of claim 46 wherein said detector comprises a digital signal processor.

49. The revenue meter of claim 46 wherein said detector is further operative to calculate and record the amount by which said digital samples exceed said threshold.

50. The revenue meter of claim 49 wherein said detector is further operative to calculate and record the maximum amount by which any one of said digital samples exceeds said threshold for subsequent of said digital samples which exceed said threshold.

51. The revenue meter of claim 46 wherein said detector is further operative to calculate and record the duration for which subsequent of said digital samples exceed said threshold.

52. The revenue meter of claim 46 wherein said threshold is computed dynamically.

53. The revenue meter of claim 52 wherein said computation is based on a nominal voltage of said electric circuit and a scale of said meter.

54. The revenue meter of claim 46 wherein said detector is further operative to trigger a waveform recorder when said digital samples exceed said threshold.

55. The revenue meter of claim 46 said detector is further operative to indicate the occurrence of a single transient event for subsequent of said digital samples which exceed said threshold.

56. The revenue meter of claim 46 wherein said detector is further operative to suppress said indication when a sag/swell event is concurrently detected.

57. A switchboard revenue meter for measuring the delivery of electrical energy from an energy supplier to a consumer through an electric circuit, said meter comprising:

a draw-out chassis coupled with said meter and operative to fit within a switchboard enclosure;

terminals disposed on said chassis for engaging matching terminals within said enclosure;

a display;

a meter cover operative to enclose said meter and said display within said enclosure;

a seal connected with said meter cover and operative to prevent removal of said meter cover and indicate tampering with said meter;

a sensor coupled with said electric circuit and operative to sense the voltage in said electric circuit and generate an analog signal indicative of said voltage, said voltage having a wave shape;

an analog to digital converter coupled with said sensor and operative to convert said analog signal to one or more digital samples;

a memory coupled with said analog to digital converter and operative to receive and store at least 2 cycles worth of said one or more digital samples; and a detector coupled with said memory and operative to compare a first of said digital samples to a second of said digital samples and calculate a difference, said second digital sample being non-consecutive with said first digital sample, said detector further operative to compare said difference to a threshold and indicate a deviation in said wave shape when said difference exceeds said threshold.

58. The revenue meter of claim 57 wherein said analog to digital converter converts said analog signals to said one or more digital samples at a rate of at least 32 samples per cycle.

59. The revenue meter of claim 57 wherein said detector is further operative to calculate and record the amount by which said difference exceeds said threshold.

60. The revenue meter of claim 50 wherein said detector is further operative to calculate and record the maximum amount by which any one of said differences exceeds said threshold for successive of said differences which exceed said threshold.

61. The revenue meter of claim 57 wherein said detector is further operative to calculate and record the duration for which successive of said differences exceed said threshold.

62. The revenue meter of claim 57 wherein said detector is further operative to trigger a waveform recorder when said difference exceeds said threshold.

* * * * *

UNITED STATES PATENT AND TRADEMARK OFFICE
CERTIFICATE OF CORRECTION

PATENT NO.   : 6,615,147 B1
DATED        : September 2, 2003
INVENTOR(S)  : Rene T. Jonker et al.

It is certified that error appears in the above-identified patent and that said Letters Patent is hereby corrected as shown below:

Title page,
Item [56], References Cited, OTHER PUBLICATIONS, "International Standard," reference, delete "Flickemeter" and substitute -- Flickermeter -- in its place.

Column 42,
Line 50, before "said detector" insert -- wherein --.

Signed and Sealed this

Twenty-seventh Day of July, 2004

JON W. DUDAS
*Acting Director of the United States Patent and Trademark Office*